United States Patent
Hirota

(10) Patent No.: US 7,817,200 B2
(45) Date of Patent: Oct. 19, 2010

(54) SOLID-STATE IMAGE-CAPTURING DEVICE, DRIVING METHOD THEREOF, CAMERA, ELECTRIC CHARGE TRANSFER DEVICE, DRIVING METHOD AND DRIVING DEVICE FOR DRIVING LOAD, AND ELECTRONIC EQUIPMENT

(75) Inventor: Isao Hirota, Kanagawa (JP)

(73) Assignee: Sony Corporation, Tokyo (JP)

( * ) Notice: Subject to any disclaimer, the term of this patent is extended or adjusted under 35 U.S.C. 154(b) by 653 days.

(21) Appl. No.: 11/704,982

(22) Filed: Feb. 12, 2007

(65) Prior Publication Data

US 2007/0206423 A1 Sep. 6, 2007

(30) Foreign Application Priority Data

| Feb. 15, 2006 | (JP) | ............................. 2006-038448 |
| Jul. 14, 2006 | (JP) | ............................. 2006-194913 |
| Jul. 28, 2006 | (JP) | ............................. 2006-206141 |

(51) Int. Cl.
  *H04N 9/64* (2006.01)
  *H04N 3/14* (2006.01)
  *H04N 5/335* (2006.01)

(52) U.S. Cl. ....................... 348/313; 348/300; 348/248

(58) Field of Classification Search .............. 348/216.1, 348/248, 296–300, 313, 314; 250/208.1
  See application file for complete search history.

(56) References Cited

U.S. PATENT DOCUMENTS

| 6,559,889 B2 * | 5/2003 | Tanaka et al. ................ 348/299 |
| 7,542,083 B2 * | 6/2009 | Kubo ........................ 348/248 |
| 2004/0239790 A1 * | 12/2004 | Maeda et al. ............... 348/311 |

FOREIGN PATENT DOCUMENTS

| JP | 01-248664 | 10/1989 |
| JP | 02-159175 | 6/1990 |
| JP | 8-32065 | 2/1996 |
| JP | 09121310 A * | 5/1997 |
| JP | 2000-138943 | 5/2000 |
| JP | 2000-261726 | 9/2000 |
| JP | 3440722 | 6/2003 |
| JP | 2004-328203 | 11/2004 |
| JP | 2004-357168 | 12/2004 |

(Continued)

OTHER PUBLICATIONS

Japanese Office Action issued Nov. 4, 2009 for corresponding Japanese Application No. 2006-038448.

(Continued)

*Primary Examiner*—Sinh Tran
*Assistant Examiner*—Daniel M Pasiewicz
(74) *Attorney, Agent, or Firm*—Rader, Fishman & Grauer PLLC

(57) ABSTRACT

A solid-state image-capturing device which has built in an image-capturing area including a light receiving element provided on a semiconductor substrate, a substrate bias circuit, and a clamp circuit for receiving output of the substrate bias circuit and applying the output of the substrate bias circuit to the semiconductor substrate in accordance with a substrate pulse, comprises a substrate bias control circuit for controlling so as to reduce an electric current of the clamp circuit during a predetermined period.

8 Claims, 46 Drawing Sheets

FOREIGN PATENT DOCUMENTS

| | | |
|---|---|---|
| JP | 2005-260407 | 9/2005 |
| JP | 2005-269060 | 9/2005 |
| JP | 2005-318192 | 11/2005 |
| WO | WO-03/090374 A1 | 10/2003 |

OTHER PUBLICATIONS

Japanese Office Action issued Sep. 24, 2008 for corresponding Japanese Application No. 2006-206141.

Japanese Office Action dated Apr. 15, 2008 for corresponding Japanese Application No. 2006-194913.

* cited by examiner

BEFORE REGULATION OF Vsub

AFTER REGULATION OF Vsub

DRIVING USING
H2 PHASE

DRIVING USING
H3 PHASE

BETWEEN φV1 AND φV3, AND BETWEEN φV2
AND φV4 ARE THE SAME CONFIGURATIONS

CIRCUIT CONFIGURATION

DRIVING TIMING (INVERTED PHASE DRIVING)

DRIVING TIMING (EXISTING EXAMPLE)

FIG. 28
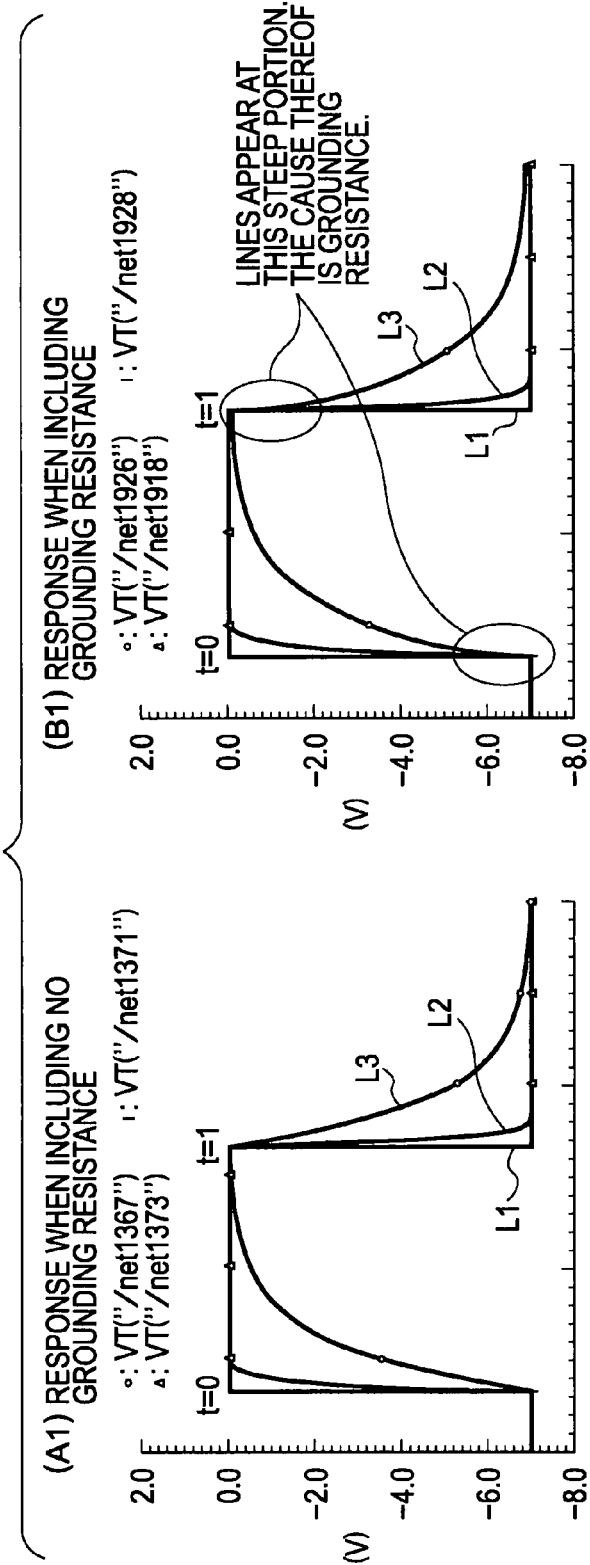
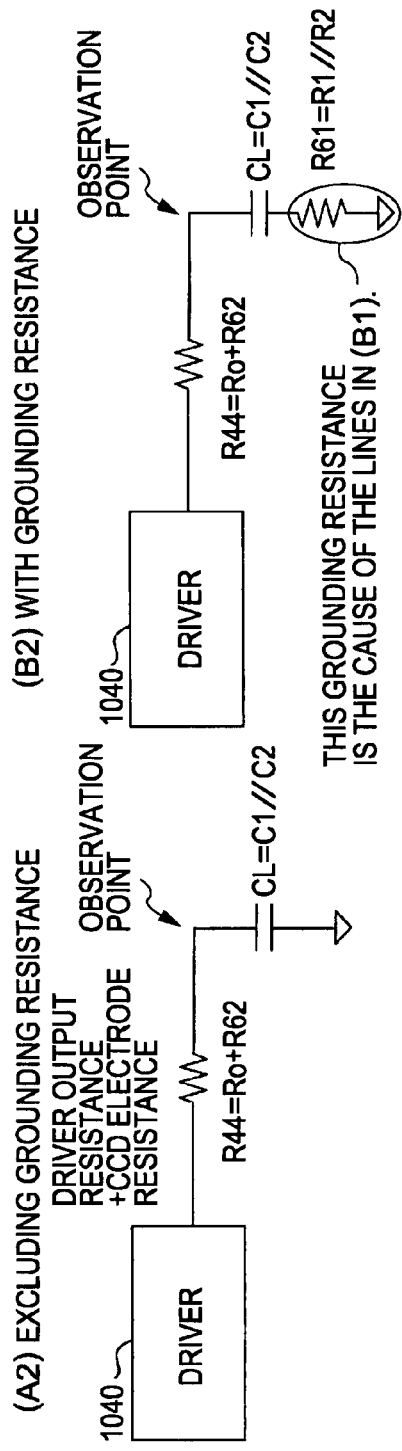

METHOD FOR DETERMINING THE AMOUNT OF DELAY
FROM RELATION WITH TRANSITION STARTING POINT

METHOD FOR DETERMINING THE AMOUNT OF DELAY
FROM RELATION WITH HALFWAY POINT DURING TRANSITION

METHOD FOR DETERMINING THROUGH RATE FROM RELATION WITH TRANSITION STARTING POINT

METHOD FOR DETERMINING THROUGH RATE FROM RELATION WITH HALFWAY POINT DURING TRANSITION

FIG. 44A REFERENCE VOLTAGE SETTING METHOD
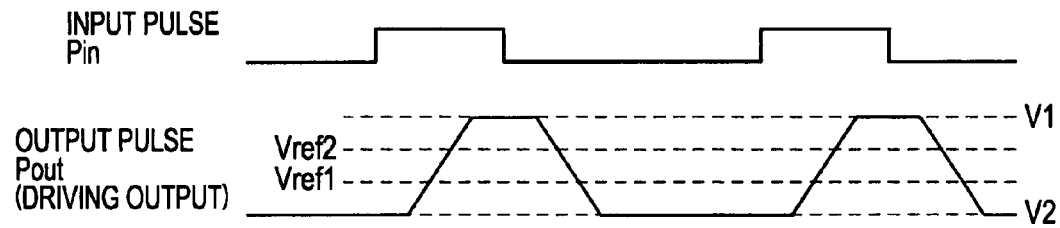
FIG. 44B METHOD FOR DETERMINING DELAYING PERIOD AND THROUGH RATE FROM RELATION WITH HALFWAY POINT DURING TRANSITION
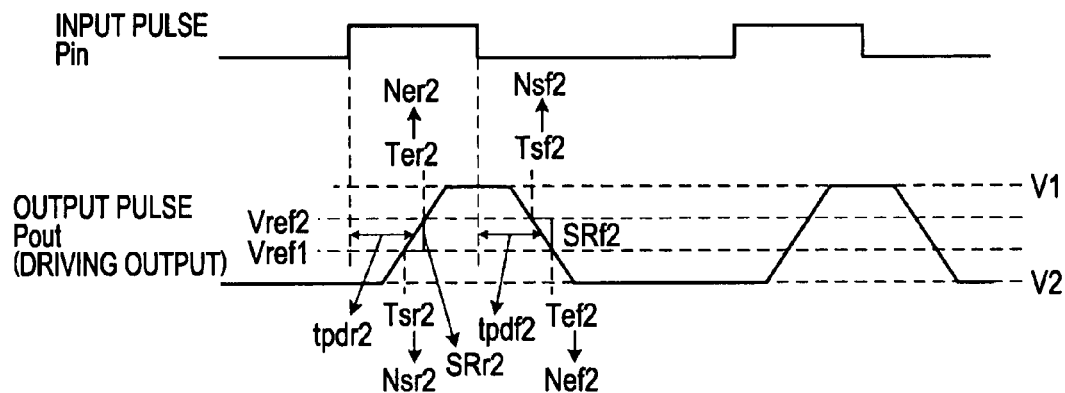
FIG. 44C METHOD FOR DETERMINING DELAYING PERIOD AT A STARTING POINT BASED ON A THROUGH RATE OBTAINED FROM RELATION WITH HALFWAY POINT DURING TRANSITION
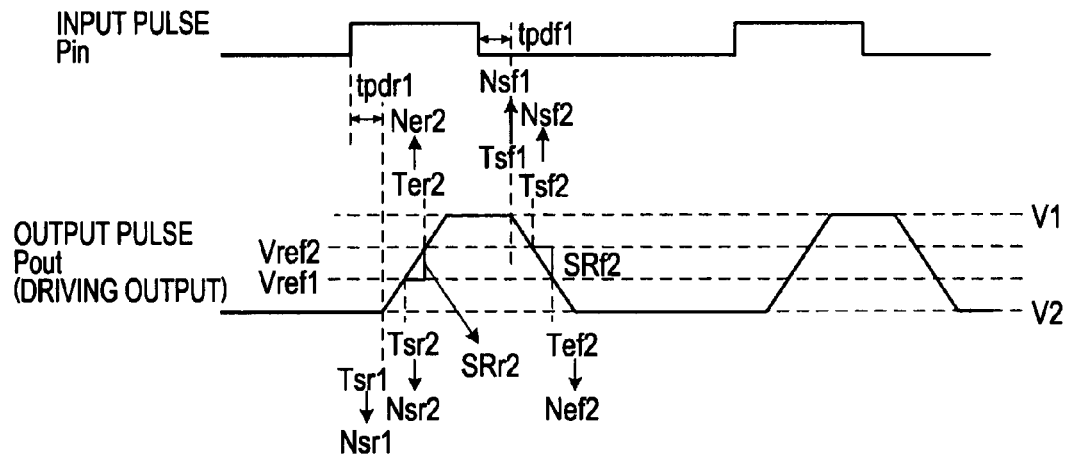

CONFIGURATION

DRIVING TIMING

SOLID-STATE IMAGE-CAPTURING DEVICE, DRIVING METHOD THEREOF, CAMERA, ELECTRIC CHARGE TRANSFER DEVICE, DRIVING METHOD AND DRIVING DEVICE FOR DRIVING LOAD, AND ELECTRONIC EQUIPMENT

CROSS REFERENCES TO RELATED APPLICATIONS

The present invention contains subject matter related to Japanese Patent Application JP 2006-038448 filed in the Japanese Patent Office on Feb. 15, 2006, Japanese Patent Application JP 2006-194913 filed in the Japanese Patent Office on Jul. 14, 2006, and Japanese Patent Application JP 2006-206141 filed in the Japanese Patent Office on Jul. 28, 2006, the entire contents of which are incorporated herein by reference.

BACKGROUND OF THE INVENTION

1. Field of the Invention

The present invention relates to a solid-state image-capturing device, and the driving method thereof, and a camera, and particularly relates to a solid-state image-capturing device employing a CCD (Charge Coupled Device) type solid-state image-capturing device (hereafter, referred to as CCD image-capturing device) having an overflow drain (OFD) configuration, and the driving method thereof, and a camera.

The present invention also relates an electric charge transfer device, a solid-state image-capturing device, and a camera, and a driving method of a solid-state image-capturing device.

The present invention also relates a driving method and driving device for driving load such as capacitive reactance or inductive reactance or the like using a pulse signal, and electronic equipment to which this driving method and driving device are applied. More particularly, the present invention relates to an arrangement for reducing influence due to various types of variations or environmental variations at the time of performing pulse driving so as to have a predetermined transient speed, such that load output signals change gradually.

2. Description of the Related Art

Taking an n-type semiconductor substrate as an example, a p-type well region is formed on this n-type semiconductor substrate, and an n-type photoelectric conversion unit, i.e., a light receiving portion is further formed on the surface of this well region, and the image-capturing area of a CCD solid-state image capturing device comprises a plurality of the light receiving portions arrayed in a matrix manner.

The allowable amount of a signal charge e accumulated in the light receiving portions due to entrance of light with such a CCD solid-state image-capturing device, i.e., so-called handling charge amount of the light receiving portions, will be described with reference to FIGS. 1A and 1B.

FIGS. 1A and 1B are diagrams illustrating a potential distribution of light receiving portions for performing photoelectric conversion of a solid-state image-capturing device having a common vertical-type overflow drain configuration. FIG. 1A is a potential distribution diagram before regulation of a substrate voltage Vsub, and FIG. 1B is a potential distribution diagram after regulation of the substrate voltage Vsub.

As illustrated in the potential distribution diagrams in FIGS. 1A and 1B, the so-called handling charge amount of light receiving portions is determined with the height of potential barrier $\Phi a$ of an overflow barrier OFB made up of a p-type well region.

That is to say, in the event that the signal charge e accumulated in light receiving portions exceeds the handling charge amount, the exceeding charge amount thereof exceeds the potential barrier $\Phi a$ of the overflow barrier to overflow on the n-type substrate making up the overflow drain OFD, and is consequently discarded. Note that reference symbol "a" in FIGS. 1A and 1B indicates an oxide film on the light receiving portions.

This handling charge amount of the light receiving portions, i.e., the height of potential barrier $\Phi a$ of the overflow barrier OFB is controlled with a bias voltage to be applied to the substrate serving as overflow drain, i.e., so-called substrate voltage Vsub.

However, with this configuration, the height of the potential barrier $\Phi$ of the overflow barrier OFB varies for each chip such as shown in a dashed line in FIG. 1A due to the manufacturing variations of the devices, and moreover, even the same chip varies regarding each light receiving portion. Now, with a solid-state image-capturing device, it is necessary for the maximum amount of signal charge (saturated signal amount) accumulated in the light receiving portions to be equal to or greater than a certain specification value from the perspective of quality management, and accordingly, let us say that the substrate voltage Vsub of a certain chip is set to a substrate bias voltage Vsub such that all of the light receiving portions within the chip can exhibit a saturation signal amount satisfying the above specification.

An emitter follower circuit is formed in a circuit for setting this substrate bias voltage Vsub, and various types of substrate voltage setting circuits including an emitter follower circuit have been proposed (e.g., see Japanese Unexamined Patent Application Publication No. 8-32065, Japanese Unexamined Patent Application Publication No. 2004-328203, and Japanese Patent No. 3440722).

FIG. 2 is a diagram illustrating the schematic configuration of a solid-state image-capturing device on which is mounted a basic substrate bias voltage setting circuit.

As illustrated in FIG. 2, a CCD chip 1 making up a solid-state image-capturing device is provided with a substrate bias setting circuit 2.

The substrate bias setting circuit 2 includes an NPN transistor 3 forming an emitter follower, a bias circuit 4, a resistance element 5, and a coupling capacitor 6.

The collector of the transistor 3 is connected to a power potential VDD, the base thereof is connected to the bias circuit 4 for generating a predetermined voltage due to resistance partial pressure, and the emitter thereof is connected to ground GND via the resistance element 5.

The connection point between the emitter of the transistor 3 and the resistance element 5 is connected with the coupling capacitor 6, and so-called electronic shutter pulses $\Phi SUB$ are applied from a terminal for inputting current pulses in the substrate bias voltage Vsub for shutter pulses supplied from outside of the substrate via the coupling capacitor 6 from between the emitter of the transistor 3 and the resistance element 5.

Here, when electrons flow into the emitter follower circuit, and the electrons pass through the PN junction within the transistor, the electrons are accelerated due to electric field to collide with silicon crystal lattices, thereby discharging secondary electrons and photons. At this time, in the event that the emitter follower circuit is provided around a pixel area, a phenomenon has been confirmed wherein the secondary electrons and photons enter inside of the pixel area of the CCD chip, and these are detected as noise.

That is to say, as illustrated with a schematic diagram in FIG. 3, with a region affected by the secondary electron and photon indicated by the reference symbol "A" in FIG. 3, and a region illustrated with the reference symbol "C" in FIG. 3 where the pixel area of the CCD chip illustrated with the reference symbol "B" in FIG. 3 is overlapped, the secondary electron is mixed therein as pixel charge, whereby the regions appear to emit light, or the photon is mixed in the pixel area to be photoelectrically converted, whereby the regions also appear to emit light, which have been confirmed as abnormality in image quality.

Particularly, in the event of shooting a night scene for example with a shooting mode whose exposure period is generally one second through several minutes or so (hereafter, referred to as long exposure mode), which is employed for shooting in darkness using a CCD camera, the above-described light emitting phenomenon due to the secondary electron and photon markedly appears. Note that with a normal shooting mode for performing shooting of 3 through 5 pictures per second (hereafter, referred to as normal exposure mode), the exposure period thereof is short, so the amount of the secondary electrons and photons occurring is small, and accordingly, a light emitting phenomenon does not reach a level recognized as abnormality in image quality.

There is occurrence of a dark current and so forth at the time of long exposure, and following capturing of a signal image, light shielding images are consecutively captured, and difference therebetween is taken, thereby performing elimination of noise of a fixed pattern in darkness.

A solid-state image apparatus, e.g., a two-phase driving method is employed for the horizontal transfer register of a CCD (Charge Coupled Device) area sensor.

FIG. 14 illustrates driving signal examples of two-phase driving. H1 and H2 denote diving pulses, RG denotes a reset gate pulse, and CCDout denotes output of a CCD.

Japanese Unexamined Patent Application Publication No. 2004-328203 has disclosed a basic two-phase driving technique employing a storage transfer configuration wherein emphasis is put on high performance.

With electric circuits and electronic equipment, various types of arrangement are employed wherein impedance components are regarded as load, and this load is driven with a pulse signal.

For example, examples of electronic equipment include an image-capturing device wherein CCD solid-state image-capturing devices having a transfer electrode serving as capacitive reactance are arrayed two-dimensionally. Also, there is a motor having a coil serving as inductive reactance.

On the other hand, when driving impedance components such as capacitive reactance or inductive reactance or the like as loads using a pulse signal, the phase and transition properties of a driving pulse is affected by the relation between the loads and a driving device, specifically relation between variations in the loads and variations in the device performance and environmental fluctuation, and as a result thereof, a problem occurs wherein it is difficult to drive these loads appropriately. In the event of low-speed driving, the influence thereof is small, but in the event of high-speed driving, a minute deviation sometimes causes great influence upon the performance.

Also, for example, in the event of driving multiple loads using pulse signals whose phases are shifted in small steps, a minute deviation of the respective phases sometimes prevents appropriate driving. Also, in the event of driving two loads using an inverted pulse signal as well, a minute deviation of the respective phases sometimes prevents appropriate driving.

Description will be made below using specific examples. With an image-capturing device having a transfer electrode serving as capacitive reactance, in recent years, with a video camera on which is mounted a CCD solid-state image-capturing device, there has been a strong demand for image-capturing a camera portion at high speed to perform slow playback regardless of a television system, and also with a digital still camera on which is mounted a CCD solid-state image-capturing device, deterioration in continuous shooting speed along with multiple pixilation has been seen as a problem, high-speed performance in an image-capturing device has been demanded.

FIGS. 49A and 49B are diagrams describing an arrangement of an existing image-capturing device. Here, FIG. 49A is a diagram illustrating principal parts in one configuration example of an existing image-capturing device employing a CCD solid-state image-capturing device of a interline transfer (IT) method, and FIG. 49B is a diagram illustrating one example of a driving method of a CCD solid-state image-capturing device.

An existing image-capturing device 1003 includes a CCD solid-state image-capturing device 1030, and a driving circuit 1004 serving as a driving device for driving the CCD solid-state image-capturing device 1030.

With the CCD solid-state image-capturing device 1030, multiple light receiving sensors 1031 serving as pixels are arrayed in a two-dimensional matrix manner. The CCD solid-state image-capturing device 1030 also includes an image-capturing portion (light receiving portion) 1030a wherein multiple vertical transfer registers 1033 having a CCD configuration are formed corresponding to each of the light receiving sensor rows. At the outside of the image-capturing portion (light receiving portion) 1030a, a horizontal transfer register 1034 having a CCD configuration is formed so as to connect to the last stages of the respective vertical transfer registers 1033, and the subsequent stage of the horizontal transfer register 1034 is connected with an output portion 36.

On the vertical transfer registers 1033 extending in the row (vertical) direction (light receiving surface side), four types of vertical transfer electrodes 1032 (each denoted with sub-numerals _1, _2, _3, or _4) extending in the horizontal direction so as to share the vertical transfer register 1033 at the same vertical position of each row are disposed in a predetermined sequence in the vertical direction so as to form opening portions on the light receiving surface of the light receiving sensors 1031.

The four types of vertical transfer electrodes 1032 are formed such that the two vertical transfer electrodes 1032 correspond to the one light receiving sensor 1031, and also are configured so as to transfer and drive signal charge in the vertical direction using four types of vertical transfer pulses $\Phi V\_1$, $\Phi V\_2$, $\Phi V\_3$, and $\Phi V\_4$ supplied from the driving circuit 1004. In other words, an arrangement is made wherein the two light receiving sensors 1031 are coupled as one pair (excluding the last stage of the horizontal transfer register 1034 side), and the vertical transfer pulses $\Phi V\_1$, $\Phi V\_2$, $\Phi V\_3$, and $\Phi V\_4$ are applied from the driving circuit 1004 to each of the four vertical transfer electrodes 1032.

With the example illustrated, at the horizontal transfer register 1034 side the vertical transfer electrodes 1032 are provided corresponding to one pair of the four vertical transfer registers 1033 in the vertical direction, in which the light receiving sensor 1031 positioned at the uppermost portion in the vertical direction corresponds to the vertical transfer electrode 1032_1 to which the vertical transfer pulse ΦV_1 is applied. The vertical transfer pulse ΦV_2 is applied to the vertical transfer electrode 1032_2 which is further one stage ahead (closer to the horizontal transfer register 1034 side), the vertical transfer pulse ΦV_3 is applied to the vertical transfer electrode 1032_3 which is further one stage ahead (closer to the horizontal transfer register 1034 side), and the vertical transfer pulse ΦV_4 is applied to the vertical transfer electrode 1032_4 which is the closest to the horizontal transfer register 1034 side.

The vertical transfer registers 1033 are connected to the horizontal transfer register 1034 via the last stage of one pair of the vertical transfer electrodes 1032 (transfer electrodes 32_1 through 32_4 to which the (ΦV _1 through ΦV_4 are applied).

With the horizontal transfer register 1034, two horizontal electrodes 1035 (each denoted with sub-numerals _1 and _2) are formed so as to correspond to each of the vertical transfer registers 1033, and are configured so as to transfer and drive signal charge in the horizontal direction using two phases of horizontal driving pulses ΦH_1 and ΦH_2 supplied from the driving circuit 1004.

With the CCD solid-state image-capturing device 1030 having such a configuration, light is received and photoelectric-converted at the light receiving sensors 1031, and signal charge corresponding to the light receiving amount thereof is accumulated. The signal charge of the light receiving sensors 1031 is read out from the light receiving sensors 1031 to the vertical transfer registers 1033 during a vertical blanking period, and hereinafter, the signal charge is vertically transferred for each horizontal line during a horizontal blanking period, thereby performing vertical line shift to transfer the signal charge to the horizontal transfer register 1034. Subsequently, the signal charge transferred to the horizontal transfer register 1034 is transferred in the horizontal direction during a horizontal valid transfer period, and is externally output via the output portion 1036.

The vertical line shift of signal charge at an existing CCD solid-state image-capturing device 1030 has been designed so as to transfer and drive signal charge using the vertical transfer pulses (ΦV_1 through ΦV_4) during a horizontal blanking period Hb of a television system such as the driving timing of vertical line shift illustrated in FIG. 49B. Specifically, as illustrated in FIG. 49B, with vertical line shift of signal charge, for example, signal charge awaiting at the vertical transfer electrodes 1032_2 and 1032_3 corresponding to the ΦV_2 and ΦV_3 is line-shifted to the horizontal transfer register 1034 by the four types of vertical driving pulses ΦV_1 through ΦV_4. In other words, signal charge to the horizontal transfer electrode 1035_1 to which each of the horizontal driving pulses ΦH_1 of the horizontal transfer register 1034 is applied is transferred at the trailing edge of the vertical driving pulse ΦV_4 of the vertical transfer electrode 1032_4.

Though not illustrated in the drawing, the inclination of the leading and trailing edges ΔV/ΔT (ΔV denotes voltage, and ΔT denotes time) of the respective vertical driving pulses ΦV_1 through ΦV_4 which are applied to the vertical transfer electrodes 1032_1 through 1032_4 during the horizontal blanking period Hb at the time of vertical line shift is similar to the transient speed (ΔV/ΔT) of the vertical transfer pulses ΦV_1 through ΦV_4 which are applied to the vertical transfer electrodes 1032_1 through 1032_4 during the vertical blanking period. FIG. 49B illustrates a driving pulse using a rectangular pulse which rises vertically and falls vertically.

On the other hand, for example, operations at the time of electronic camera shake correction in an image-capturing device such as a video camera employing a CCD solid-state image-capturing device, and a CCD solid-state image-capturing device employing a frame interline transfer (FIT) system for broadcasting business need to perform high-speed vertical transfer during the vertical blanking period.

Also, an arrangement has been proposed wherein a CCD image-capturing device performs vertical line shift using four types of vertical transfer pulses during the horizontal blanking period (e.g., see FIG. 3 of Japanese Unexamined Patent Application Publication No. 2000-138943).

Incidentally, heretofore, with the above CCD solid-state image-capturing device 1030, vertical line shift and vertical high-speed transfer are driven by providing a vertical driving scan circuit having the same properties, i.e., a so-called vertical driver in the driving circuit 1004, and a high-speed CMOS-type vertical driver is commonly employed. Accordingly, when performing this vertical transfer during a horizontal valid scan period, noise (coupling noise) occurs due to crosstalk within the CCD solid-state image-capturing device 1030 at the moment of the vertical transfer pulses (ΦV_1 through ΦV_4) being applied.

In other words, when performing vertical transfer during a horizontal valid scan period, transient speed is fast at the leading and trailing edges of a driving waveform, i.e., the inclination ΔV/ΔT of the leading and trailing edges of the vertical transfer pulses (ΦV_1 through ΦV_4) is great, so crosstalk noise is superimposed upon a CCD output signal, and consequently, image noise of vertical lines appears. That is to say, deterioration in image quality occurs (noise occurs) due to the fast transient speed of a driving waveform. With embodiments, description will be made further in detail regarding this point, but the cause thereof is that the transient fluctuation of driving voltage as to one electrode interferes driving voltage as to other electrodes.

Accordingly, heretofore, in order to prevent this deterioration in image quality, vertical driving (vertical transfer) has been performed during a period other than the horizontal valid scan period. That is to say, in the event of performing vertical line shift, application of the vertical transfer pulses (ΦV_1 through ΦV_4) has no adverse effect on an image during the horizontal blanking period alone, so with an existing CCD solid-state image-capturing device, vertical transfer for vertical line shift has been performed during this horizontal blanking period.

The TV system defines a horizontal blanking period, so when TV was mainstream, it was sufficient that vertical line shift can be performed within the horizontal blanking period. However, when attempting to perform multiple pixelating or increased frame rates aside from the television system, the horizontal blanking period necessary for vertical line shift becomes a waste of time, which has impeded increased frame rates.

In order to realize increased frame rates, it is necessary to reduce the horizontal blanking period, but which needs to perform vertical line shift at high speed, and therefore, it becomes necessary to reduce the resistance of transfer electrodes. In order to realize reduction in resistance, an arrangement can be conceived wherein an electrode cross-sectional area is expanded as one technique, but it is difficult to expand this in the lateral direction (areal direction), there is the need to thicken the film thickness of the transfer electrodes. However, thickening the film thickness of the transfer electrodes causes a step around a center opening to increase in height, and when light enters there, vignetting of oblique light occurs, which causes a problem such as deterioration in sensitivity and occurrence of shading, and accordingly it is difficult to realize improvement in vertical transfer speed.

As described above, when increasing frame rate, with electronic equipment such as a digital camera or the like employing a CCD solid-state image-capturing device of a non-television system, even if the output rate of a signal is increased, the horizontal blanking period increases, and accordingly, it is difficult to obtain high speed exceeding a certain speed.

In order to solve such a problem, the present applicant has proposed an arrangement for extremely reducing the horizontal blanking period, and realizing increased frame rates (see Japanese Unexamined Patent Application Publication No. 2005-269060).

With the arrangement described in this Japanese Unexamined Patent Application Publication No. 2005-269060, a driving clock waveform having the inclination of the leading and trailing edges serving as transient speed V/T (wherein V represents voltage and T represents time), i.e., a pulse signal having a smooth moderate inclination is particularly employed as a transfer pulse, thereby supplying this to transfer electrodes serving as a capacitive reactance load. Thus, with a high-pixel CCD, a frame rate can be increased with a low clock rate by performing vertical transfer during a valid pixel period, but which needs to supply a pulse signal having a smooth and moderate inclination.

However, though removal of fixed pattern noise in darkness has been performed with the above method, since digitalization of expensive single-lens reflex cameras has advanced, time loss for capturing consecutively causes a problem, a mode not performing removal of difference of fixed pattern noise in darkness has been demanded.

However, at this time, with an existing CCD-built-in substrate bias circuit, hot carrier and luminescence proportional to an electric current flowing into the junction between the base and emitter of the NPN transistor 3 at the last stage remain, and the hot spot phenomenon deteriorates the image.

Note that the term "hot spot" means a phenomenon wherein unnecessary electric charge has accumulated circularly on the sensor centered on a place where hot carrier or luminescence occurs, and projected so as to emit light.

An advantage of the present invention is that hot spots can be prevented from occurring, and a solid-state image-capturing device capable of preventing deterioration in images, and the driving method thereof, and a camera, can be provided.

With the technology disclosed in Japanese Unexamined Patent Application Publication No. 2004-328203, a storage transfer configuration for two-phase driving assuming driving of moving images and still images in a digital still camera is employed, so it is necessary to perform transfer during a period wherein the driving pulse is at a low level, the duty ratio thereof also needs to be set to one of the number of driving phases.

Therefore, the electric charge storage amount thereof is the same as that in two phases, i.e., only the storage portion of one gate, and also the driving amplitude thereof is the same as that in two phases, and accordingly, it is difficult to realize enlargement of dynamic range and reduction in electric power.

That is to say, with the technology disclosed in Japanese Unexamined Patent Application Publication No. 2004-328203, multiple gate storage such as normal multi-phases driving is not employed, it is difficult to realize improvement in handling electric charge amount, and reduction in electric power due to reduction in amplitude.

Alternatively, a so-called multi-phases driving system such as three-phase driving or the like which is capable of low-voltage driving as compared with a two-phase driving system has been proposed.

FIG. 15 illustrates driving signal examples of three-phase driving. H1, H2, and H3 denote driving pulses, RG denotes a reset gate pulse, CCDout denotes output of a CCD, and SHP and SHD denote sampling and holding pulses.

As illustrated in FIG. 15, with a common three-phase driving system, there are disadvantages such as a crosstalk noise problem at a CDS sampling portion, difficulty in ensuring a data output period, and so forth.

That is to say, with normal multi-phases driving, according to operations such as transfer and storage, in a state in which at least one gate is at a low level, another one gate is changed for transfer, so there is a period wherein two gates go to low level.

Such multi-phases successive driving causes transition portions to increase, which has not been employed for driving of a horizontal CCD for performing sampling of a signal due to a crosstalk noise problem.

With Japanese Patent No. 3440722, crosstalk noise improvement technology using three-phase driving has been disclosed.

However, with the technology disclosed in Japanese Patent No. 3440722, it is necessary to perform transfer only during a narrow reset period, and accordingly, which is unsuitable for increase in speed.

An advantage of the present invention is that an electric-charge transfer device, solid-state image-capturing device, and a camera, and a method for driving a solid-state image-capturing device are provided, whereby it is possible to realize prevention of crosstalk and increase in speed while maintaining multi-phases original advantages, such as improvement in the amount of handling electric charge, and reduction in electric power due to reduction in amplitude.

SUMMARY OF THE INVENTION

Now, in order to maintain the inclination of a driving pulse in a constant value as much as possible at the time of driving a load serving as capacitive reactance using a pulse signal whose inclination is smooth and moderate (voltage pulse in this case), as described in Japanese Unexamined Patent Application Publication No. 2005-269060, a system for driving load capacity using a constant electric current can be conceived. However, simply driving with a constant electric current is sometimes affected by manufacturing irregularities of load capacity, manufacturing irregularities of driving devices, or environmental fluctuations, which prevents suitable driving. Also, in the event that the phase relation is deviated due to influence of manufacturing irregularities of load capacity, and manufacturing irregularities of driving devices as well, suitable driving is sometimes prevented. Note that the details of these problems will be described in the following embodiments.

Also, these points can be applied to a case wherein inductive reactance is taken as a load, which has a dual relation as to capacitive reactance. That is to say, in order to maintain the inclination of a driving pulse in a constant value as much as possible at the time of driving a load serving as inductive reactance using a pulse signal whose inclination is smooth and moderate (electric current pulse in this case), a system for driving load inductance using a constant voltage can be conceived, but suitable driving is sometimes prevented due to influence of manufacturing irregularities of load inductance, and manufacturing irregularities of driving devices. Also, in the event that the phase relation is deviated due to influence of manufacturing irregularities of load inductance, and manufacturing irregularities of driving devices as well, suitable driving is sometimes prevented.

The present invention has been made in light of the above situations, and according to an embodiment of the present invention, there is provided an arrangement wherein the problem of deterioration in driving capabilities due to irregularities and environmental deviations can be reduced at the time of driving a load using a pulse signal having smooth and moderate transition properties.

According to an embodiment of the present invention, there is provided a solid-state image-capturing device having built in: an image-capturing area including a light receiving element provided on a semiconductor substrate; a substrate bias circuit; and a clamp circuit for receiving output of the substrate bias circuit, and applying the output of the substrate bias circuit to the semiconductor substrate in accordance with a substrate pulse; including a substrate bias control circuit for controlling so as to reduce an electric current of the clamp circuit during a predetermined period.

Preferably, the substrate bias control circuit effects control so as to reduce the difference between the intermediate output of the input voltage terminal of the clamp circuit and the output of substrate voltage during the predetermined period.

According to another embodiment of the present invention, there is provided a method for driving a solid-state image-capturing device having built in: an image-capturing area including a light receiving element provided on a semiconductor substrate; a substrate bias circuit; and a clamp circuit for receiving output of the substrate bias circuit, and applying the output of the substrate bias circuit to the semiconductor substrate in accordance with a substrate pulse; and including the step of reducing the electric current of the clamp circuit so as to reduce the difference between the intermediate output of the input voltage terminal of the clamp circuit and the output of substrate voltage perpetually or over a long exposure period.

According to another embodiment of the present invention, there is provided a camera comprising: a solid-state image-capturing device; an optical system for guiding incident light to the image-capturing area of the solid-state image-capturing device; and a signal processing circuit for subjecting an image obtained by the solid-state image-capturing device to predetermined processing, wherein the solid-state image-capturing device has built in an image-capturing area including a light receiving element provided on a semiconductor substrate, a substrate bias circuit, and a clamp circuit for receiving output of the substrate bias circuit, and applying the output of the substrate bias circuit to the semiconductor substrate in accordance with a substrate pulse, including a substrate bias control circuit for reducing an electric current of the clamp circuit during a predetermined period.

According to the above embodiment of the present invention, the substrate voltage is applied to the semiconductor substrate via the clamp circuit to which the substrate pulse is input, but during a predetermined period, e.g., during a long exposure period, the substrate bias control circuit controls the electric current of the clamp circuit so as to be reduced.

According to another embodiment of the present invention, there is provided an electric-charge transfer device comprising: an electric-charge transfer unit which is transferred and driven with transfer pulses not less than three phases to transfer signal charge; and a driving unit for supplying the transfer pulses not less than three phases to drive the electric-charge transfer unit; wherein the transfer pulses not less than three phases assume a first level and a second level; and wherein the driving unit employs driving with multiple phases not less than three phases, and drives the electric-charge transfer unit such that the first level period exists at only one phase for each time, and the corresponding first level voltage is output in the transfer direction sequence.

According to another embodiment of the present invention, there is provided a solid-state image-capturing device including: multiple photoelectric conversion elements; an electric-charge transfer unit which is transferred and driven with transfer pulses not less than three phases to transfer signal charge obtained at the photoelectric conversion elements; and a driving unit for supplying the transfer pulses not less than three phases to drive the electric-charge transfer unit; wherein the transfer pulses not less than three phases assume a first level and a second level; and wherein the driving unit employs driving with multiple phases not less than three phases, and drives the electric-charge transfer unit such that the first level period exists at only one phase for each time, and the corresponding first level voltage is output in the transfer direction sequence.

According to another embodiment of the present invention, there is provided a camera comprising: a solid-state image-capturing device; an optical system for guiding incident light to the image-capturing area of the solid-state image-capturing device; and a signal processing circuit for subjecting an image obtained by the solid-state image-capturing device to predetermined processing; the solid-state image-capturing device including multiple photoelectric conversion elements, an electric-charge transfer unit which is transferred and driven with transfer pulses not less than three phases to transfer signal charge obtained at the photoelectric conversion elements, and a driving unit for supplying the transfer pulses not less than three phases to drive the electric-charge transfer unit, wherein the transfer pulses not less than three phases assume a first level and a second level; and wherein the driving unit employs driving with multiple phases not less than three phases, and drives the electric-charge transfer unit such that the first level period exists at only one phase for each time, and the corresponding first level voltage is output in the transfer direction sequence.

According to another embodiment of the present invention, there is provided a method for driving a solid-state image-capturing device including multiple photoelectric conversion elements, and an electric-charge transfer unit which is transferred and driven with transfer pulses not less than three phases which assume a first level and a second level to transfer signal charge obtained at the photoelectric conversion elements, including the steps of: employing driving with multiple phases not less than three phases; and driving the electric-charge transfer unit such that the first level period exists at only one phase for each time, and the corresponding first level voltage is output in the transfer direction sequence.

Also, with an arrangement according to an embodiment of the present invention, when driving a load based on an input pulse signal, a waveform shaping processing unit is configured so as to subject an input pulse signal to predetermined waveform shaping processing, a pulse driving waveform shaping control unit monitors a pulse output signal generated at a load, and controls the regulating amount at the waveform shaping processing unit such that the transition properties such as the delay amount and variation properties of the pulse output signal exhibit predetermined properties.

In other words, the pulse output signal in an actual working state generated at the load is monitored, and feedback control is made such that the transition properties of the pulse output signal become predetermined properties.

According to an embodiment of the present invention, hot spots can be prevented from occurring during long exposure period or the like, whereby deterioration in images can be prevented.

Also, according to an embodiment of the present invention, prevention of crosstalk and increase in speed can be realized, while maintaining multi-phases original advantages, such as improvement in the amount of handling electric charge, and reduction in electric power due to reduction in amplitude.

Also, according to an embodiment of the present invention, the pulse output signal in an actual working state is monitored, and feedback control is made such that the transition properties of the pulse output signal become predetermined properties, so constant transition properties can be obtained typically even if there are individual irregularities of load properties, individual irregularities of driving properties, or environmental fluctuations.

When driving a load using a pulse signal having moderate transition properties, driving with a suitable phase delay amount and suitable inclination properties can be realized typically without receiving influence of manufacturing irregularities of load capacity, manufacturing irregularities of driving devices, and environmental fluctuations.

BRIEF DESCRIPTION OF THE DRAWINGS

FIG. 28 is a diagram describing the step response of a vertical transfer pulse $\Phi V$;

FIGS. 44A through 44C are timing charts describing the operations of the pulse driver in FIG. 43;

DESCRIPTION OF THE PREFERRED EMBODIMENTS

Embodiments of the present invention will be described below associated with the appended drawings.

Figure 4:
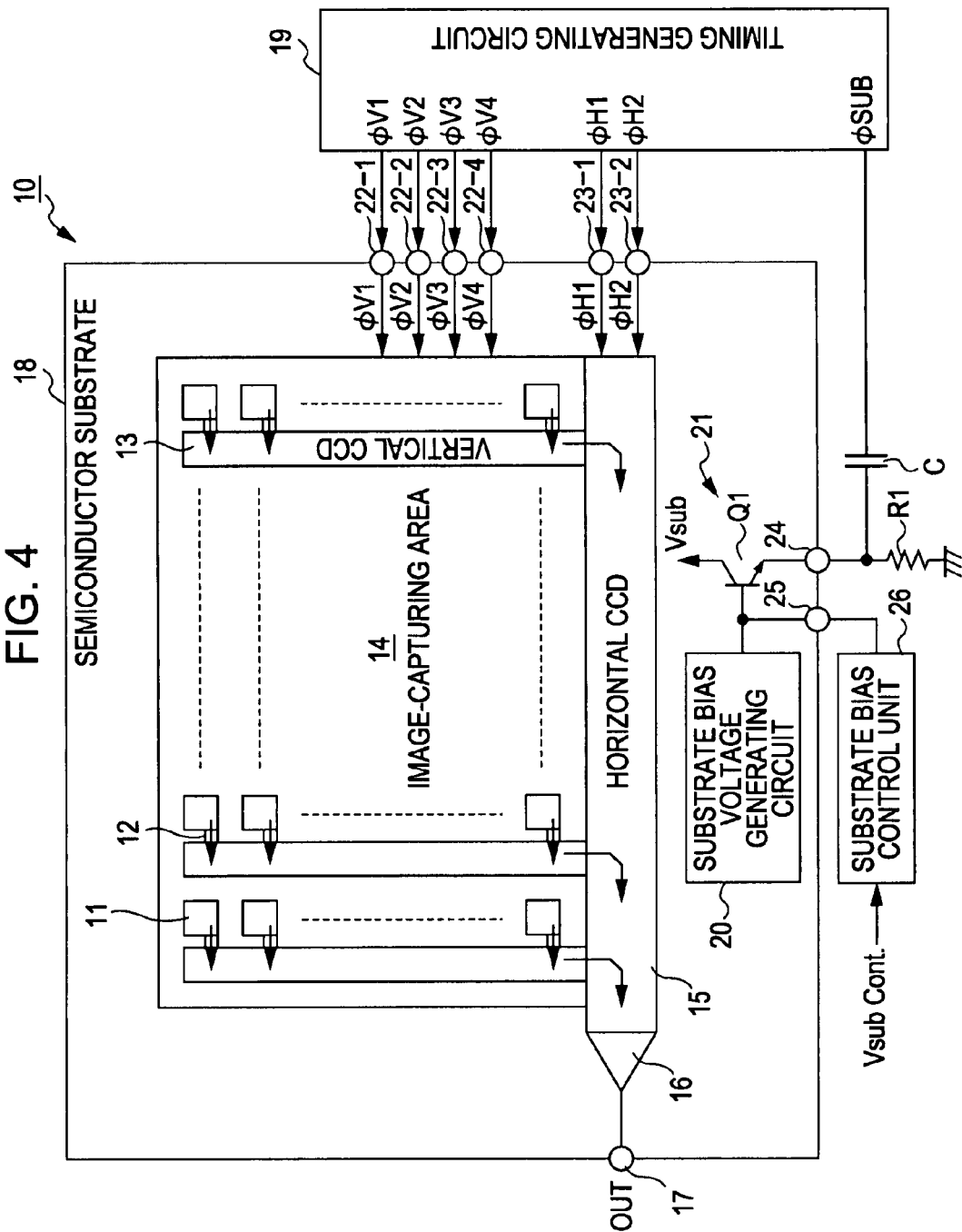
FIG. 4 is a diagram illustrating a configuration example of a solid-state image-capturing device according an embodiment of the present invention.

FIG. 4 is a diagram illustrating a configuration example of a solid-state image-capturing device according to an embodiment of the present invention.

The example of a solid-state image-capturing device 10 according to the present embodiment shown here illustrates a case of application of a CCD area sensor according to an interline (IT) transfer method, for example.

The solid-state image-capturing device 10 in FIG. 4 is arrayed in a matrix shape in the line (vertical) direction and in the row (horizontal) direction. An image-capturing area 14 is made up of multiple sensor units (photoelectric conversion elements) 11 for converting incident light into a signal charge of the electric charge amount corresponding to the light amount thereof, and storing the electric charge, and multiple vertical transfer registers 12, which are provided for each vertical row of these sensor units 11, for vertically transferring the signal charge read out from the respective sensor units 11 via readout gate portions (not shown).

With this image-capturing area 14, the sensor units 11 are, for example, made up of a photodiode of PN junction.

The signal charge stored in the sensor units 11 is read out by a later-described readout pulse XSG being applied to the readout gate portions 12.

The vertical CCD 13 is transfer-driven with the four phases of vertical transfer clocks $\Phi V1$ through $\Phi V4$ for example, and sequentially transfers a portion equivalent to one scan line (one line) at a time of the readout signal charge in the vertical direction at a part of a horizontal blanking period.

With the vertical CCD 13, the transfer electrodes serving as the first phase and the third phase also serve as the gate electrodes of the readout gate portions 12. Accordingly, of the four phases of the vertical transfer clocks $\Phi V1$ through $\Phi V4$, the transfer clock $\Phi V1$ serving as the first phase and the transfer clock $\Phi V3$ serving as the third phase are set so as to assume the three values of a low level, a middle level, and a high level, and the high level pulse serving as the third value becomes a readout pulse XSG to be provided to the gate portions 12.

A horizontal CCD 15 is disposed at the lower side of the image-capturing area 14 on the drawing. Signal charge equivalent to one line is sequentially transferred to this horizontal CCD 15 from the multiple vertical CCDs 13.

The horizontal CCD 15 is transfer-driven with the two phases of horizontal transfer clocks $\Phi H1$ and $\Phi H2$ for example, and sequentially transfers the signal charge equivalent to one line transferred from the multiple vertical CCDs 13 in the horizontal direction during a horizontal scan period following a horizontal blanking period.

The end portion of the transfer destination of the horizontal CCD 15 is provided with, for example, an electric-charge voltage conversion unit 16 having a floating diffusion amplifier configuration.

This electric-charge voltage conversion unit 16 sequentially converts the signal charge horizontally transferred by the horizontal CCD 15 into a voltage signal, and outputs this. This voltage signal passes through an output circuit (not shown), following which is output externally from an output terminal 17 as CCD output corresponding to the incident amount of light from a subject.

The above-described sensor units 11, readout gate portions 12, vertical CCDs 13, horizontal CCDs 15, and electric-charge voltage conversion unit 16, and so forth are formed on a semiconductor substrate (hereafter, simply referred to as substrate) 18. Thus, the CCD image-capturing device 10 of the interline transfer method is configured.

The four phases of the vertical transfer clocks $\Phi V1$ through $\Phi V4$, and the two phases of the horizontal transfer clocks $\Phi H1$ and $\Phi H2$ for driving the CCD image-capturing device 10 are generated from a timing generating circuit 19.

The four phases of the vertical transfer clocks $\Phi V1$ through $\Phi V4$ are supplied to the vertical CCDs 13 via terminals (pads) 22-1 through 22-4 formed on the substrate 18.

The two phases of the horizontal transfer clocks $\Phi H1$ and $\Phi H2$ are supplied to the horizontal CCD 15 via terminals 23-1 and 23-2.

The timing generating circuit 19 further generates various types of timing signals such as a shutter pulse $\Phi SUB$ for sweeping out the signal charge stored in the sensor units 11, and so forth as appropriate in addition to those transfer clocks.

Further, a bias voltage generating circuit 20 for generating a bias voltage (hereafter, referred to as substrate bias) Vsub for biasing the substrate 18 is formed on the substrate 18.

The substrate bias Vsub generated at this bias voltage generating circuit 20 is applied to the substrate 18 via an NPN transistor Q11 making up a clamp circuit 21. Description will be made later in detail regarding the effects of the substrate bias Vsub. Also, connection terminals 24 and 26 are formed on the substrate 18.

The base of the transistor Q11 is connected to the output of the bias voltage generating circuit 20, and the emitter thereof is connected to the terminal 24, and the substrate bias Vsub is supplied to the substrate 18 from the collector thereof.

The emitter of the transistor Q11 is connected to one end of a resistance element R11 via the substrate terminal 24, the other end of the resistance element R11 is connected to ground GND (reference potential), and the collector thereof is connected to a power source potential VDD.

The connection point (node) ND11 between the terminal 24 and one end of the resistance element R11 is connected to the first electrode of a coupling capacitor C11, and the second electrode of the capacitor C11 is connected to the output terminal of the shutter pulse ΦSUB of the timing generating circuit 19.

Further, with the present embodiment, the terminal 25 is connected to the base of the transistor Q11, and the terminal 25 is connected to the substrate bias control circuit 26. The substrate bias control circuit 26 includes a substrate bias modulation function, and a control function for reducing the electric current of the clamp circuit 21 to prevent hot spots from occurring at the time of a long exposure mode.

The configuration and functions of the substrate bias control circuit 26 will be described later.

These bias voltage generating circuit 20, clamp circuit 21, resistance element R11, capacitor C11, and substrate bias control circuit 26 make up a substrate bias setting circuit 30.

Figure 5:
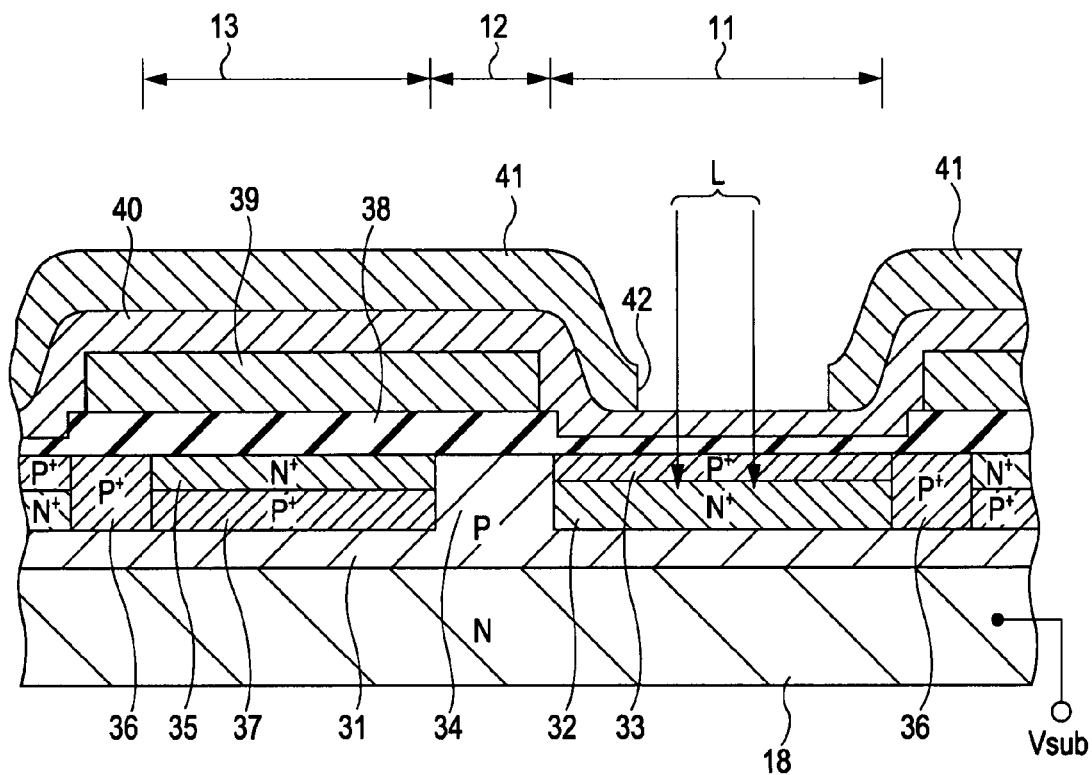
FIG. 5 is a cross-sectional view illustrating the configuration of the substrate depth direction around a sensor unit according to the present embodiment.

FIG. 5 is a cross-sectional view illustrating the configuration in the substrate depth direction in the vicinity of the sensor units 11.

In FIG. 5, for example, a P-type well region 31 is formed on the surface of the N-type substrate 18. An N+ type signal electric-charge storage region 32 is formed on the surface of the well region 31, and further above thereof a P+ type positive hole storage region 33 is formed, whereby the sensor unit 11 having a so-called HAD (positive hole storage diode) configuration is configured.

The electric-charge amount of signal charge e stored in the sensor unit 11 is determined with the height of potential barrier of an overflow barrier OFB made up of a P-type well region 31. In other words, this overflow barrier OFB is for determining a saturation signal charge amount Qs stored in the sensor unit 11, and in the event that the storage electric-charge amount exceeds this saturation signal charge amount Qs, the electric charge equivalent to the exceeding amount crosses the potential barrier to be swept out to the substrate 18 side.

Thus, the sensor units 11 having a so-called vertical-type overflow drain configuration are configured. With a vertical-type overflow drain configuration, the substrate 18 serves as an overflow drain. With the sensor units 11, the saturation signal charge amount Qs is determined with the S/N properties of the device, the handling electric-charge amount of the vertical CCDs 13, and so forth, but manufacturing irregularities cause the potential irregularities of the overflow barrier OFB.

This potential of the overflow barrier OFB can be controlled with the overflow drain bias, i.e., the above substrate bias Vsub.

In the lateral direction of the sensor units 11, a N+ type signal charge transfer region 35 and a P+ type channel stopper region 36 are formed via a P type region 34 making up the readout gate portions 12. A P+ type impurity spread region 37 for preventing smear components from contamination is formed underneath the signal charge transfer region 35. Further, a transfer electrode 39 made up of polycrystalline silicon for example is disposed above the signal charge transfer region 35 via a gate insulating film 38, whereby the vertical CCD 13 is configured. With the transfer electrode 39, a portion positioned above the P type region 34 also serves as the gate electrodes of the readout gate portions 12.

An Al (aluminum) light shielding film 41 is formed above the vertical CCD 13 via an interlayer film 40 so as to cover the transfer electrode 39. This Al light shielding film 41 is selectively subjected to etching elimination by the sensor unit 11, light L from the outside casts into the sensor unit 11 via an opening 42 formed by this etching elimination. As described above, the substrate bias Vsub for determining the charge amount of the signal charge stored in the sensor unit 11, i.e., determining the potential of eh overflow barrier OFB is applied to the substrate 18.

The substrate bias Vsub is set to the most appropriate value for each chip in the substrate bias generating circuit 20 illustrated in FIG. 4 in light of the potential irregularities of the overflow barrier OFB in the sensor unit 11 accompanied with the manufacturing irregularities of the respective devices, and is subjected to impedance conversion at the transistor Q11, following which is provided to the substrate 18.

As described above, this transistor Q11 is also formed on the substrate 18 together with the substrate bias generating circuit 20.

On the other hand, the shutter pulse ΦSUB generated from the timing generating circuit 19 at the time of an electronic shutter operation is subjected to direct-current cutting at the capacitor C11, following which is applied to the emitter of the transistor Q11 via the terminal 24.

As described above, the transistor Q11 makes up the clamp circuit 21 for clamping the low level of the shutter pulse ΦSUB into the direct-current level of the substrate bias Vsub.

Description will be made below regarding a configuration example of the substrate bias control circuit 26. An external substrate bias control circuit described below has a function unit for preventing hot spots from occurring.

Figure 6:
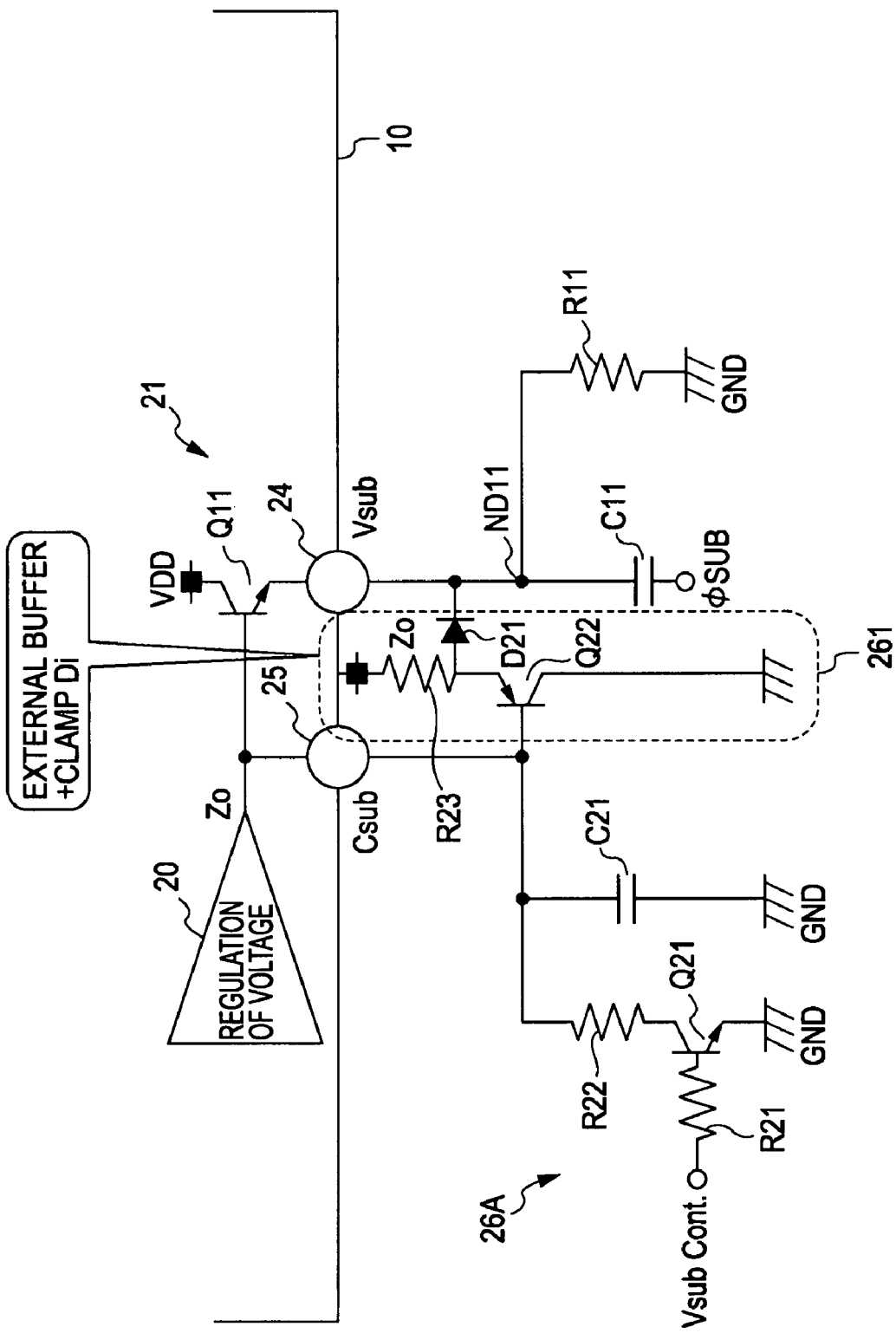
FIG. 6 is a circuit diagram illustrating a first configuration example of a substrate bias control circuit according to the present embodiment.

FIG. 6 is a circuit diagram illustrating a first configuration example of a substrate bias control circuit according to the present embodiment.

The substrate bias control circuit 26A in FIG. 6 includes an NPN transistor Q21, a PNP transistor Q22, resistance elements R21, R22, and R23, a diode D21, and a capacitor C21.

The emitter of the transistor Q21 is connected to ground GND, the base thereof is connected to one end of the resistance element R21, the other end of the resistance element R21 is connected to the input terminal of a substrate voltage control signal VsubCont, and the collector of the transistor Q21 is connected to one end of the resistance element R22. The other end of the resistance element R22 is connected to the base of the transistor Q22, the substrate terminal 25, and the first electrode of the capacitor C21, and the second electrode of the capacitor C22 is connected to ground GND.

The collector of the transistor Q22 is connected to ground GND, the emitter thereof is connected to one end of the resistance element R23, and the anode of the diode D21, and the other end of the resistance element R23 is connected to a power source potential VDD. The cathode of the diode D21 is connected to the substrate terminal 24 (node ND11).

Of these components, the transistor Q22, resistance element R23, and diode D21 make up an electric-current reducing portion 261 of the built-in clamp circuit 21.

With a substrate bias control circuit 26A, the substrate voltage control signal VsubCont, which is externally provided, is applied to the base of the transistor Q21 via the resistance element R21.

As described above, the emitter of this transistor Q21 is grounded, and the collector thereof is connected to the terminal 25 via the resistance element R22. The terminal 25 is connected with the base of the bipolar transistor Q11. The transistor Q21 and the resistance elements R21 and R22 make up a driving system 262 for driving the substrate bias Vsub to temporarily be decreased based on the substrate voltage control signal VsubCont.

Specifically, with this driving system 262, when the substrate voltage control signal VsubCont is a low level, the transistor Q21 is in an OFF state, so the substrate bias Vsub generated at the substrate bias generating circuit 20 is applied to the substrate 18 via the transistor Q11 as it is.

On the other hand, when the substrate voltage control signal VsubCont goes to a high level, the bipolar transistor Q21 goes to an ON state, the base of the transistor Q11 is grounded via the resistance element R22, and accordingly, the substrate bias Vsub generated at the substrate bias generating circuit 20 decreases by the potential equivalent to the resistance value of the resistor R22.

In the event that the clamp device in which a CCD is built in making up the substrate bias setting circuit 30 is, such as the present embodiment, an NPN transistor (or PN diode), the electric-current reducing portion 261 controls the difference between the Vsub and an intermediate output Csub to be smaller than the VF (voltage between the base and the emitter) of the transistor Q11.

Specifically, an emitter follower circuit of the PNP transistor Q22 is configured as a pre-driver for increasing voltage, and the input (base) is connected to the intermediate output Csub terminal 25.

The load resistance element R23 is set to be equivalent to the output impedance of the intermediate output Csub of the bias circuit in which a CCD is built in, whereby resistance to variations in a load can be maintained.

The output of this pre-driver is connected with the PN diode D21, and the N side thereof is connected to the Vsub terminal 24 of the CCD.

Thus, between the voltage VBE between the base and emitter of the PNP transistor Q22 and the forward voltage Vf of the PN diode D21 is balanced, the intermediate output Csub voltage is generally agreed with the substrate bias voltage Vsub, which prevents an electric current from flowing into the built-in clamp circuit 21, and also prevents hot spots from appearance.

Figure 7:
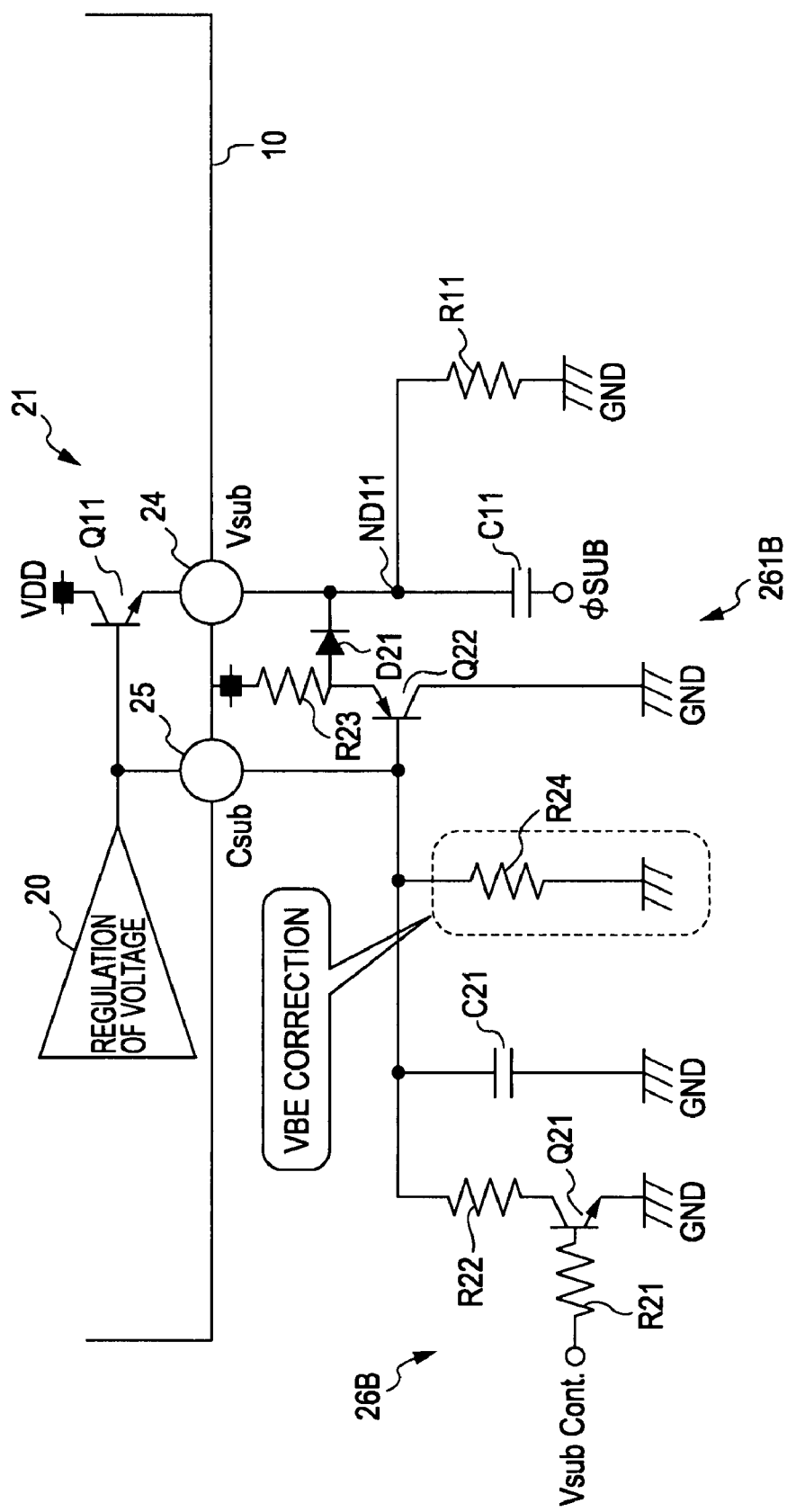
FIG. 7 is a circuit diagram illustrating a second configuration example of a substrate bias control circuit according to the present embodiment.

FIG. 7 is a circuit diagram illustrating a second configuration example of a substrate bias control circuit according to the present embodiment.

The difference between the second configuration example in FIG. 7 and the first configuration example in FIG. 6 is in that a resistance element R24 for VBE correction is connected to between the base of the PNP transistor Q22 and the ground GND.

In the case of the first configuration example, it is apprehended that the substrate bias Vsub increases.

Accordingly, with the second configuration example, the output impedance Zo of the bias voltage generating circuit 20 is employed, and the load resistance element R24 is connected to the intermediate output Csub, thereby providing a circuit for decreasing the Vsub voltage.

In other words, with the second configuration example, a load circuit (device) equivalent to increase in voltage of the pre-driver is inserted into the input voltage terminal intermediate output Csub of the internal clamp device, thereby decreasing the voltage to return the substrate voltage Vsub serving as output thereof to the original setting value.

Figure 8:
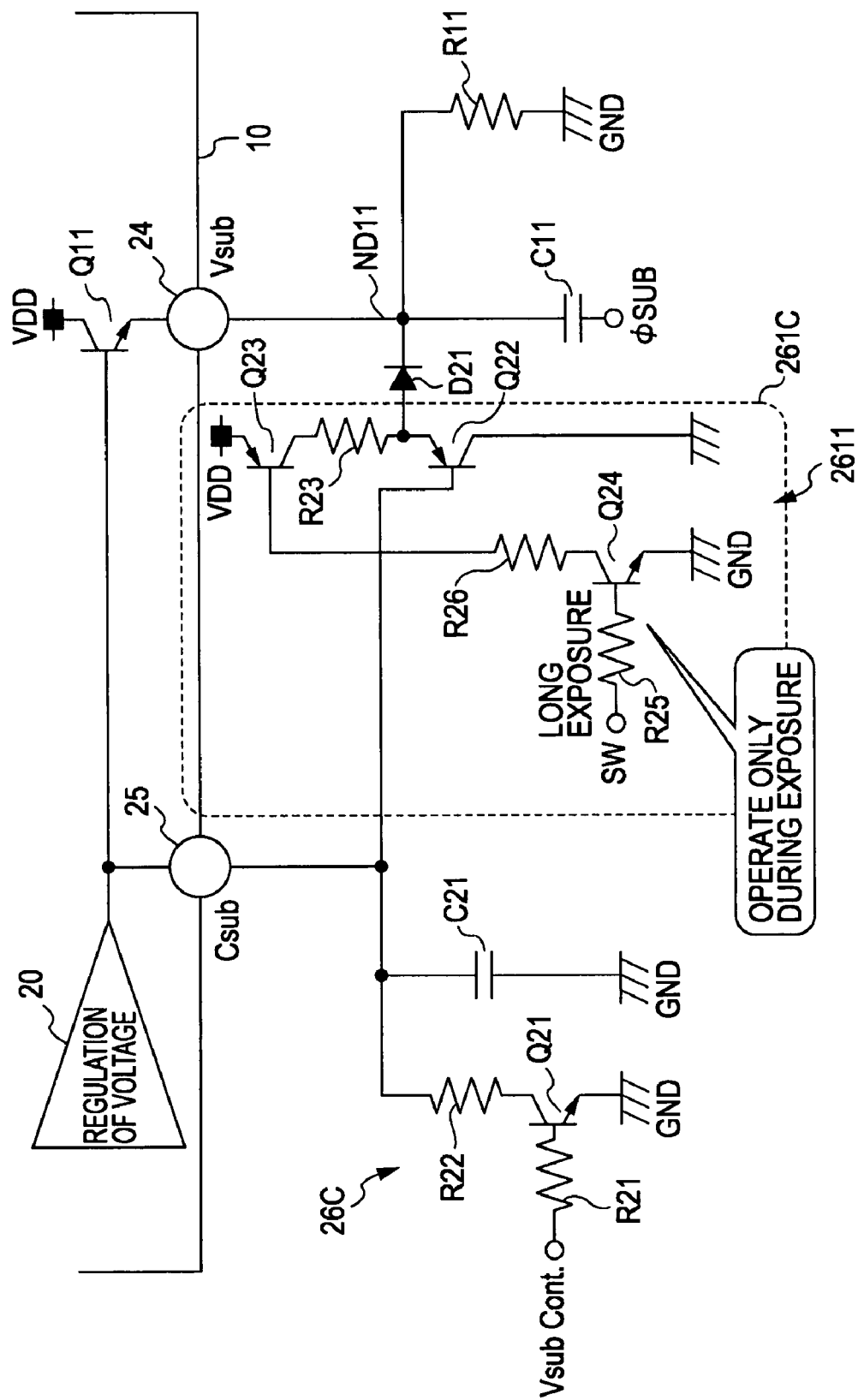
FIG. 8 is a circuit diagram illustrating a third configuration example of a substrate bias control circuit according to the present embodiment.

FIG. 8 is a circuit diagram illustrating a third configuration example of a substrate bias control circuit according to the present embodiment.

The difference between the third configuration example in FIG. 8 and the first configuration example in FIG. 6 is in that a PNP transistor Q23 serving as a switch is provided between the other end of the resistance element R23 and the power source potential VDD, and a control circuit 2611 is provided for turning on this transistor Q23 serving as a switch at the time of the long exposure mode alone to activate an electric-current reducing portion 261C.

The control circuit 2611 includes an NPN transistor Q24, and resistance elements R25 and R26.

The emitter of the transistor Q24 is connected to ground GND, the base thereof is connected to one end of the resistance element R25, the other end of the resistance element R25 is connected to the input terminal of a long exposure signal switch SW, and the collector of the transistor Q24 is connected to one end of the resistance element R26. The other end of the resistance element R26 is connected to the base of the transistor Q24.

Figure 9:
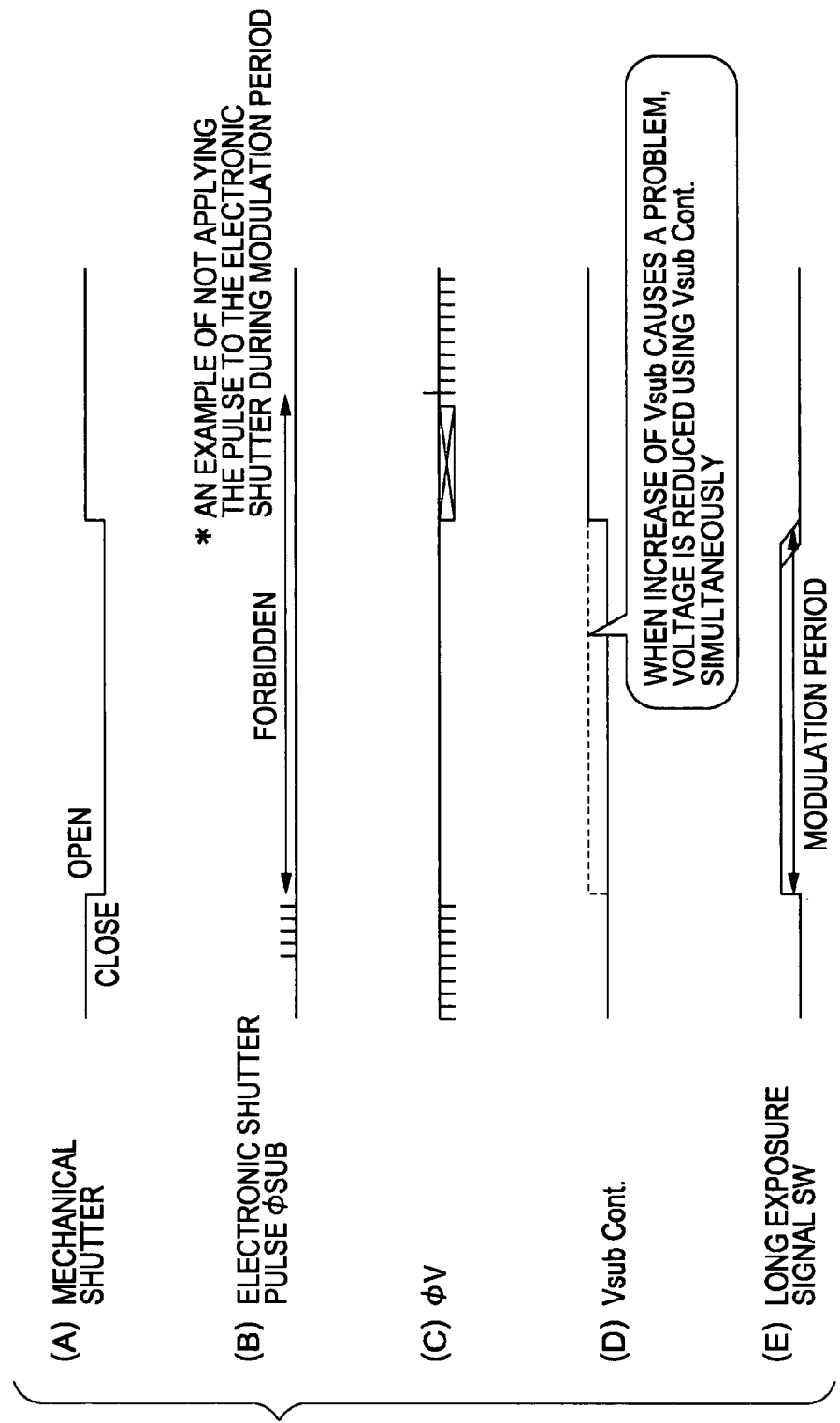
FIG. 9 is a timing chart of the circuit in FIG. 8.

FIG. 9 is the timing chart of the circuit in FIG. 7. In FIG. 9, (A) illustrates an operating state of a mechanical shutter, (B) illustrates the electronic shutter pulse ΦSUB, (C) illustrates a vertical transfer clock ΦV, and (E) illustrates the long exposure signal SW, respectively.

For example, in the event that there is concern regarding increase in consumption power, the third configuration example is employed such that an external circuit is activated during a long exposure period alone.

The NPN switch transistor Q24 is connected to the grounded portion of a PNP emitter follower serving as an external pre-driver, and further a level shifting circuit is also used at the same time so as to perform control in a logic level, thereby supplying timing for activating the external circuit during a mechanical shutter exposure period alone in sync with the switchover timing of the long exposure signal SW.

In other words, with the third configuration example, the switch is turned ON during a period wherein the substrate pulse is not applied including a long exposure period, thereby preventing an electric current from flowing into the built-in clamp transistor Q11.

With this third configuration example, the circuit scale somewhat increases, but there is no increase in electric power except for a long exposure period, and accordingly, battery life is not deteriorated.

Long exposure is performed in darkness in most cases, so there is low probability that increases in the Vsub due to the external circuit might cause a problem.

However, if there is the need to improve this, the technique according to the second configuration example is employed at the same time wherein a load resistance is inserted into the intermediate output Csub, or the originally existing substrate voltage control signal VsubCont for modulation of the Vsub is modulated at the same time as the long exposure signal SW, whereby the Vsub voltage can be maintained or decreased.

Figure 10:
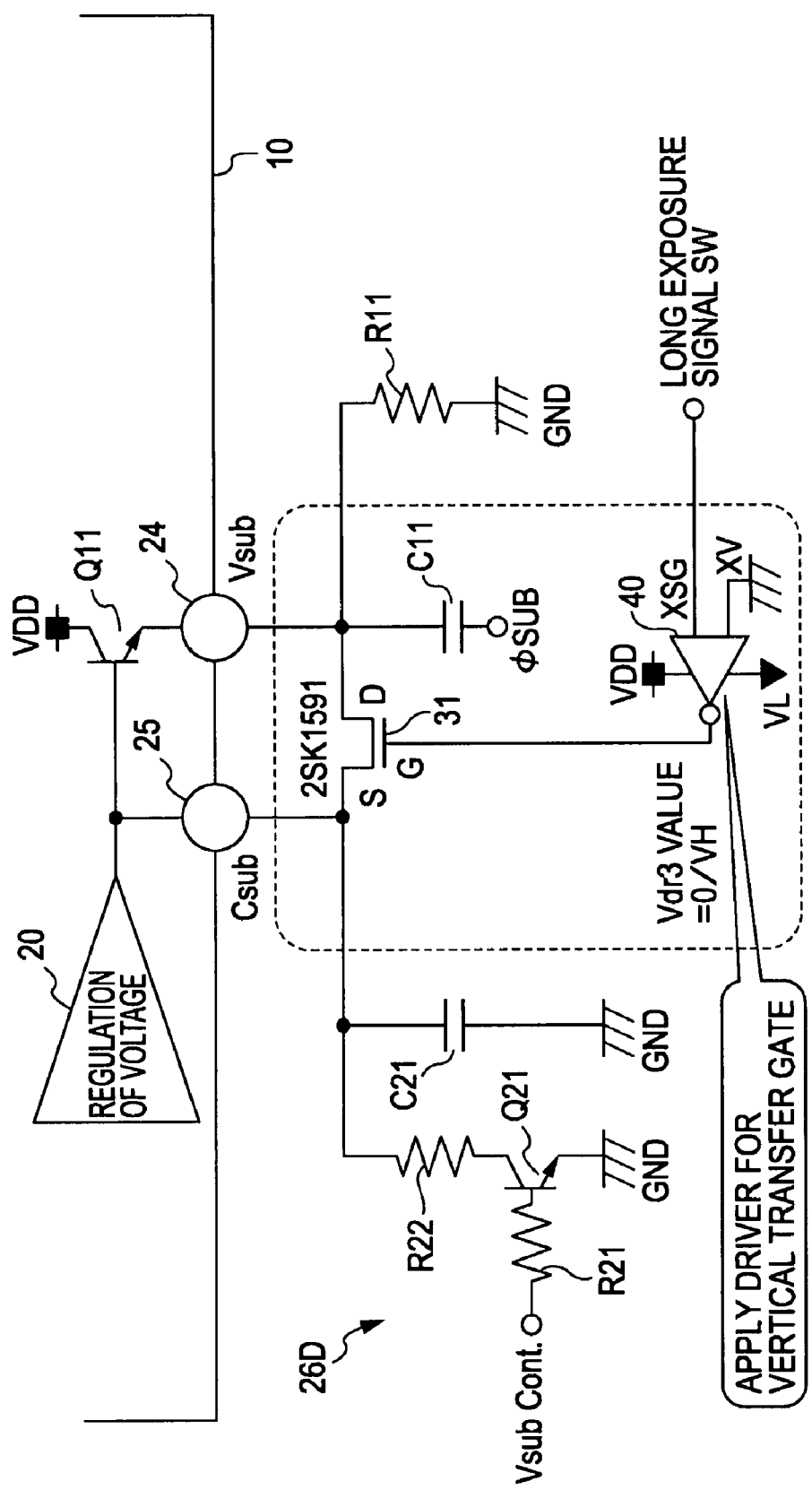
FIG. 10 is a circuit diagram illustrating a fourth configuration example of a substrate bias control circuit according to the present embodiment.

FIG. 10 is a circuit diagram illustrating a fourth configuration example of a substrate bias control circuit according to the present embodiment.

Figure 11:
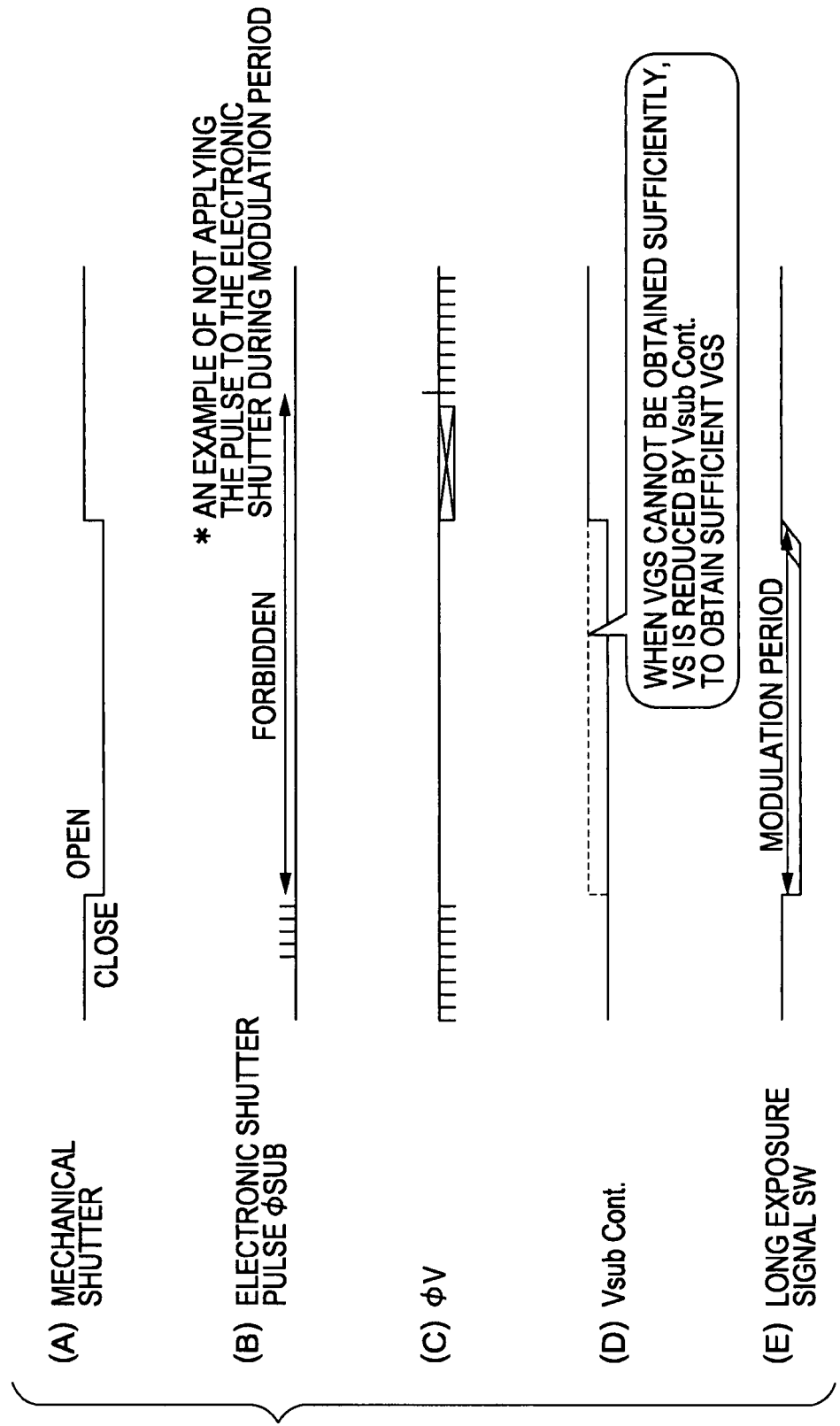
FIG. 11 is a timing chart of the circuit in FIG. 10.

FIG. 11 is the timing chart of the circuit in FIG. 10. In FIG. 11, (A) illustrates an operating state of a mechanical shutter, (B) illustrates the electronic shutter pulse ΦSUB, (C) illustrates a vertical transfer clock ΦV, and (E) illustrates the long exposure signal SW, respectively.

With the fourth configuration example, as for a method for improving both of a circuit scale and electric power consumption, a method employing a vertical CCD driving driver is employed.

The fourth configuration example is the same (however, polarity is inverted) as the third configuration example in that the long exposure signal SW is used, but employs a medium-compressive MOS-type switch element 31 for example to turn ON/OFF this using a large-amplitude clock instead of the external pre-driver and the external clamp diode.

In a case wherein with a vertical CCD driving driver 40, one channel originally remains, all that is necessary is to add the MOS switch element 31, and also all that is necessary is to turn on the MOS switch 31 even during a long exposure period, and accordingly, there is almost no increase in a direct-current power, which is low power.

However, it is necessary to ensure the threshold voltage Vgs (voltage between the gate and the source) of the MOS element 31, and in the event that the Vsub setting value is close to the power source voltage VDD, there is concern that the Vgs might be insufficient.

In this case, the substrate voltage control signal VsubCont is modulated at the same time as start of exposure, whereby the source voltage Vs can be decreased to gain the voltage Vgs.

Figure 12:
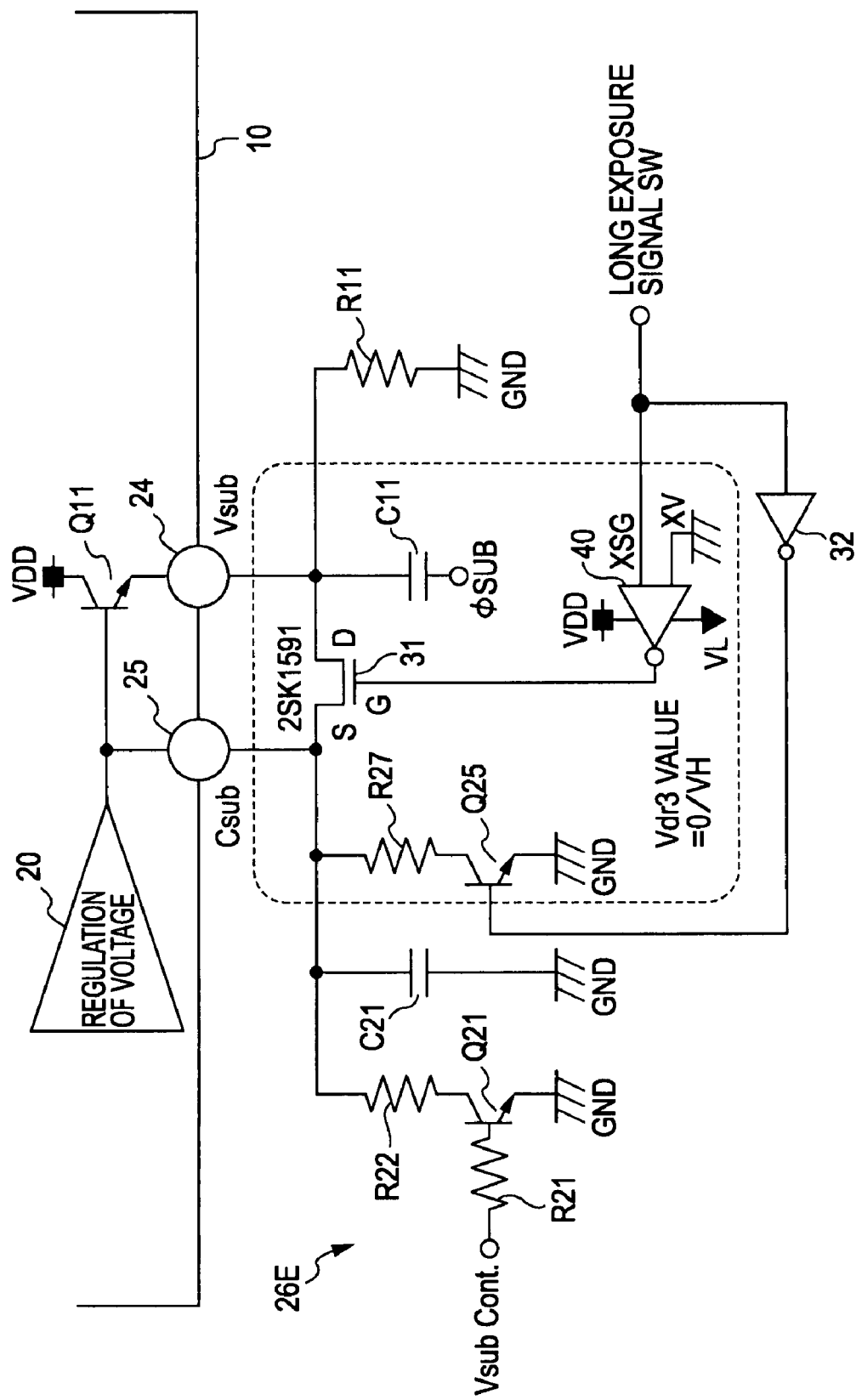
FIG. 12 is a circuit diagram illustrating a fifth configuration example of a substrate bias control circuit according to the present embodiment.

FIG. 12 is a circuit diagram illustrating a fifth configuration example of a substrate bias control circuit according to the present embodiment.

The difference between the fifth configuration example in FIG. 12 and the fourth configuration example in FIG. 10 is in that a resistance element R27 and an NPN switch transistor Q25 is provided between the source and ground GND of the MOS switch 31, a signal obtained by inverting the long exposure signal SW using an inverter 32 is supplied to the base of the transistor Q25.

In this case, the source voltage Vs is decreased at the same time as start of exposure, whereby the voltage Vgs can be gained.

As described above, a substrate bias control circuit such as shown in the first through fifth configuration examples is provided, whereby the following advantages can be obtained.

1. Hot carrier and luminescence at the time of long exposure can be completely prevented, which eliminates the necessity to capture a fixed pattern image in darkness, thereby improving response of a camera.

2. Along with improvement of response at a particularly long period, even in the event of perform the difference capturing of fixed patterns in darkness, the accuracy thereof can be improved to reduce remaining hot spot noise. The remaining noise is caused due to temperature drift occurring during a long period, and so forth.

3. Bulb shooting, images shot during an arbitrary exposure period (with difference correction disabled), and the like, can be improved.

Figure 13:
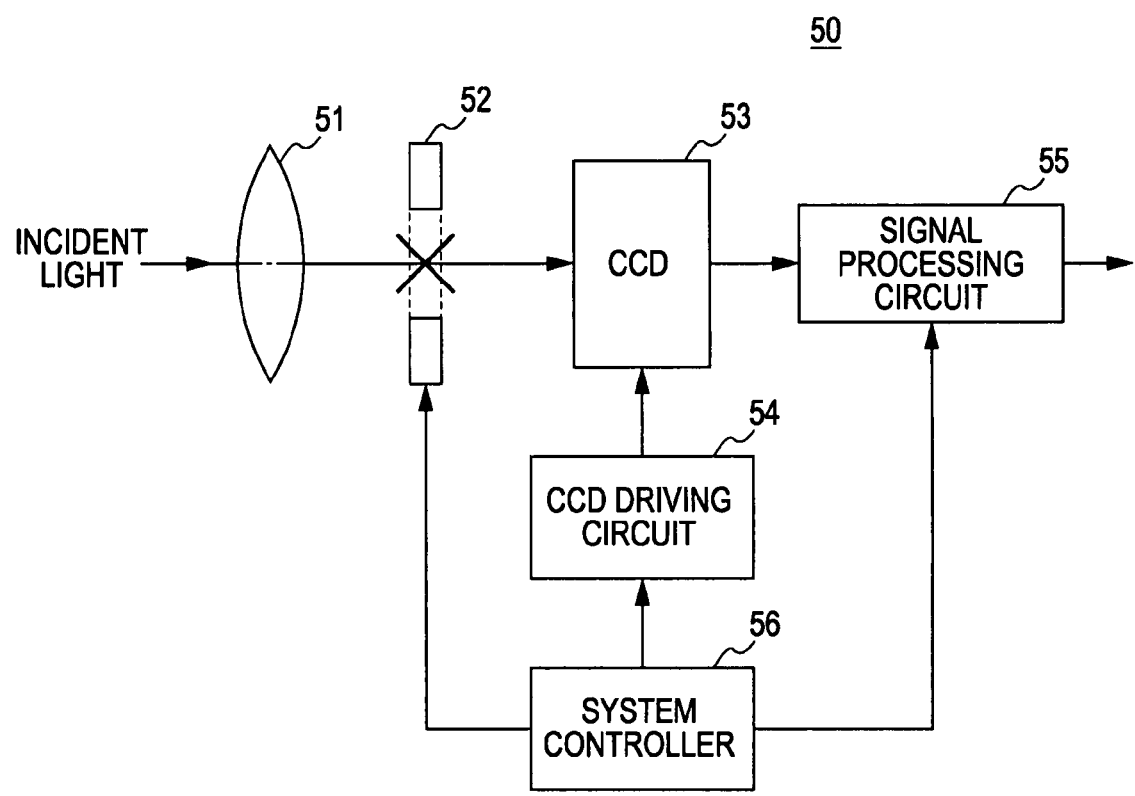
FIG. 13 is a schematic configuration diagram of a camera according to an embodiment of the present invention employing a solid-state image-capturing device according to the present embodiment as an image-capturing device.
Figure 14:
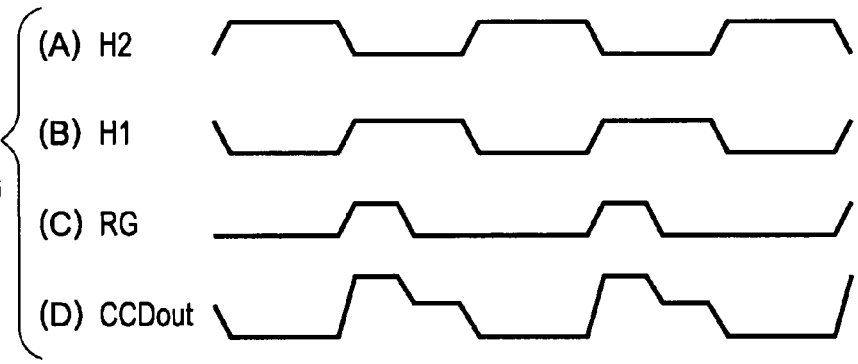
FIG. 14 is a diagram illustrating driving signal examples of two-phase driving.
Figure 15:
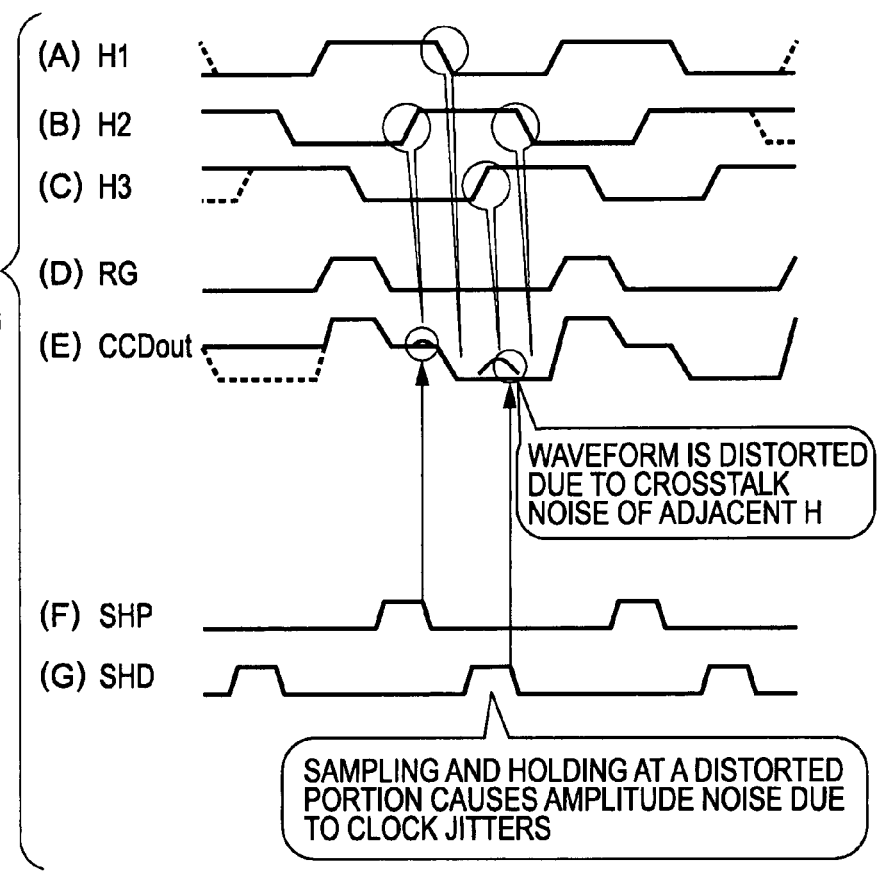
FIG. 15 is a diagram illustrating driving signal examples of three-phase driving.

FIG. 13 is a schematic configuration diagram of a camera according to an embodiment of the present invention employing a solid-state image-capturing device according to the present embodiment having the above configuration as an image-capturing device.

In the camera 50 in FIG. 13, light from a subject (not shown) enters an image-capturing area of a CCD solid-state apparatus 53 via the optical system such as a lens 51, and a mechanical shutter 52. The mechanical shutter 52 is for blocking entrance of light to the image-capturing area of the CCD solid-state image-capturing device, and determining an exposure period.

As for the CCD solid-state image-capturing device 53, the CCD solid-state image-capturing device according to the above present embodiment (FIG. 4) is employed.

This CCD solid-state image-capturing device 53 is driven by a CCD driving circuit 54 including the above timing generating circuit 19, driving system, and so forth.

The output signal of the CCD solid-state image-capturing device 53 is subjected to various types of signal processing such as automatic white balance adjustment or the like at a signal processing circuit 55 serving as the next stage, following which is led to the outside as an image-capturing signal. A system controller 56 performs opening/shutting control of the mechanical shutter 52, control of the CCD driving circuit 54, control of the signal processing circuit 55, and so forth.

With this camera: 50, first, upon the shutter (not shown) being depressed, a trigger pulse TRIG whose pulse width is several millisecond occurs in response to this, and several shutter pulses ΦSUB occur during the period thereof, and thus the signal charge of all of the sensor units 11 is swept out on the substrate 18. Subsequently, upon a certain exposure period elapsing, the mechanical shutter 52 is shut, and then, for example, the transition is made to an all-pixel readout period wherein the signal charge of all pixels are read out using frame readout.

With this all-pixel readout period, first of all, the electric charge within the vertical CCDs 13 is swept out by high-speed transfer driving of the vertical CCDs 13. Subsequently, in sync with the leading edge of a readout pulse XSG on the vertical transfer clock ΦV1, the signal charge of each pixel of the first field is read out. Following readout of the signal charge of the first field, the electric charge within the vertical CCDs 13 is swept out by high-speed transfer driving again, and subsequently, in sync with the leading edge of the readout pulse XSG on the vertical transfer clock ΦV3, the signal charge of each pixel of the second field is read out.

Subsequently, the mechanical shutter 52 is opened, and the transition is made to a high-speed image-capturing period. With this high-speed image-capturing period, various types of automatic control are performed, such as monitoring wherein an image being image-captured is reflected at a monitor, automatic iris control wherein exposure is adjusted by controlling the opening degree of the iris (not shown), automatic focus control wherein a focal point is adjusted by controlling the position in the optical axis direction of the lens 51, automatic white balance control wherein white balance is adjusted, and so forth.

Also, at the time of long exposure mode, the electric-reducing portion 261 of the substrate bias control circuit 26, in the event that the CCD-built-in clamp circuit 21 making up the substrate bias setting circuit 30 is, such as the present embodiment, an NPN transistor (or PN diode), control is made such that the difference between the intermediate output Csub of the Vsub, and the VF (voltage between the base and emitter) of the transistor Q11 is small.

Thus, the voltage between the base and emitter VBE wherein the PNP transistor Q22 is corrected, and the forward voltage Vf of the PN diode D21 are balanced, the intermediate output Csub voltage is almost agreed with the voltage of the substrate bias voltage Vsub, which prevents an electric current from flowing into the built-in clamp circuit 21, and also prevents hot spots from appearance.

The present camera employs the above solid-state image-capturing device including the substrate bias control circuit, so hot carrier and luminescence at the time of long exposure can be completely prevented, which eliminates the necessity to capture a fixed pattern image in darkness, thereby improving response of a camera.

Also, along with improvement of response at a particularly long period, even in the event of perform the difference capturing of fixed patterns in darkness, the accuracy thereof can be improved to reduce remaining hot spot noise.

Also, such as bulb shooting, images at the time of shooting during an arbitrary exposure period (difference correction is disabled) can be improved.

Figure 16:
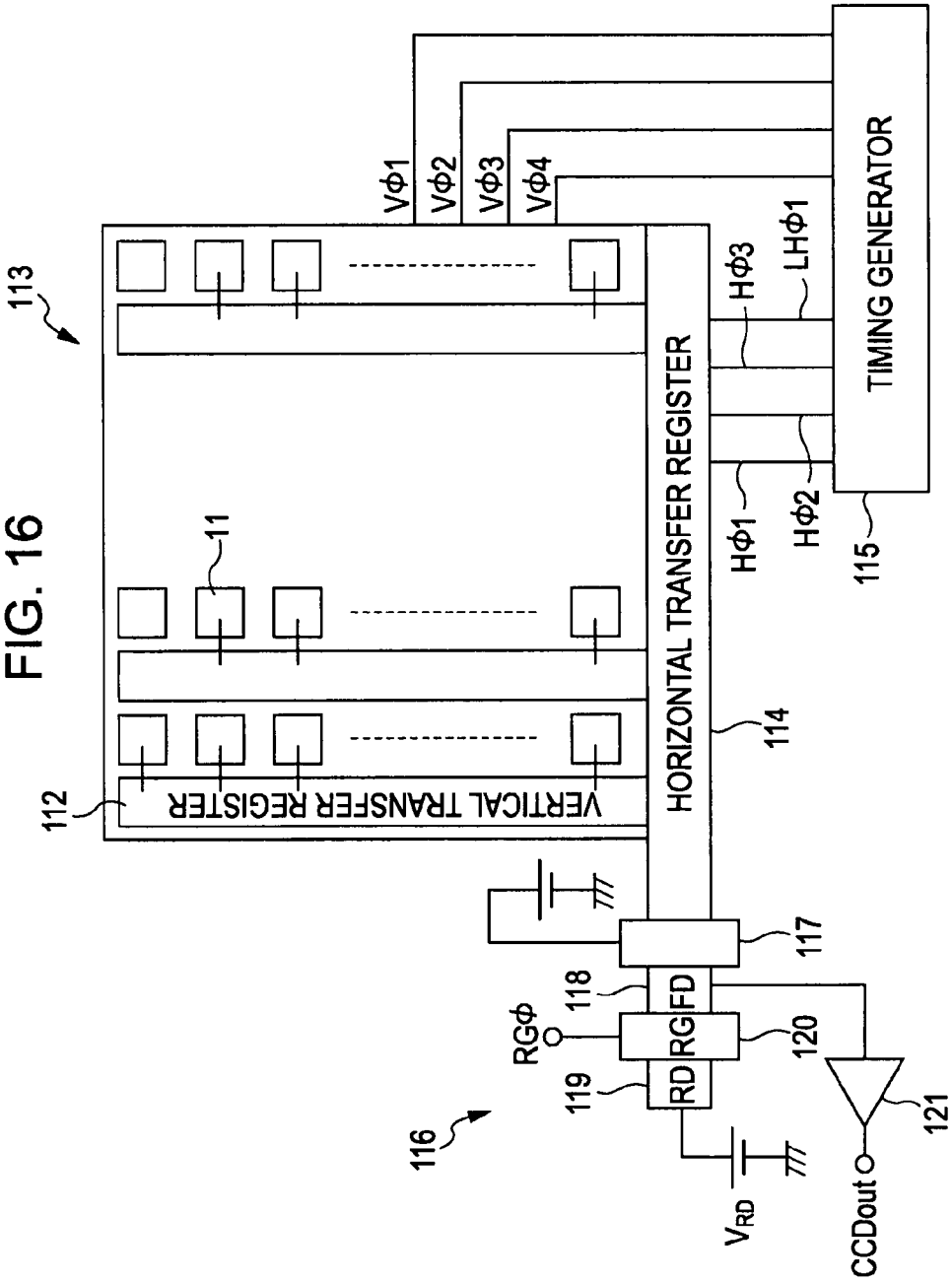
FIG. 16 is a diagram illustrating a configuration example of a solid-state image-capturing device according to an embodiment of the present invention.

FIG. 16 is a diagram illustrating a configuration example of a solid-state image-capturing device according to the present embodiment of the present invention.

A solid-state image-capturing device 10 according to the present embodiment is in the case of applying a CCD sensor according to an interline transfer method, for example.

The solid-state image-capturing device 10 in FIG. 16 is arrayed in a matrix shape in the line (vertical) direction and in the row (horizontal) direction. An image-capturing area 113 is made up of multiple sensor units (photoelectric conversion elements) 11 for converting incident light into signal charge of the electric charge amount corresponding to the light amount thereof, and storing the electric charge, and multiple vertical transfer registers 112, which are provided for each vertical row of these sensor units 11, for vertically transferring the signal charge read out from the respective sensor units 11 via readout gate portions (not shown).

With this image-capturing area 113, the sensor units 11 are, for example, made up of a photodiode of PN junction.

The vertical transfer registers 112 are transfer-driven with the four phases of vertical transfer pulses ΦV1 through ΦV4 for example, and sequentially transfers a portion equivalent to one scan line (one line) at a time of the signal charge read out from the respective sensor units 11 in the vertical direction at a part of a horizontal blanking period.

A horizontal transfer register 114 is disposed at the lower side of the image-capturing area 113 on the drawing. Signal charge equivalent to one line is sequentially transferred to this horizontal transfer register 114 from each of the multiple vertical transfer registers 112.

The horizontal transfer register 114 is transfer-driven with the three phases of horizontal transfer pulses (driving pulses) HΦ1, HΦ2, and HΦ3, and a last transfer pulse LHΦ1, and sequentially transfers the signal charge equivalent to one line transferred from the multiple vertical transfer registers 112 in the horizontal direction during a horizontal scan period following a horizontal blanking period.

The horizontal transfer pulses (driving pulses) HΦ1, HΦ2, and HΦ3, and a last transfer pulse LHΦ1 are driving pulses which assume a first level (low level in the present embodiment) and a second level (high level in the present embodiment).

Note that a three-phase driving method is shown here as one example, but the present invention can be applied to driving of multiple phases (four phases or the like) other than three phases.

As for the configuration of the horizontal transfer register 114, a three-phase driving configuration employed for the vertical transfer registers and so forth can be employed. The four phases of the vertical transfer pulses VΦ1 through VΦ4, the three phases of the horizontal transfer pulses HΦ1 through HΦ3, and the last transfer pulse LHΦ1 are generated by a timing generator 115 serving as a driving unit, for example.

The end portion of the transfer destination side of the horizontal transfer register 114 is provided with an electric-charge detection unit 116 having a floating diffusion amplifier configuration, for example.

This electric-charge detection unit 116 is made up of a floating diffusion (FD) 118 for storing the signal charge supplied from the horizontal transfer register 114 via a horizontal output gate portion 117, a reset drain (RD) 119 for discharging signal charge, and a reset gate (RG) 120 provided between the floating diffusion 118 and the reset drain 119.

With this electric-charge detection unit 116, a predetermined reset drain voltage VRD is applied to the reset drain 119, and a reset pulse RGΦ is applied to the reset gate 120 using the detection cycle of signal charge.

Subsequently, the signal charge stored in the floating diffusion 118 is converted into a signal voltage, and is led to, for example, an unshown CDS (Correlation Double Sampling) circuit as a CCD output signal CCDout via an output circuit 121.

Description will be made below in detail regarding the horizontal transfer driving system of an electric-charge transfer device according to the present embodiment made up of the horizontal transfer register 114, reset gate 120, and so forth.

Figure 17:
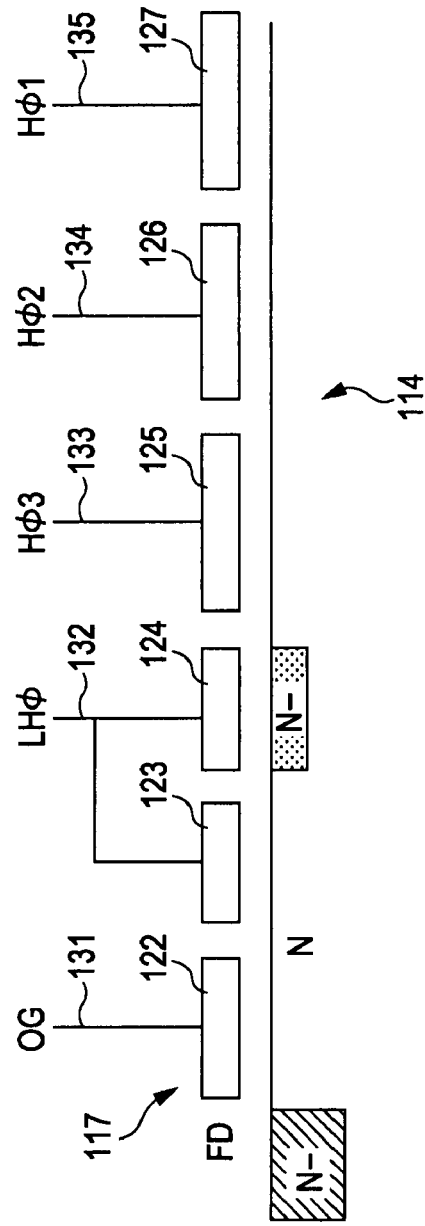
FIG. 17 is a simplified cross-sectional view illustrating a pulse supply state to a transfer electrode of a three-phase driving method according to the present embodiment.

FIG. 17 is a simplified cross-sectional view illustrating a pulse supply state to a transfer electrode of a three-phase driving method according to the present embodiment.

Figure 18:
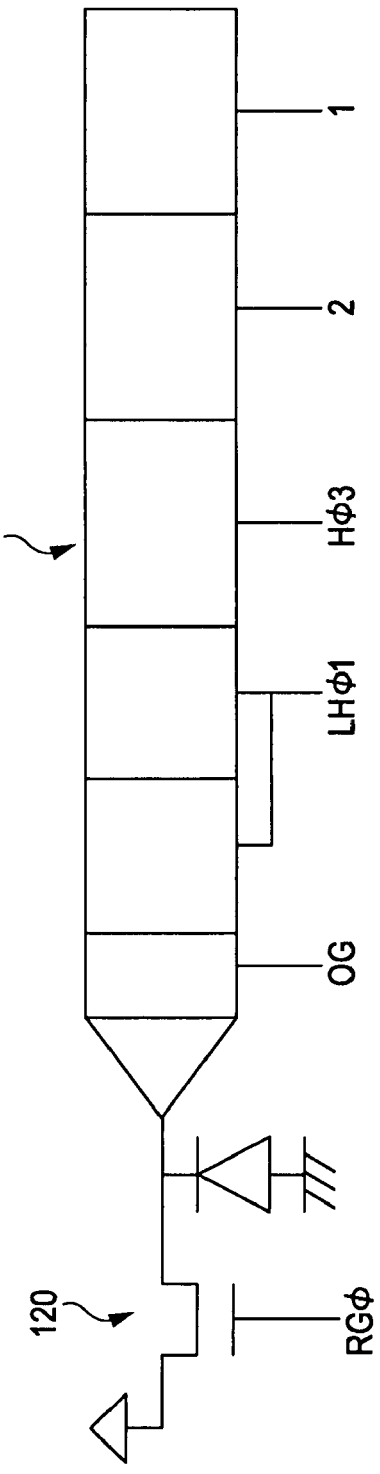
FIG. 18 is a diagram illustrating an equivalent circuit of a horizontal transfer driving system according to the present embodiment.

FIG. 18 is a diagram illustrating an equivalent circuit of the horizontal transfer driving system according to the present embodiment.

Figure 19:
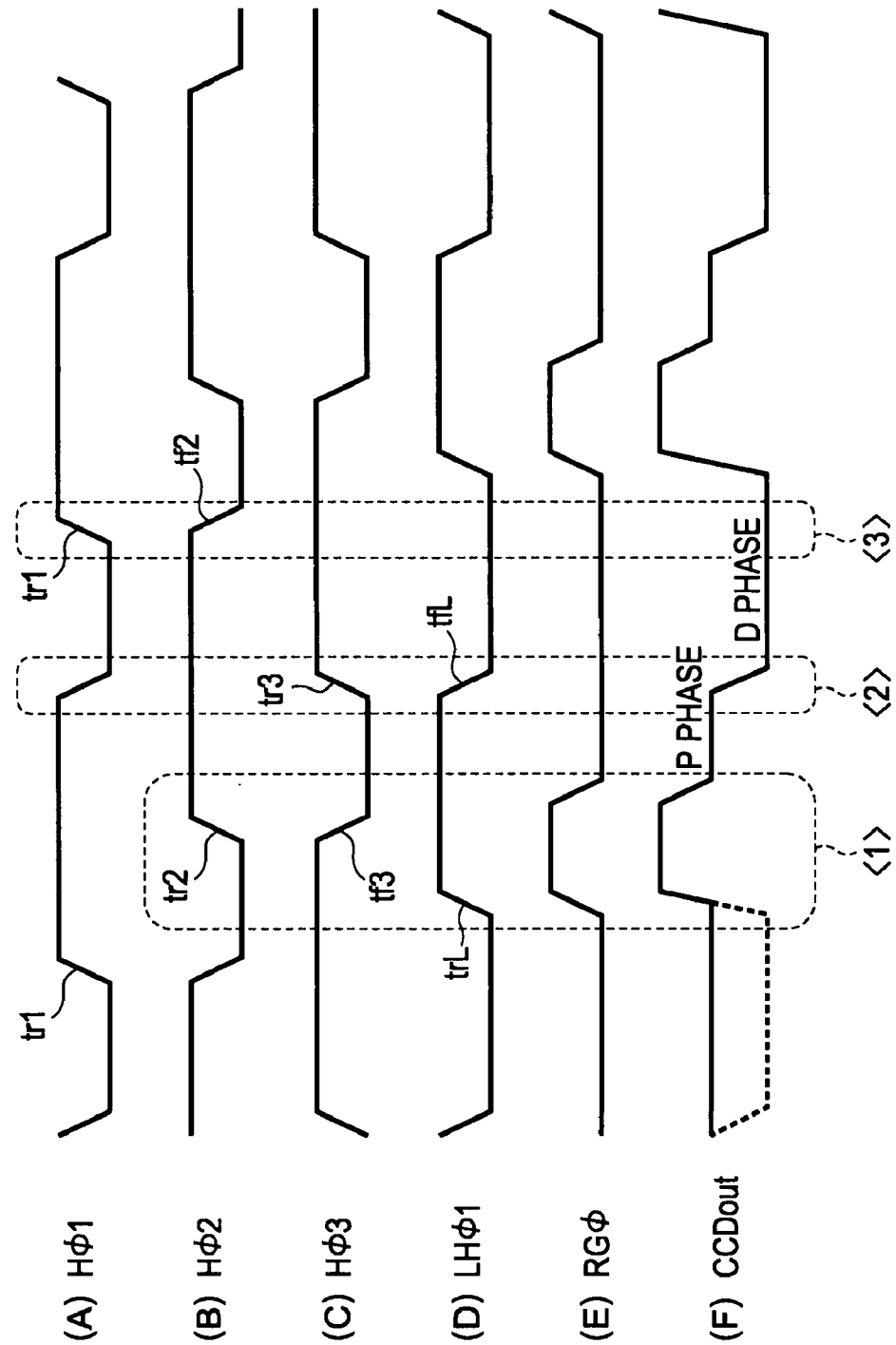
FIG. 19 is a diagram illustrating the timing relation of the respective pulses of a horizontal transfer driving system according to the present embodiment.

FIG. 19 is a diagram illustrating the timing relation of the respective pulses of the horizontal transfer driving system according to the present embodiment. In FIG. 19, (A) illustrates the horizontal transfer pulse HΦ1 (first phase transfer pulse), (B) illustrates the horizontal transfer pulse HΦ2 (second phase transfer pulse), (C) illustrates the horizontal transfer pulse HΦ3 (third phase transfer pulse), (D) illustrates the last transfer pulse LHΦ1, (E) illustrates the reset pulse RGΦ1, and (F) illustrates the output signal CCDout, respectively.

With the present embodiment, as illustrated in FIG. 17 and FIG. 18, transfer electrodes 123 through 127 are arrayed in order from the gate electrode 122 of the horizontal output gate portion 117.

The gate electrode 122 is connected to an output gate pulse OG supply line 131, the transfer electrodes 123 and 124 are commonly connected to a last transfer pulse LHΦ1 supply line (supply wiring) 132, the transfer electrode 125 is connected to a horizontal transfer pulse HΦ3 supply line (supply wiring) 133, the transfer electrode 126 is connected to a horizontal transfer pulse HΦ2 supply line (supply wiring) 134, and the transfer electrode 127 is connected to a horizontal transfer pulse HΦ1 supply line (supply wiring) 135.

With the electric-charge transfer device according to the present embodiment, a three-phase (or multi-phase driving not less than thereof) driving method is employed wherein there is only one phase for each low-level period, and the low voltage thereof is output in order in the transfer direction.

With the present embodiment, as illustrated in FIG. 19 with (A) through (C), the horizontal transfer pulses HΦ2 and HΦ3 are retained at a high level during a period wherein the horizontal transfer pulse HΦ1 is a low level. Similarly, the horizontal transfer pulses HΦ1 and HΦ3 are retained at a high level during a period wherein the horizontal transfer pulse HΦ2 is a low level. Also, the horizontal transfer pulses HΦ1 and HΦ2 are retained at a high level during a period wherein the horizontal transfer pulse HΦ3 is a low level.

In other words, with the three-phase driving, a horizontal transfer pulse to be set to a low level is only one. Such a configuration has been employed for the following reason.

With common multi-phase driving, according to operations of transfer and storage, in a state at least one gate is low, the state of another gate is changed for transfer, and accordingly, there is a period wherein two gates are low. With such multi-phase successive driving, transition portions increase, so driving of a horizontal CCD for performing sampling of signals includes a crosstalk noise problem.

Therefore, according to the present embodiment, with the multi-phase driving, transition portions are overlapped such that there is only one phase for each period wherein a horizontal transfer pulse is a low level.

According to such a configuration, the number of transitions is reduced, and driving timing is employed wherein there is no transition at a signal sampling portion, thereby avoiding crosstalk noise, and multiple gates can be changed into a high level, whereby handling electric charge can be improved.

At that time, the output of a gate whose voltage goes to a low level is made in order in the transfer direction, whereby CCD transfer driving can be performed.

Also, with the present embodiment, as illustrated in FIG. 17, the transfer electrodes (gates) 123 and 124 at the last stage of horizontal transfer is connected to the independent wiring 132, and also as illustrated in (D) in FIG. 19, the duty ratio of the last transfer pulse LHΦ1 to be applied to the transfer electrode (gate) at the last stage is set to 50%.

As described above, with the present embodiment, transition portions are overlapped such that there is only one phase for each period wherein a horizontal transfer pulse is a low level, but in this case, if this low level period becomes narrower, there is concern that transfer efficiency at the last stage gate might deteriorate due to narrowing down as to floating diffusion, with only an insufficient transfer period being secured, and consequently increase in speed being disturbed.

Therefore, in the event of demanding increase in speed, only the last stage gate is separated from other gates, and the last transfer pulse to be applied to this gate is set to 50:50 duty, whereby transfer time as to floating diffusion FD can be secured.

Note that an arrangement may be used at the same time wherein this last stage gate is configured of a storage transfer configuration, whereby a back current stream can be prevented even if the previous stage gate thereof goes to a high level early.

Thus, in the event that it is necessary to secure the transfer efficiency at the last stage and the handling electric charge amount as much as possible, only the last transfer pulse LHΦ1 at the last stage is increased in amplitude, and the horizontal transfer pulses HΦ1 through HΦ3 which are applied to the transfer stage are kept in low amplitude (with multi-phases, originally handling electric charge is great), whereby a low-power high-dynamic-range horizontal register can be provided, and pixel addition at the time of the moving image or high sensitivity mode of DSC can be readily handled. The last stage gate has a small area, so even if amplitude is increased, power consumption is small, and also the influence as to increase in speed is small.

With the present embodiment, the driving amplitudes of the horizontal transfer pulses HΦ1 through HΦ3 which are applied to the transfer stage are set to be smaller than the driving amplitude of the last transfer pulse LHΦ1 at the last stage.

For example, the reset pulse RGΦ1 and the last transfer pulse LHΦ1 are set to 3.3 V or so, and the horizontal transfer pulses HΦ1 through HΦ3 which are applied to the transfer stage are set to 1.9 V or so.

Further, with the present embodiment, as illustrated in the period within the dashed line shown in <1> in FIG. 19 in (A) through (F), an arrangement is made wherein the leading edge trL of the last transfer pulse LHΦ1 which is applied to the last stage gate is set to be slower than the leading edge trl of the horizontal transfer pulse HΦ1 which is applied to the transfer stage, and the transition portion of the leading edge tr2 of the horizontal transfer pulse HΦ2 facing the trailing edge tf3 of the horizontal transfer pulse HΦ3 which is applied to one stage gate ahead of the last transfer pulse LHΦ1 which is applied to the last stage gate is overlapped into the reset pulse RGΦ, thereby avoiding crosstalk noise during a P-phase sampling period.

Further, with the present embodiment, as illustrated in the period within the dashed line shown in <2> in FIG. 19, at the trailing edge tfL portion of the last transfer pulse LHΦ1 which is applied to the last stage gate, the trailing edge tf1 of the horizontal transfer pulse HΦ1 which is applied to the transfer stage, and the leading edge tr3 of the horizontal transfer pulse HΦ3 which is applied to one stage gate ahead of the last transfer pulse LHΦ1 which is applied to the last stage gate are made transition, thereby avoiding crosstalk noise as to data phase (D phase).

Further, with the present embodiment, as illustrated in the period within the dashed line shown in <3> in FIG. 19, regarding the horizontal transfer pulses HΦ1 through HΦ3 which are applied to the transfer stage which makes transition at the D-phase sampling point, the cancel effect due to complementary properties thereof is employed, thereby reducing crosstalk noise.

With the example illustrated in <3> in FIG. 19, the rising transition of the leading edge tr1 of the horizontal transfer pulse HΦ1, and the rising transition of the trailing edge tf2 of the horizontal transfer pulse HΦ2 are performed in a complementary manner (simultaneously in parallel).

Thus, the noise occurring at the time of the rising transition of the leading edge tr1 of the horizontal transfer pulse HΦ1, and the noise occurring at the time of the rising transition of the leading edge tf2 of the horizontal transfer pulse HΦ2 are cancelled out, thereby reducing crosstalk noise.

Figure 20:
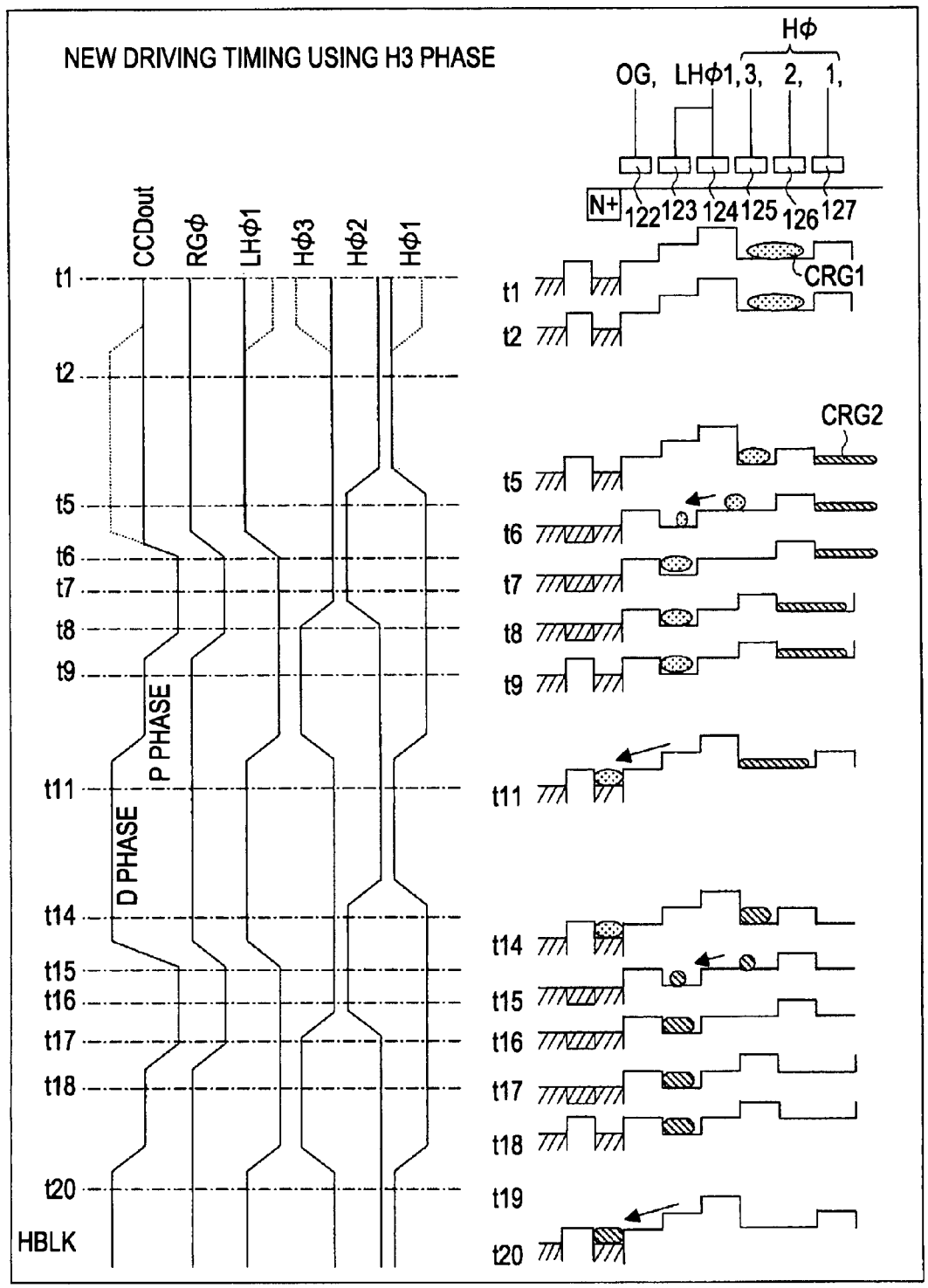
FIG. 20 is a diagram illustrating the driving timing of a three-phase driving method according to the present embodiment, and a potential transitive state corresponding thereto.

FIG. 20 is a diagram illustrating the driving timing of the three-phase driving method according to the present embodiment, and a potential transitive state corresponding thereto.

Description will be made regarding the operations of the horizontal transfer driving system to which the three-phase driving method according to the present embodiment with reference to FIG. 20.

With point-in-time t1 and t2, the low-level horizontal transfer pulse HΦ1 is applied to the transfer electrode 127, the high-level horizontal transfer pulse HΦ2 is applied to the transfer electrode 126, the high-level horizontal transfer pulse HΦ3 is applied to the transfer electrode 125, and the low-level last transfer pulse LHΦ1 is applied to the transfer electrodes 123 and 124 at the last stage. At this time, the reset pulse RGΦ is set to a low level.

At this time, signal charge CRG1 to be transferred is stored in the regions corresponding to the forming positions of the transfer electrodes 125 and 126.

With point-in-time t5, the horizontal transfer pulse HΦ1 which is applied to the transfer electrode 127 makes transition from a low level to a high level, and in parallel therewith, the horizontal transfer pulse HΦ2 which is applied to the transfer electrode 126 makes transition from a high level to a low level, the horizontal transfer pulse HΦ3 which is applied to the transfer electrode 125 is kept at a high level, and the last transfer pulse LHΦ1 which is applied to the last stage electrodes 123 and 124 is kept at a low level. At this time, the reset pulse RGΦ is kept at a low level.

At this time, the signal charge CRG1 to be transferred is stored in only the region corresponding to the forming position of the transfer electrode 125, and signal charge CRG2 to be transferred next is stored in only the region corresponding to the forming position of the transfer electrode 127.

With point-in-time t6, the horizontal transfer pulse HΦ1 which is applied to the transfer electrode 127 is kept at a high level, the horizontal transfer pulse HΦ2 which is applied to the transfer electrode 126 is kept at a low level, the horizontal transfer pulse HΦ3 which is applied to the transfer electrode 125 is kept at a high level, and the last transfer pulse LHΦ1 which is applied to the last stage electrodes 123 and 124 makes transition from a low level to a high level. At this time, the reset pulse RGΦ makes transition from a low level to a high level. Subsequently, the output CCDout is made transition to a level higher than the level of the P phase.

At this time, the signal charge CRG1 to be transferred is started to be transferred to the region corresponding to the forming position of the last stage electrode 123 from the region corresponding to the forming position of the transfer electrode 125. Also, the signal charge CRG2 to be transferred next is stored in the region corresponding to the forming position of the transfer electrode 127.

With point-in-time t7, the horizontal transfer pulse HΦ1 which is applied to the transfer electrode 127 is kept at a high level, the horizontal transfer pulse HΦ2 which is applied to the transfer electrode 126 is kept at a low level, the horizontal transfer pulse HΦ3 which is applied to the transfer electrode 125 is kept at a high level, and the last transfer pulse LHΦ1 which is applied to the last stage electrodes 123 and 124 is kept at a high level. At this time, the reset pulse RGΦ is kept at a high level, and the output CCDout is kept in a level higher than the level of the P phase.

At this time, the signal charge CRG1 to be transferred is transferred and stored to the region corresponding to the forming position of the last stage electrode 123 from the region corresponding to the forming position of the transfer electrode 125. Also, the signal charge CRG2 to be transferred next is stored in the region corresponding to the forming position of the transfer electrode 127.

With point-in-time t8, the horizontal transfer pulse HΦ1 which is applied to the transfer electrode 127 is kept at a high level, the horizontal transfer pulse HΦ2 which is applied to the transfer electrode 126 makes transition from a low level to a high level, and in parallel therewith, the horizontal transfer pulse HΦ3 which is applied to the transfer electrode 125 makes transition from a low level to a high level, and the last transfer pulse LHΦ1 which is applied to the last stage electrodes 123 and 124 is kept at a high level. At this time, the reset pulse RGΦ is kept at a high level, and the output CCDout is kept in a level higher than the level of the P phase.

At this time, the signal charge CRG1 to be transferred is transferred and stored to the region corresponding to the forming position of the last stage electrode 123. Also, the signal charge CRG2 to be transferred next is stored in the regions corresponding to the forming positions of the transfer electrodes 127 and 126.

With point-in-time t9, the horizontal transfer pulse HΦ1 which is applied to the transfer electrode 127 is kept at a high level, the horizontal transfer pulse HΦ2 which is applied to the transfer electrode 126 is kept at a high level, the horizontal transfer pulse HΦ3 which is applied to the transfer electrode 125 is kept at a low level, and the last transfer pulse LHΦ1 which is applied to the last stage electrodes 123 and 124 is kept at a high level. At this time, the reset pulse RGΦ makes transition from a high level to a low level, and the output CCDout is made transition to the level of the P phase.

At this time, the signal charge CRG1 to be transferred is transferred and stored to the region corresponding to the forming position of the last stage electrode 123. Also, the signal charge CRG2 to be transferred next is stored in the regions corresponding to the forming positions of the transfer electrodes 127 and 126.

With point-in-time t11, the horizontal transfer pulse HΦ1 which is applied to the transfer electrode 127 makes transition from a high level to a low level, the horizontal transfer pulse HΦ2 which is applied to the transfer electrode 126 is kept at a high level, the horizontal transfer pulse HΦ3 which is applied to the transfer electrode 125 makes transition from a low level to a high level in parallel with the transition of the horizontal pulse HΦ1 to a low level, and in parallel with this, the last transfer pulse LHΦ1 which is applied to the last stage electrodes 123 and 124 makes transition from a high level to a low level. At this time, the reset pulse RGΦ is kept at a low level, and the output CCDout makes transition from the level of the P phase to the level of the D phase.

At this time, the signal charge CRG1 to be transferred is transferred and stored to the region corresponding to a position exceeding the electrode 122 serving as the output gate. Also, the signal charge CRG2 to be transferred next is stored in the regions corresponding to the forming positions of the transfer electrodes 126 and 125.

Further, with point-in-time t14, the horizontal transfer pulse HΦ1 which is applied to the transfer electrode 127 makes transition from a low level to a high level, in parallel with this, the horizontal transfer pulse HΦ2 which is applied to the transfer electrode 126 makes transition from a high level to a low level, the horizontal transfer pulse HΦ3 which is applied to the transfer electrode 125 is kept at a high level without change, the last transfer pulse LHΦ1 which is applied to the last stage electrodes 123 and 124 is kept at a low level. At this time, the reset pulse RGΦ is kept at a low level, and the output CCDout is kept in the level of the D phase.

At this time, the signal charge CRG1 to be transferred is transferred and stored to the region corresponding to a position exceeding the electrode 122 serving as the output gate. Also, the signal charge CRG2 to be transferred next is stored in the region corresponding to the forming position of the transfer electrode 125.

With point-in-time t15, the horizontal transfer pulse HΦ1 which is applied to the transfer electrode 127 is kept at a high level, the horizontal transfer pulse HΦ2 which is applied to the transfer electrode 126 is kept at a low level, the horizontal transfer pulse HΦ3 which is applied to the transfer electrode 125 is kept at a high level without change, and the last transfer pulse LHΦ1 which is applied to the last stage electrodes 123 and 124 makes transition from a low level to a high level. At this time, the reset pulse RGΦ makes transition from a low level to a high level, and the output CCDout makes transition from the level of the D phase to a level higher than the level of the P phase.

At this time, the signal charge CRG2 to be transferred is started to be transferred to the region corresponding to the forming position of the last stage electrode 123 from the region corresponding to the forming position of the transfer electrode 125. Next, the previous signal charge CRG1 is transferred to the CDS circuit serving as the next stage.

With point-in-time t16, the horizontal transfer pulse HΦ1 which is applied to the transfer electrode 127 is kept at a high level, the horizontal transfer pulse HΦ2 which is applied to the transfer electrode 126 is kept at a low level, the horizontal transfer pulse HΦ3 which is applied to the transfer electrode 125 is kept at a high level without change, and the last transfer pulse LHΦ1 which is applied to the last stage electrodes 123 and 124 is kept at a high level. At this time, the reset pulse RGΦ is kept at a high level, and the output CCDout is kept in a level higher than the level of the P phase.

At this time, the signal charge CRG2 to be transferred is transferred and stored to the region corresponding to the forming position of the last stage electrode 123 from the region corresponding to the forming position of the transfer electrode 125.

With point-in-time t17, the horizontal transfer pulse HΦ1 which is applied to the transfer electrode 127 is kept at a high level, the horizontal transfer pulse HΦ2 which is applied to the transfer electrode 126 makes transition from a low level to a high level, in parallel with this, the horizontal transfer pulse HΦ3 which is applied to the transfer electrode 125 makes transition from a high level to a low level, and the last transfer pulse LHΦ1 which is applied to the last stage electrodes 123 and 124 is kept at a high level. At this time, the reset pulse RGΦ is kept at a high level, and the output CCDout is kept in a level higher than the level of the P phase.

At this time, the signal charge CRG2 to be transferred is transferred and stored to the region corresponding to the forming position of the last stage electrode 123.

With point-in-time t18, the horizontal transfer pulse HΦ1 which is applied to the transfer electrode 127 is kept at a high level, the horizontal transfer pulse HΦ2 which is applied to the transfer electrode 126 is kept at a high level, the horizontal transfer pulse HΦ3 which is applied to the transfer electrode 125 is kept at a low level, and the last transfer pulse LHΦ1 which is applied to the last stage electrodes 123 and 124 is kept at a high level. At this time, the reset pulse RGΦ makes transition from a high level to a low level, and the output CCDout is made transition to the level of the P phase.

At this time, the signal charge CRG2 to be transferred is transferred and stored to the region corresponding to the forming position of the last stage electrode 123.

Subsequently, with point-in-time t20, the horizontal transfer pulse HΦ1 which is applied to the transfer electrode 127 makes transition from a high level to a low level, the horizontal transfer pulse HΦ2 which is applied to the transfer electrode 126 is kept at a high level, the horizontal transfer pulse HΦ3 which is applied to the transfer electrode 125 makes transition from a low level to a high level in parallel with the transition to a low level of the horizontal transfer pulse HΦ1, and in parallel with this, the last transfer pulse LHΦ1 which is applied to the last stage electrodes 123 and 124 makes transition from a high level to a low level. At this time, the reset pulse RGΦ is kept at a low level, and the output CCDout makes transition from the level of the P phase to the level of the D phase.

At this time, the signal charge CRG2 to be transferred is transferred and stored to the region corresponding to a position exceeding the electrode 122 serving as the output gate.

Note that description has been made here regarding the three-phase driving method as one example, but the present invention can be applied to multiple phases other than three phases, e.g., a four-phase driving method.

Figure 21:
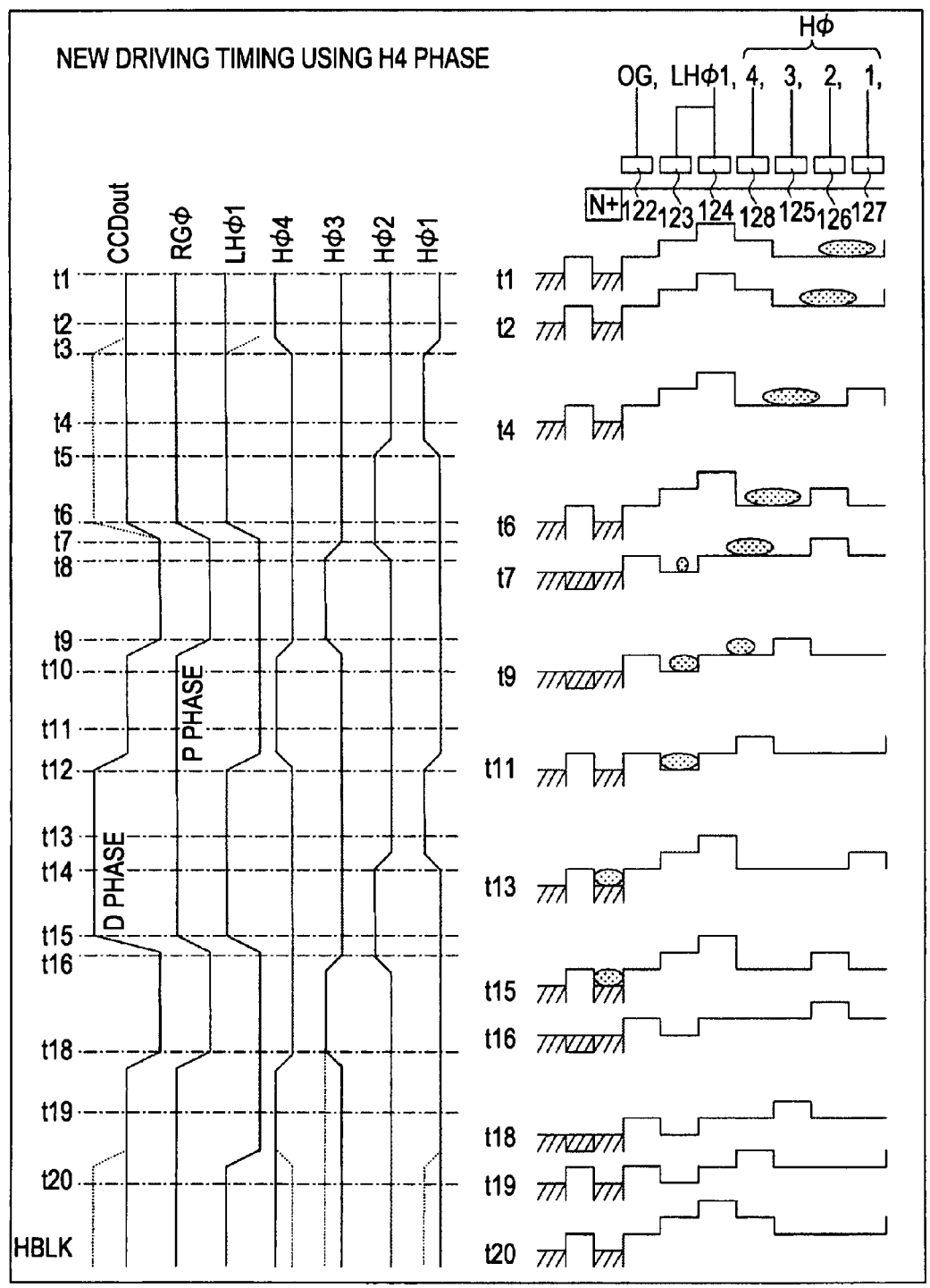
FIG. 21 is a diagram illustrating the driving timing of a four-phase driving method according to the present embodiment, and a potential transitive state corresponding thereto.

FIG. 21 is a diagram illustrating the driving timing of a four-phase driving method according to the present embodiment, and a potential transitive state corresponding thereto.

Description will be made below the operations of a horizontal transfer driving system to which the four-phase driving method according to the present embodiment with reference to FIG. 21.

Note that with the horizontal transfer pulses of the transfer stages of the four-phase driving method, in addition to the horizontal transfer pulses HΦ1 through HΦ3, a horizontal transfer pulse HΦ4 is employed, and a transfer electrode 128 to which the horizontal transfer pulse HΦ4 is applied is formed between the transfer trade 124 and the transfer trade 125.

In this case as well, with the horizontal transfer pulses of the transfer stages, of the horizontal transfer pulses HΦ1 through HΦ4, only one horizontal transfer pulse can be set to a low level during a predetermined period.

With point-in-time t1 and t2, the high-level horizontal transfer pulse HΦ1 is applied to the transfer electrode 127, the high-level horizontal transfer pulse HΦ2 is applied to the transfer electrode 126, the high-level horizontal transfer pulse HΦ3 is applied to the transfer electrode 125, the low-level horizontal transfer pulse HΦ4 is applied to the transfer electrode 128, and the low-level last transfer pulse LHΦ1 is applied to the last stage electrodes 123 and 124. At this time, the reset pulse RGΦ is set to a low level.

At this time, signal charge CRG11 to be transferred is stored to the regions corresponding to the forming positions of the transfer electrodes 125, 126, and 127.

With point-in-time t3, the horizontal transfer pulse HΦ1 which is applied to the transfer electrode 127 makes transition from a high level to a low level, the horizontal transfer pulse HΦ2 which is applied to the transfer electrode 126 is kept at a high level, the horizontal transfer pulse HΦ3 which is applied to the transfer electrode 125 is kept at a high level, the horizontal transfer pulse HΦ4 which is applied to the transfer electrode 128 makes transition from a low level to a high level in parallel with the transition to a low level of the horizontal transfer pulse HΦ1 which is applied to the transfer electrode 127, and the last transfer pulse LHΦ1 which is applied to the last stage electrodes 123 and 124 is kept at a low level. At this time, the reset pulse RGΦ is kept at a low level.

Subsequently, with point-in-time t4, the horizontal transfer pulse HΦ1 which is applied to the transfer electrode 127 is kept at a low level, the horizontal transfer pulse HΦ2 which is applied to the transfer electrode 126 is kept at a high level, the horizontal transfer pulse HΦ3 which is applied to the transfer electrode 125 is kept at a high level, the horizontal transfer pulse HΦ4 which is applied to the transfer electrode 128 is kept at a high level, and the last transfer pulse LHΦ1 which is applied to the last stage electrodes 123 and 124 is kept at a low level. At this time, the reset pulse RGΦ is kept at a low level.

At this time, the signal charge CRG11 to be transferred is stored to the regions corresponding to the forming positions of the transfer electrodes 128, 126, and 127.

With point-in-time t5, the horizontal transfer pulse HΦ1 which is applied to the transfer electrode 127 makes transition from a low level to a high level, in parallel with this, the horizontal transfer pulse HΦ2 which is applied to the transfer electrode 126 makes transition from a high level to a low level, the horizontal transfer pulse HΦ3 which is applied to the transfer electrode 125 is kept at a high level, the horizontal transfer pulse HΦ4 which is applied to the transfer electrode 128 is kept at a high level, and the last transfer pulse LHΦ1 which is applied to the last stage electrodes 123 and 124 is kept at a low level. At this time, the reset pulse RGΦ is kept at a low level.

Subsequently, with point-in-time t6, the horizontal transfer pulse HΦ1 which is applied to the transfer electrode 127 is kept at a high level, the horizontal transfer pulse HΦ2 which is applied to the transfer electrode 126 is kept at a low level, the horizontal transfer pulse HΦ3 which is applied to the transfer electrode 125 is kept at a high level, the horizontal transfer pulse HΦ4 which is applied to the transfer electrode 128 is kept at a high level, and the last transfer pulse LHΦ1 which is applied to the last stage electrodes 123 and 124 is kept at a low level. At this time, the reset pulse RGΦ is kept at a low level.

At this time, the signal charge CRG11 to be transferred is stored to the regions corresponding to the forming positions of the transfer electrodes 128 and 125.

With point-in-time t7, the horizontal transfer pulse HΦ1 which is applied to the transfer electrode 127 is kept at a high level, the horizontal transfer pulse HΦ2 which is applied to the transfer electrode 126 is kept at a low level, the horizontal transfer pulse HΦ3 which is applied to the transfer electrode 125 is kept at a high level without change, the horizontal transfer pulse HΦ4 which is applied to the transfer electrode 128 is kept at a high level, and the last transfer pulse LHΦ1 which is applied to the last stage electrodes 123 and 124 makes transition from a low level to a high level. At this time, the reset pulse RGΦ makes transition from a low level to a high level. Subsequently, the output CCDout makes the transition to a level higher than the level of the P phase.

At this time, the signal charge CRG11 to be transferred is started to be transferred to the region corresponding to the forming position of the last stage electrode 123 from the regions corresponding to the forming positions of the transfer electrodes 128 and 125.

With point-in-time t8, the horizontal transfer pulse HΦ1 which is applied to the transfer electrode 127 is kept at a high level, the horizontal transfer pulse HΦ2 which is applied to the transfer electrode 126 makes transition from a low level to a high level, in parallel with this, the horizontal transfer pulse HΦ3 which is applied to the transfer electrode 125 makes transition from a high level to a low level, the horizontal transfer pulse HΦ4 which is applied to the transfer electrode 128 is kept at a high level, and the last transfer pulse LHΦ1 which is applied to the last stage electrodes 123 and 124 is kept at a high level. At this time, the reset pulse RGΦ is kept at a high level, and the output CCDout is kept in a level higher than the level of the P phase.

Subsequently, with point-in-time t9, the horizontal transfer pulse HΦ1 which is applied to the transfer electrode 127 is kept at a high level, the horizontal transfer pulse HΦ2 which is applied to the transfer electrode 126 is kept at a high level, the horizontal transfer pulse HΦ3 which is applied to the transfer electrode 125 is kept at a low level, the horizontal transfer pulse HΦ4 which is applied to the transfer electrode 128 is kept at a high level, and the last transfer pulse LHΦ1 which is applied to the last stage electrodes 123 and 124 is kept at a high level. At this time, the reset pulse RGΦ is kept at a high level, and the output CCDout is kept in a level higher than the level of the P phase.

At this time, the signal charge CRG11 to be transferred is further transferred to the region corresponding to the forming position of the last stage electrode 123 from the regions corresponding to the forming positions of the transfer electrodes 128 and 125.

With point-in-time t10, the horizontal transfer pulse HΦ1 which is applied to the transfer electrode 127 is kept at a high level, the horizontal transfer pulse HΦ2 which is applied to the transfer electrode 126 is kept at a high level, the horizontal transfer pulse HΦ3 which is applied to the transfer electrode 125 makes transition from a low level to a high level, the horizontal transfer pulse HΦ4 which is applied to the transfer electrode 128 makes transition from a high level to a low level, and in parallel therewith, the last transfer pulse LHΦ1 which is applied to the last stage electrodes 123 and 124 is kept at a high level. At this time, the reset pulse RGΦ makes transition from a high level to a low level, and the output CCDout is made transition to the level of the P phase.

Subsequently, with point-in-time t11, the horizontal transfer pulse HΦ1 which is applied to the transfer electrode 127 is kept at a high level, the horizontal transfer pulse HΦ2 which is applied to the transfer electrode 126 is kept at a high level, the horizontal transfer pulse HΦ3 which is applied to the transfer electrode 125 is kept at a high level, the horizontal transfer pulse HΦ4 which is applied to the transfer electrode 128 is kept at a low level, and the last transfer pulse LHΦ1 which is applied to the last stage electrodes 123 and 124 is kept at a high level. At this time, the reset pulse RGΦ makes transition from a high level to a low level, and the output CCDout is kept in the level of the P phase.

At this time, the signal charge CRG11 to be transferred is transferred and stored to the region corresponding to the forming position of the last stage transfer electrode 123.

With point-in-time t12, the horizontal transfer pulse HΦ1 which is applied to the transfer electrode 127 makes transition from a high level to a low level, the horizontal transfer pulse HΦ2 which is applied to the transfer electrode 126 is kept at a high level, the horizontal transfer pulse HΦ3 which is applied to the transfer electrode 125 is kept at a high level, the horizontal transfer pulse HΦ4 which is applied to the transfer electrode 128 makes transition from a low level to a high level in parallel with the transition to a low level of the horizontal transfer pulse HΦ1, and in parallel with this, the last transfer pulse LHΦ1 which is applied to the last stage electrodes 123 and 124 makes transition from a high level to a low level. At this time, the reset pulse RGΦ is kept at a low level, and the output CCDout makes transition from the level of the P phase to the level of the D phase.

Subsequently, with point-in-time t13, the horizontal transfer pulse HΦ1 which is applied to the transfer electrode 127 is kept at a low level, the horizontal transfer pulse HΦ2 which is applied to the transfer electrode 126 is kept at a high level, the horizontal transfer pulse HΦ3 which is applied to the transfer electrode 125 is kept at a high level, the horizontal transfer pulse HΦ4 which is applied to the transfer electrode 128 is kept at a high level, and the last transfer pulse LHΦ1 which is applied to the last stage electrodes 123 and 124 is kept at a low level. At this time, the reset pulse RGΦ is kept at a low level, and the output CCDout is kept in the level of the D phase.

At this time, the signal charge CRG11 to be transferred is transferred and stored to the region corresponding to a position exceeding the electrode 122 serving as the output gate.

With point-in-time t14, the horizontal transfer pulse HΦ1 which is applied to the transfer electrode 127 makes transition from a low level to a high level, in parallel with this, the horizontal transfer pulse HΦ2 which is applied to the transfer electrode 126 makes transition from a high level to a low level, the horizontal transfer pulse HΦ3 which is applied to the transfer electrode 125 is kept at a high level, the horizontal transfer pulse HΦ4 which is applied to the transfer electrode 128 is kept at a high level, and the last transfer pulse LHΦ1 which is applied to the last stage electrodes 123 and 124 is kept at a low level. At this time, the reset pulse RGΦ is kept at a low level, and the output CCDout is kept in the level of the D phase.

Subsequently, with point-in-time t15, the horizontal transfer pulse HΦ1 which is applied to the transfer electrode 127 is kept at a high level, the horizontal transfer pulse HΦ2 which is applied to the transfer electrode 126 is kept at a low level, the horizontal transfer pulse HΦ3 which is applied to the transfer electrode 125 is kept at a high level, the horizontal transfer pulse HΦ4 which is applied to the transfer electrode 128 is kept at a high level, and the last transfer pulse LHΦ1 which is applied to the last stage electrodes 123 and 124 is kept at a low level. At this time, the reset pulse RGΦ is kept at a low level, and the output CCDout is kept in the level of the D phase.

At this time, the signal charge CRG11 to be transferred is stored in the region corresponding to a position exceeding the electrode 122 serving as the output gate.

With point-in-time t16, the horizontal transfer pulse HΦ1 which is applied to the transfer electrode 127 is kept at a high level, the horizontal transfer pulse HΦ2 which is applied to the transfer electrode 126 is kept at a low level, the horizontal transfer pulse HΦ3 which is applied to the transfer electrode 125 is kept at a high level without change, the horizontal transfer pulse HΦ4 which is applied to the transfer electrode 128 is kept at a high level, and the last transfer pulse LHΦ1 which is applied to the last stage electrodes 123 and 124 makes transition from a low level to a high level. At this time, the reset pulse RGΦ makes transition from a low level to a high level, and the output CCDout makes transition from the level of the D phase to a level higher than the level of the P phase.

At this time, the signal charge CRG11 is transferred to the CDS circuit serving as the next stage.

As described above, according to the present embodiment, with a horizontal CCD configuration for multi-phase driving, while expanding a high level period of a transfer pulse to secure handling electric-charge amount, transient speed is delayed, and noise canceling-out driving is performed using partially another transfer pulse and complementary properties, whereby improvement can be realized regarding dynamic range, transfer efficiency, signal output period, high-speed driving, and reduction in power.

Further, the crosstalk of a pulse to the gate adjacent to the floating diffusion is prevented by separating the last transfer pulse LHΦ1 from the other pulses, and also the speed of a driving waveform with small capacitive amount is increased, whereby a signal output speed can be increased. Further, the horizontal transfer pulses HΦ1 through HΦ3 of the transfer stage can be subjected to moderate transient driving with low amplitude, thereby providing an advantage wherein low consumption power can be readily obtained.

That is to say, according to the present embodiment, with DSC or the like for performing multi-pixelation and increase in speed, the horizontal CCD driving method having the greatest power consumption is taken as three-phase driving, the last stage gate is separated from the other stage gates to subject the transfer stage to reduction in amplitude, and driving timing suppressing crosstalk noise is employed, whereby improvement and simultaneous pursuit can be realized regarding low consumption power and increase in speed, and a high-dynamic range and noise resistance.

Thus, for example, preview using a liquid crystal monitor can be performed even with a large-sized multi-pixel digital single-lens reflex camera or the like.

Note that with the above embodiment, description has been made regarding the cases employing the three-phase driving method and the four-phase driving method, but the present invention is not restricted to these driving methods, a driving method whose number of phases is not less than five can be employed.

In this case as well, only one horizontal pulse can be set to a low level during a predetermined period, and accordingly, as described above, it is necessary to perform timing setting of horizontal transfer pulses ΦH1 through ΦHn (wherein n is an integer not less than five).

Also, with the present embodiment, description has been made regarding the case of applying the present embodiment to the horizontal transfer register of the CCD area sensors, but the present embodiment can be applied to the transfer register of CCD linear (line) sensors in the same way, and also can be applied to not only the electric-charge transfer portion of the solid-state image-capturing device but also the electric-charge transfer portion of a delay line such a CCD or the like. Thus, low-voltage driving of an electric-charge transfer portion can be realized, and consequently, reduction in power voltage of a device such as a solid-state image-capturing device, a delay line, or the like can be realized.

Now, consideration will be made regarding the power consumption of the three-phase driving method and the four-phase driving method serving as multiple-phase driving according to the present embodiment, and the power consumption of two-phase driving serving as a comparative example.

Figure 22:
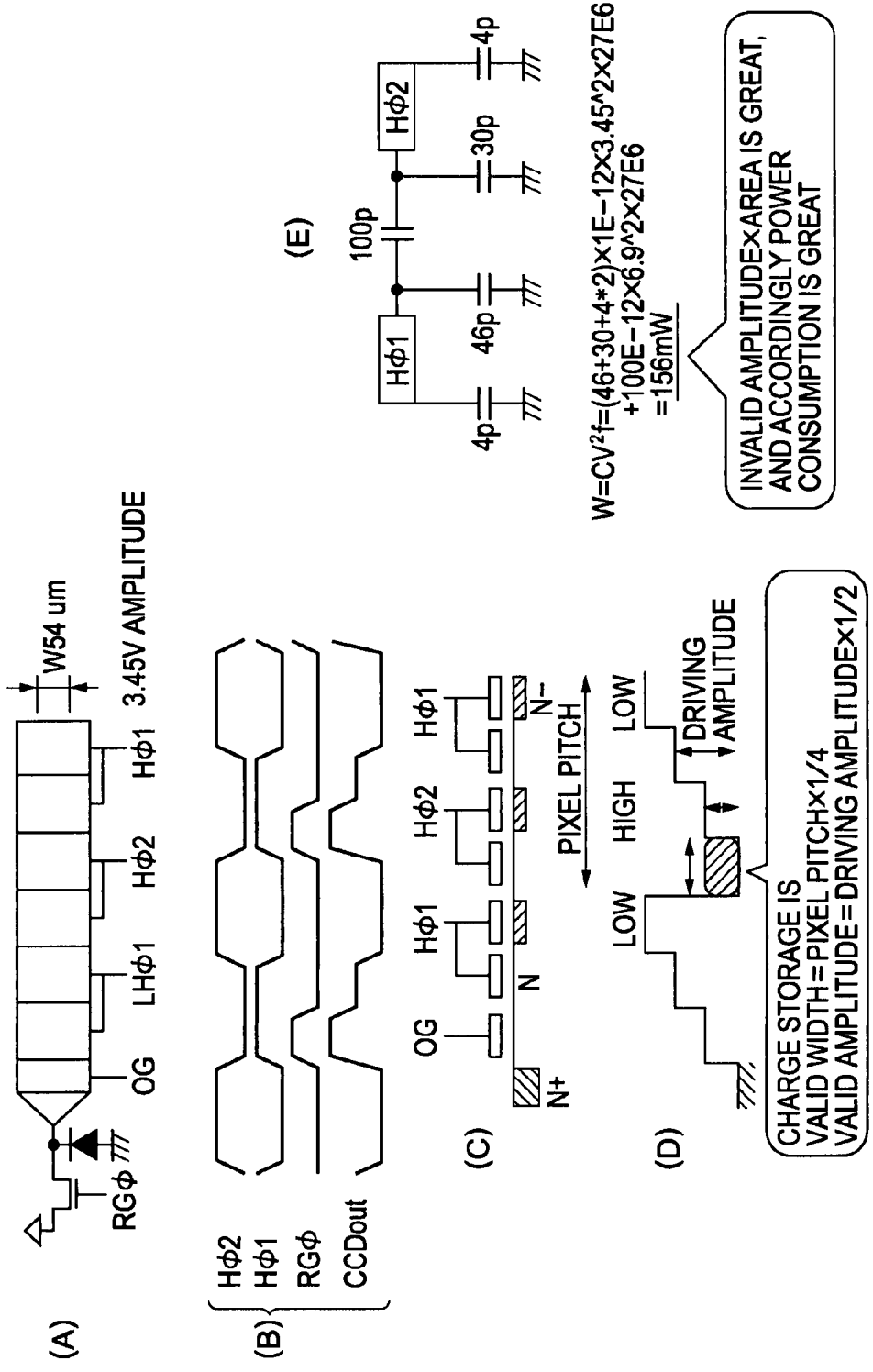
FIG. 22 is a diagram for describing the power consumption of a two-phase driving method.

FIG. 22 is a diagram for describing the power consumption of a two-phase driving method.

In this case, let us say that the amplitude of horizontal transfer pulses HΦ1 and HΦ2 is 3.45 V.

With this two-phase driving method, an equivalent circuit such as illustrated in (E) is assumed, and the electric-current consumption thereof is 156 mW.

Figure 23:
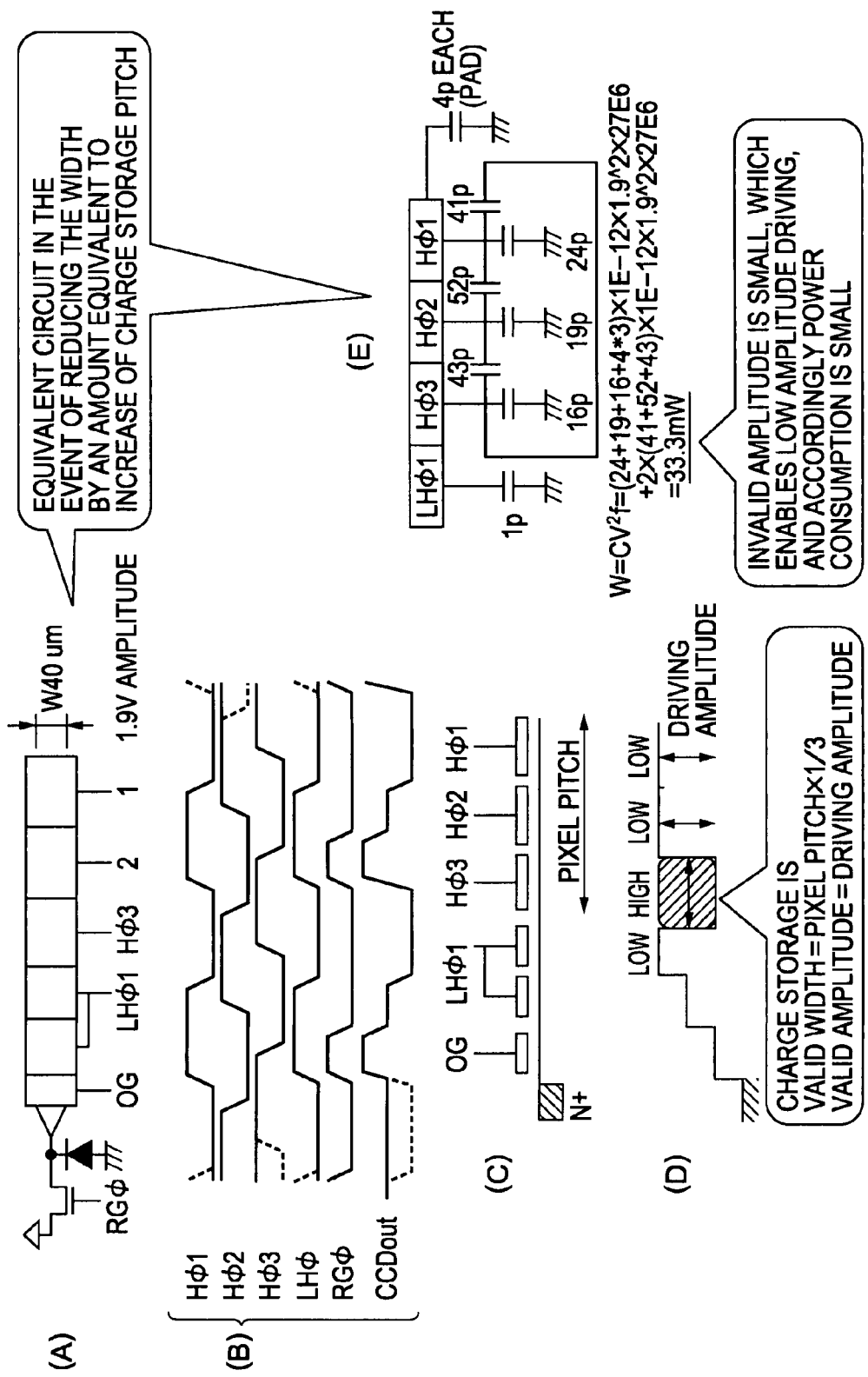
FIG. 23 is a diagram for describing the power consumption of the three-phase driving method according to the present embodiment.

FIG. 23 is a diagram for describing the power consumption of the three-phase driving method according to the present embodiment.

In this case, let us say that the amplitude of horizontal transfer pulses HΦ1 through HΦ3 is 1.9 V.

With this three-phase driving method, an equivalent circuit such as illustrated in (E) is assumed, and the electric-current consumption thereof is 33.3 mW.

That is to say, invalid amplitude is reduced, so low-amplitude driving can be realized, whereby invalid amplitude is extremely reduced from 156 mW to 33.3 mW as compared with the two-phase driving method.

Figure 24:
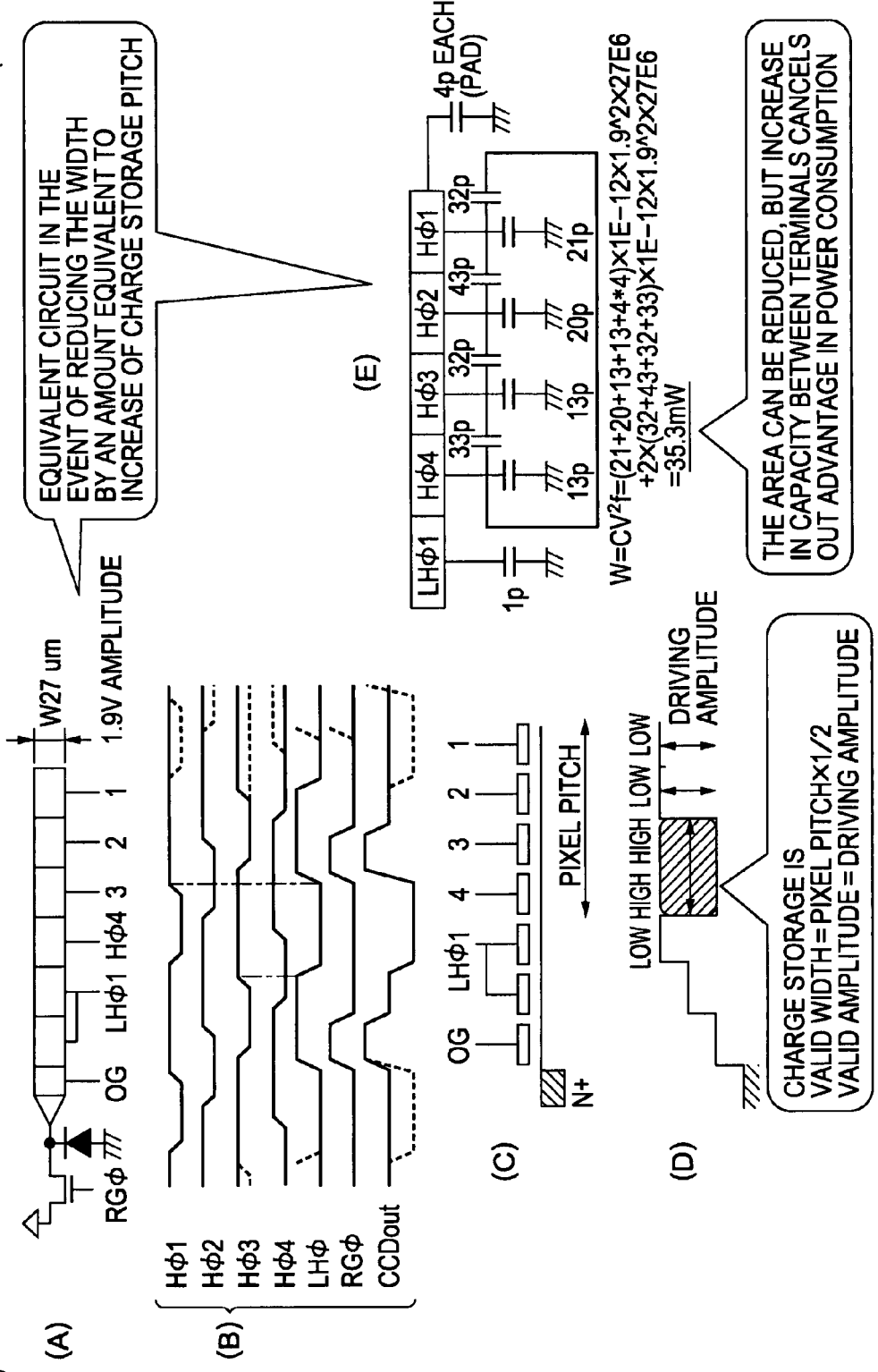
FIG. 24 is a diagram for describing the power consumption of the four-phase driving method according to the present embodiment.

FIG. 24 is a diagram for describing the power consumption of the four-phase driving method according to the present embodiment.

In this case, let us say that the amplitude of horizontal transfer pulses HΦ1 through HΦ4 is 1.9 V.

With this four-phase driving method, an equivalent circuit such as illustrated in (E) is assumed, and the electric-current consumption thereof is 35.3 mW.

That is to say, invalid amplitude is reduced, low-amplitude driving can be realized, whereby invalid amplitude is extremely reduced from 156 mW to 35.3 mW as compared with the two-phase driving method.

Thus, as for an electric-power advantage with multiple-phase driving, in the event of employing the same handling electric-charge amount, reduction in amplitude from two phases to three phases extremely reduces electric-current consumption from 156 mW to 33.3 mW, but with the four-phase driving, increase in capacity between gates due to increase in the number of phases is not included in the equation, but the lead-through current of the H driver increases by the amount equivalent to increase in the number of phases, resulting in somewhat increase in power such as 35.3 mW or more as compared with the three phases driving.

Therefore, from the perspective of power consumption, we have recognized that the three-phase driving is the most effective driving.

FIG. 13 is a schematic configuration diagram of a camera according to an embodiment of the present invention employing a solid-state image-capturing device according to the present embodiment having the above configuration as an image-capturing device.

In the camera 50 in FIG. 13, light from a subject (not shown) enters an image-capturing area of a CCD solid-state apparatus 53 via the optical system such as a lens 51, and a mechanical shutter 52. The mechanical shutter 52 is for blocking entrance of light to the image-capturing area of the CCD solid-state image-capturing device, and determining an exposure period.

As for the CCD solid-state image-capturing device 53, the CCD solid-state image-capturing device according to the above present embodiment (FIG. 16) is employed.

This CCD solid-state image-capturing device 53 is driven by a CCD driving circuit 54 including the above timing generating circuit 115, driving system, and so forth.

The output signal of the CCD solid-state image-capturing device 53 is subjected to various types of signal processing such as automatic white balance adjustment or the like at a signal processing circuit 55 serving as the next stage, following which is led to the outside as an image-capturing signal. A system controller 56 performs opening/shutting control of the mechanical shutter 52, control of the CCD driving circuit 54, control of the signal processing circuit 55, and so forth.

The present camera employs the above solid-state image-capturing device including the electric-charge transfer device, and accordingly, prevention of crosstalk and increase in speed can be realized while maintaining improvement of the original handling electric-charge amount of multiple phases, and reduction in power due to reduction in amplitude, whereby improvement and simultaneous pursuit can be realized regarding low consumption power and increase in speed, and a high-dynamic range and noise resistance.

Thus, for example, preview using a liquid crystal monitor can be performed even with a large-sized multi-pixel digital single-lens reflex camera or the like.

<Overall Configuration of Image-Capturing Device>

Figure 25:
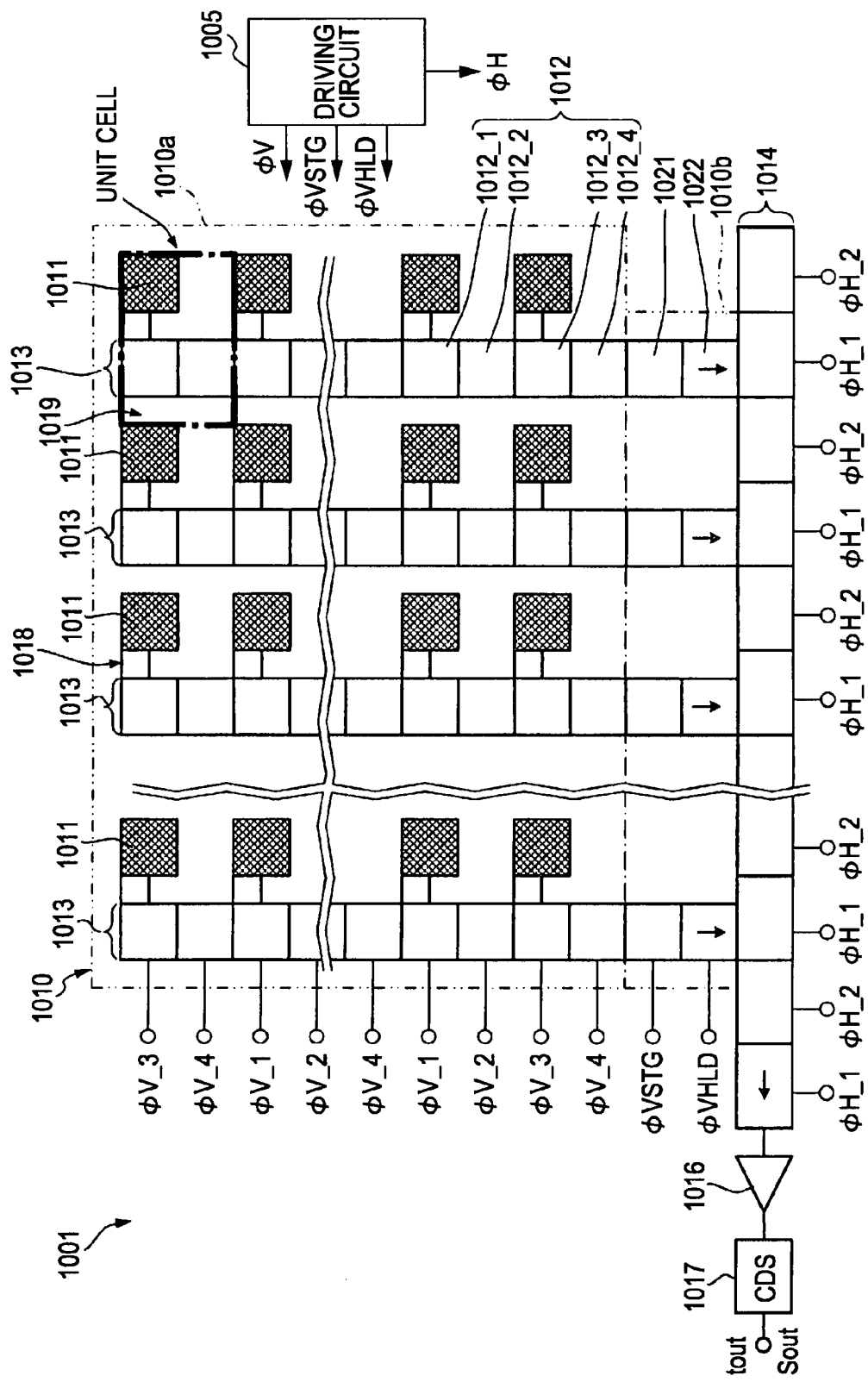
FIG. 25 is a configuration diagram illustrating one embodiment of an image-capturing device serving as one example of electronic equipment according to an embodiment of the present invention.

FIG. 25 is a configuration diagram illustrating one embodiment of an image-capturing device serving as one example of electronic equipment according to an embodiment of the present invention. Note that a case wherein a CCD solid-state image-capturing device using an interline transfer (IT) method is employed will be shown here. The CCD solid-state image-capturing device has a transfer electrode serving as capacitive reactance.

With a common CCD solid-state image-capturing device employing the IT method, an arrangement is made wherein a great number of photocells (light receiving portions) are arrayed in a two-dimensional matrix manner, multiple vertical transfer CCDs (V registers) are each arrayed between the photocells of each vertical row, horizontal transfer CCDs equivalent to normally one line are provided adjacently to the vertical transfer CCD of the last line. Description will be made specifically below.

As illustrated in the drawing, an image-capturing device 1001 according to the present embodiment includes a CCD solid-state image-capturing device 1010 employing the IT method, and a driving circuit 1005 serving as a driving device for driving the CCD solid-state image-capturing device 1010.

With the CCD solid-state image-capturing device 1010, multiple light receiving sensors (electric-charge generating units) 1011 serving as pixels are arrayed in a two-dimensional matrix manner, an image-capturing portion (light receiving portion) 1010a wherein multiple vertical transfer registers (one example of a first electric-charge transfer portion) 1013 having a CCD configuration extending in the vertical direction in the drawing corresponding to the respective light receiving sensor rows are formed is included therein. The light receiving sensors 1011 convert incident light into signal charge of the electric-charge amount equivalent to the light amount thereof, and store this.

With the image-capturing portion 1010a, further a readout gate portion 1018 lies between each of the vertical transfer registers 1013 and each of the light receiving sensors 1011, and also a channel stop portion 1019 is provided at the boundary portion of each pixel (unit cell).

Figure 49A:
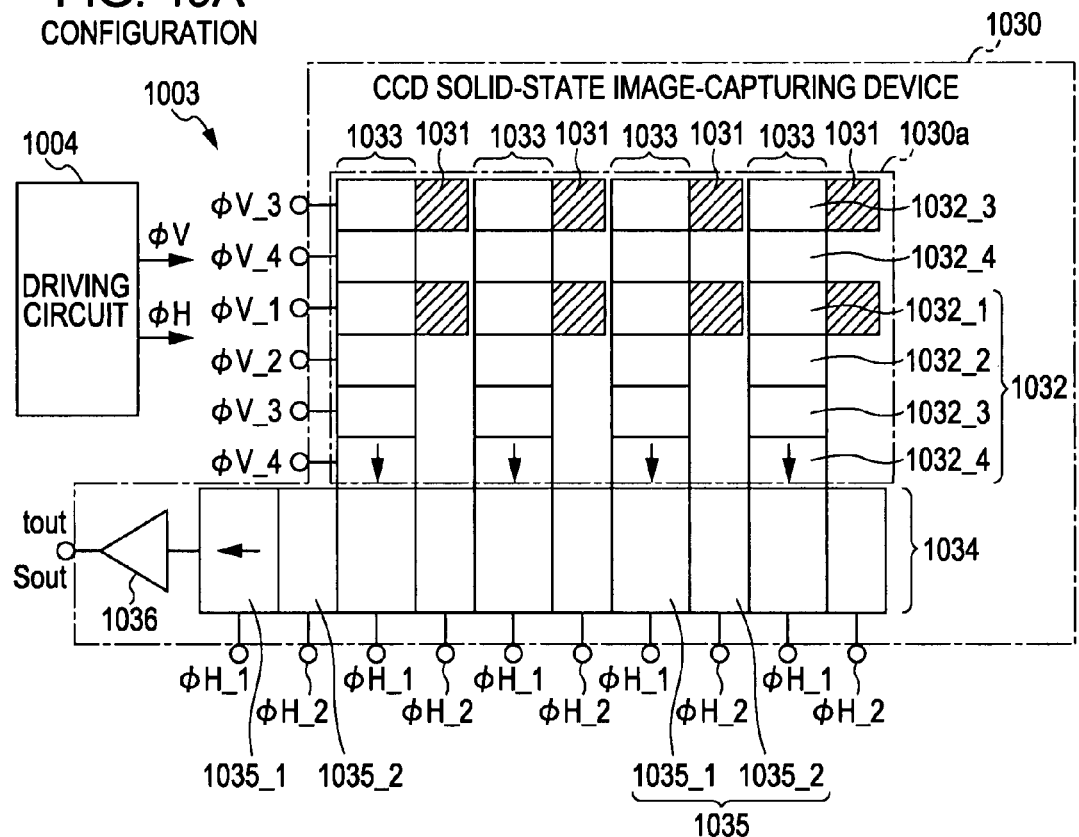
FIGS. 49A and 49B are diagrams describing the arrangement of an existing image-capturing device.
Figure 49B:
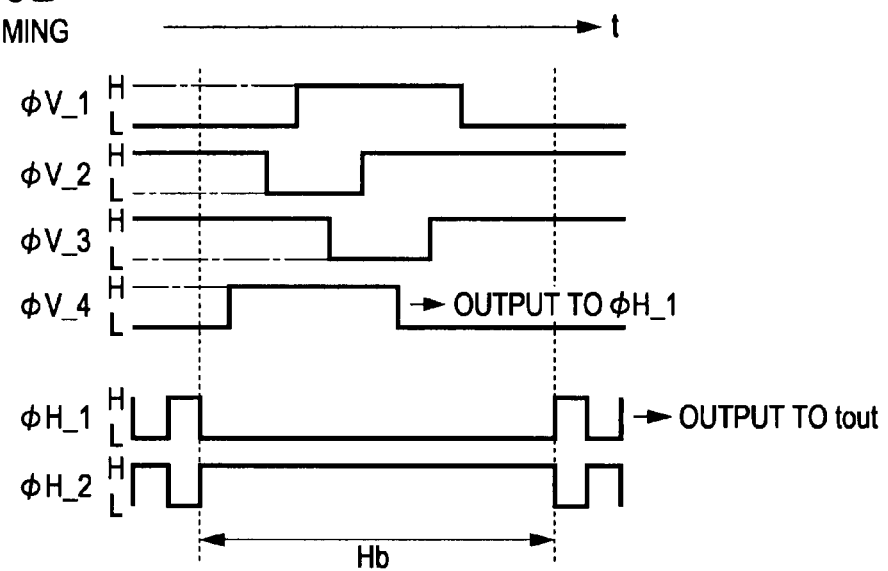

A feature of the CCD solid-state image-capturing device 1010 according to the present embodiment is that the outside of the image-capturing portion (light receiving portion) 1010a is provided with an electric-charge storage portion 1010b temporarily holding the signal charge which is vertically transferred from the image-capturing portion 1010a, and a horizontal transfer register (one example of a second electric-charge transfer portion) 1014 having a CCD configuration is formed so as to be connected to the electric-charge storage portion 1010b. That is to say, as compared with the existing CCD solid-state image-capturing device 1030 illustrated in FIG. 49, the great difference is in that the electric-charge storage portion 1010b is provided between the image-capturing portion 1010a and the horizontal transfer register 1014.

The electric-charge portion 1010b, as with the image-capturing portion 1010a, includes vertical transfer registers 1013 having a CCD configuration, and is configured such that the vertical transfer registers 1013 are disposed in two steps. Now, the region including the vertical transfer register 1013 at the image-capturing portion 1010a side is referred to as a storage gate portion STG, and the region including the vertical transfer register 1013 at the horizontal transfer register 1014 side is referred to as a hold gate portion HLG.

The horizontal transfer register 1014 having a CCD configuration extending in the horizontal direction in the drawing is formed equivalent to one line so as to be connected to the last stage (i.e., hold gate portion HLG) of the respective vertical transfer registers 1013 of the electric-charge storage portion 1010b. Subsequently, the following stage of the horizontal transfer register 1014 is connected with an output amplifier unit 1016 serving as an electric-charge detection unit (or output unit) for converting an electric-charge signal into an electric signal (commonly voltage signal), and further the following stage of the output amplifier unit 1016 is connected with a correlated double sampling (CDS) circuit 1017.

Note that with this example, the CCD solid-state image-capturing device 1010 is configured so as to include the correlated double sampling circuit 1017, but in some cases, an arrangement may be made wherein the correlated double sampling circuit 1017 is provided outside the CCD solid-state image-capturing device 1010.

The output amplifier unit 1016 stores signal charge to be injected sequentially from the horizontal transfer register 1014 in unshown floating diffusion, and converts this stored signal charge into a signal voltage, and outputs this to the correlated double sampling circuit 1017 as a CCD output signal via an output circuit made up of an unshown transistor circuit having a source follower configuration for example. The correlated double sampling circuit 1017 suppresses noise components such as reset noise included in the CCD output signal, and outputs this outside the device from an output terminal tout as an image-capturing signal Sout.

Four types of vertical transfer electrodes 1012 (each denoted with sub-numerals _1, _2, _3, and _4) are disposed on the vertical transfer registers 1013 (light receiving face side) in a predetermined sequence in the vertical direction so as to become common in the vertical transfer register of the same vertical positions of each row, and so as to form opening portions on the light receiving face of the light receiving sensors 1011. The vertical transfer electrodes 1012 are wired so as to be extended in the horizontal direction, i.e., so as to be crossed in the horizontal direction while forming opening portions at the light receiving face side of the light receiving sensors 1011.

The four types of the vertical transfer electrodes 1012 are configured such that the two vertical transfer electrodes 1012 correspond to the one light receiving sensor 1011, and also signal charge is transferred and driven in the vertical direction using four types of vertical transfer pulses $\Phi V\_1$, $\Phi V\_2$, $\Phi V\_3$, and $\Phi V\_4$ supplied from the driving circuit 1005. In other words, an arrangement is made wherein the two light receiving sensors 1011 are paired (including the last stage at the electric-charge storage portion 1010b side), and each of the vertical transfer pulses ΦV_1, ΦV_2, ΦV_3, and ΦV_4 is applied to the four vertical transfer electrodes 1012 from the driving circuit 105.

With the example illustrated in the drawing, at the electric-charge storage portion 1010b side the vertical transfer electrodes 1012 are provided corresponding to one pair of the four vertical transfer registers 1013 in the vertical direction for each pair, and of the vertical transfer electrodes 1012 thereof, the light receiving sensor 1011 positioned at the uppermost portion in the vertical direction corresponds to the vertical transfer electrode 1012_1 to which the vertical transfer pulse ΦV_1 is applied. The vertical transfer electrode 1012_2 which is further one stage ahead (closer to the electric-charge storage portion 1010b side) is applied with the vertical transfer pulse ΦV_2, the vertical transfer electrode 1012_3 which is further one stage ahead (closer to the electric-charge storage portion 1010b side) is applied with the vertical transfer pulse ΦV_3, and the vertical transfer electrode 1012_4 which is the closest to the electric-charge storage portion 1010b side is applied with the vertical transfer pulse ΦV_4.

The vertical transfer registers 1013 are further continued in the vertical transfer registers 1013 of the electric-charge storage portion 1010b via the last-stage one pair of the vertical transfer electrodes 1012 (the transfer electrodes to which the ΦV_1 through ΦV_4 are applied) 1012_1 through 1012_4. Two types of transfer electrodes such as a storage gate electrode 1021 and a hold gate electrode 1022 are disposed on the electric-charge storage portion 1010b (the same face side as the light receiving face of the image-capturing portion 1010a) so as to become common in the vertical transfer register 1013 of the same vertical position of each row. The storage gate electrode 1021 and the hold gate electrode 1022 are wired so as to extend in the horizontal direction, i.e., so as to cross in the horizontal direction.

The storage gate electrode 1021 formed at the following stage of the transfer electrode (the transfer electrode to which the ΦV_4 is applied) 1012_4 formed on the vertical transfer register 1013 of the last stage of the image-capturing portion 1010a is supplied with a storage gate pulse ΦVSTG, and the hold gate electrode 1022 of the hold gate portion HLG is supplied with a hold gate pulse ΦVHLG, from the driving circuit 1005 respectively.

The horizontal transfer register 1014 is formed such that the two horizontal transfer electrodes 1015 (each denoted with sub-numerals _1 and _2) correspond to each of the vertical transfer registers 1013, and is configured so as to transfer and drive signal charge in the horizontal direction using the two phases of horizontal driving pulses ΦH_1 and ΦH_2 supplied from the driving circuit 1005.

The general description of a series of operations of the image-capturing device having such a configuration will be made as follows. A readout pulse ΦROG transmitted from the driving circuit 1005 is applied to the gate electrode of a readout gate portion 1018, and the potential under the gate electrode thereof is deep, whereby the signal charge stored in each of the light receiving sensors 1011 of the CCD solid-state image-capturing device 1010 is read out to the vertical transfer register 1013 via the readout gate portion 1018. Readout of signal charge from a light receiving sensor to a vertical transfer register 1013 is particularly referred to as field shift as well.

The vertical transfer registers 1013 of the image-capturing portion 1010a are transferred and driven with the four types of the vertical transfer pulses ΦV_1 through ΦV_4 corresponding to the four types of vertical transfer electrodes 1012, the storage gate portion STG of the electric-charge storage portion 1010b is driven with the storage gate pulse ΦVSTG, and the hold gate portion HLG is driven with the hold gate pulse ΦVHLG. Thus, the signal charge read out from each of the light receiving sensors 1011 is transferred in the vertical direction for each portion equivalent to one scan line (one line) in order, and transmitted to the horizontal transfer register 1014.

The electric-charge storage portion 1010b made up of the storage gate portion STG and the hold gate portion HLG, which is different from the image-capturing portion 1010a, can be designed regardless of a vertical pixel pitch, so the electrode widths of the storage gate electrode 1021 and the hold gate electrode 1022 can be expanded greatly, whereby the resistance of each of the electrodes 1021 and 1022 can be lowered. This point is very advantageous in performing vertical electric-charge transfer from the electric-charge storage portion 1010b to the horizontal transfer register 1014 at high speed.

Now, though detailed description will be made later, with the vertical electric-charge transfer (so-called vertical line shift) according to the present embodiment, an arrangement is made wherein different from the vertical line shift which is performed at a part of a common horizontal blanking period, the vertical line shift at the image-capturing portion 1010a is performed at a part of a horizontal valid period, and the vertical line shift at the electric-charge storage portion 1010b is performed at a part of a horizontal blanking period.

The horizontal transfer register 1014 horizontally transfers the signal charge equivalent to one line sequentially vertically transferred from each of the multiple vertical transfer registers 1013 to the output amplifier unit 1016 side based on the two phases of the horizontal transfer pulses ΦH_1 and ΦH_2 generated from the driving circuit 1005.

The output amplifier unit 1016 converts the signal charge sequentially injected from the horizontal transfer register 1014 into a signal voltage to supply this to the correlated double sampling circuit 1017 as a CCD output signal. The correlated double sampling circuit 1017 suppresses a noise component included in the CCD output signal to output this from the output terminal tout to the outside as an image-capturing signal Sout.

<Wiring Configuration of Vertical Transfer Electrodes>

Figure 26:
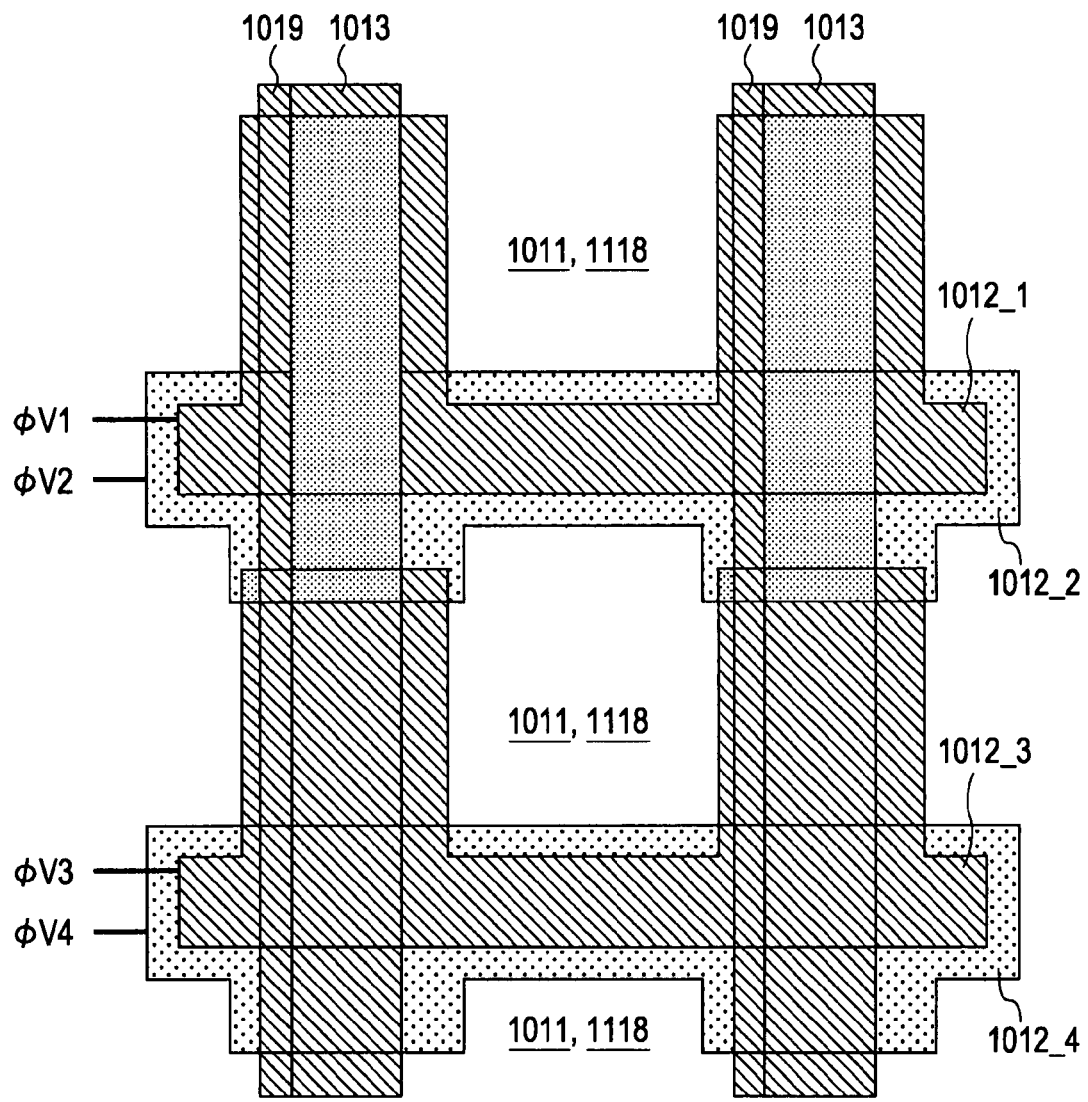
FIG. 26 is a diagram illustrating one example of the layout configuration of four types vertical transfer electrodes 1012 of the CCD solid-state image-capturing device 1010 illustrated in FIG. 25.

FIG. 26 is a diagram illustrating one example of the layout configuration of four types vertical transfer electrodes 1012 of the CCD solid-state image-capturing device 1010 illustrated in FIG. 25.

As illustrated in the drawing, the multiple vertical transfer registers (V-CCD) 1013 are arrayed between the light receiving sensors 1011 of the respective vertical rows of the light receiving sensors 1011 disposed in a two-dimensional matrix, and the readout gate portions 1018 lie between the respective light receiving sensors 1011 and the respective vertical transfer registers 1013. Also, the channel stop portions 1019 are provided at the boundary portions of the respective pixels (unit cells).

The four types of the vertical transfer electrodes 1012 made up of a thinned polycrystal silicon film extending in the horizontal direction are disposed at the light receiving face (front face of space) side of the vertical transfer registers 1013 so as to become common in the vertical transfer register 1013 of the same vertical position of each row, and so as to form the sensor opening portions 1118 on the light receiving faces of the light receiving sensors 1011.

Particularly, with this example, a layout configuration is made so as to realize two-layer electrodes and four-phase driving, the vertical transfer electrodes 1012_1 and 1012_3 to which the vertical transfer pulses ΦV_1 and ΦV_3 are supplied are provided as the second layer on the first-layer vertical transfer electrodes 1012_2 and 1012_4 to which the vertical transfer pulses ΦV_2 and ΦV_4 are supplied.

The vertical transfer electrodes of each layer have almost the same pattern shape. With the example illustrated in the drawing, the vertical transfer electrode (second electrode) 1012_2 and the vertical transfer electrode (fourth electrode) 1012_4 of the first layer have almost the same pattern configuration, and also the vertical transfer electrode (first electrode) 1012_1 and the vertical transfer electrode (third electrode) 1012_3 of the second layer have almost the same pattern configuration, and further the vertical transfer electrode 1012_1 and the vertical transfer electrode 1012_2 are formed so as to be a two-layer configuration, and also the vertical transfer electrode 1012_3 and the vertical transfer electrode 1012_4 are formed so as to be a two-layer configuration. Note that the first layer and the second layer are different from each other.

As can be understood from this, the four types of the vertical transfer electrodes 1012 cover almost the entire face of the image-capturing portion 1010a of the CCD solid-state image-capturing device 1010, and also have a two-layer configuration, and have great overlap capacity between electrodes.

<Driving Circuit: Basis>

Figure 27A:
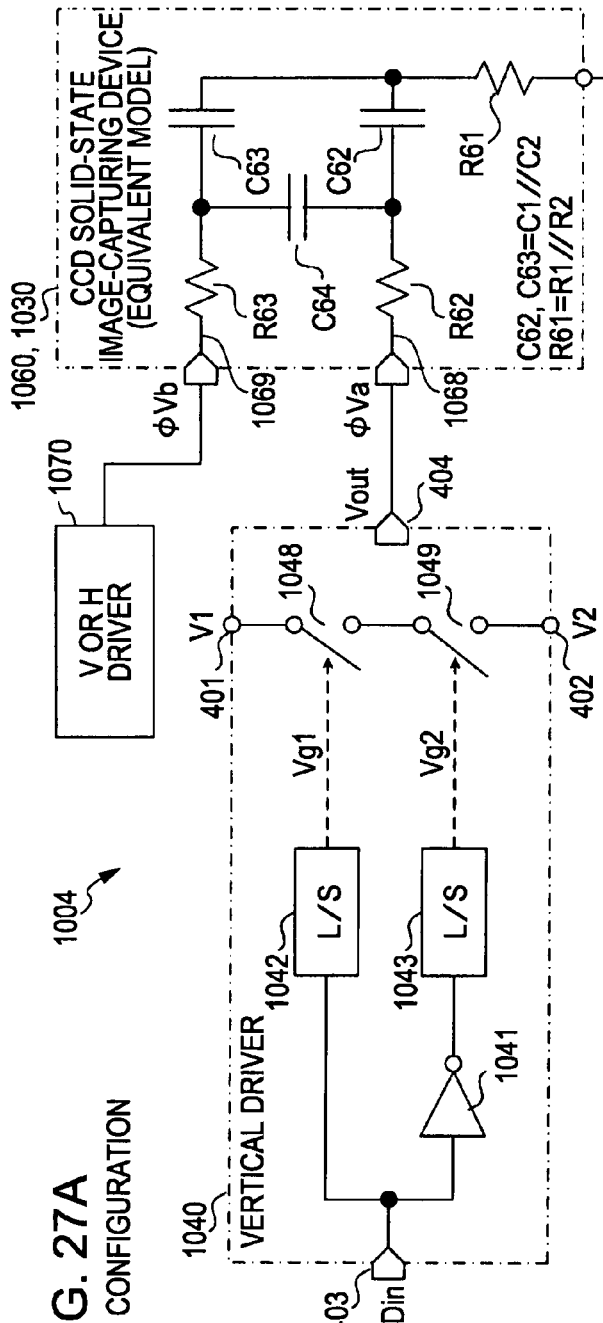
FIGS. 27A through 27C are diagrams describing the relation between an equivalent circuit of a vertical driver and a CCD solid-state image-capturing device.
Figure 27C:
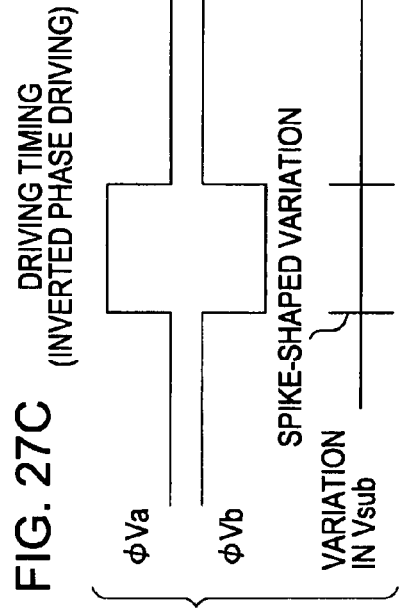
Figure 27B:
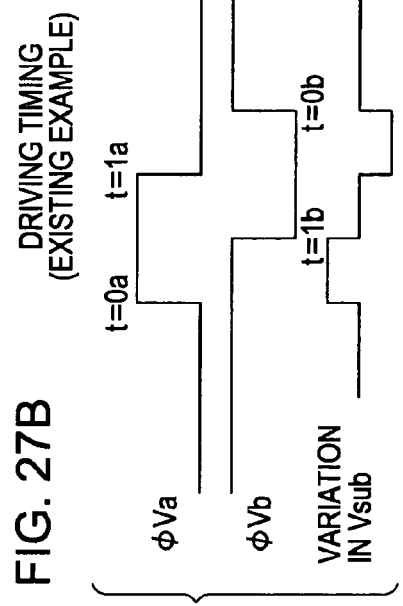

FIGS. 27A through 27C and FIG. 28 are diagrams describing a basic configuration example of a driving circuit driving an image-capturing device 1003. FIGS. 27A through 27C illustrate the relation between the equivalent circuit of a vertical driver and a CCD solid-state image-capturing device 1030 (see FIGS. 49A and 49B). Also, FIG. 28 is a diagram describing the step response of a vertical transfer pulse ΦV.

First, though description with reference to drawings will be omitted, at the image-capturing portion side, coupling capacitance C1 is formed between vertical transfer electrodes 1032 and a light shielding film, and also coupling capacitance C2 is formed between the vertical transfer electrodes 1032 and a semiconductor substrate NSUB. Also, at an output amplifier unit 1036 side, coupling capacitance C3 due to back gate effects is formed between the transistor gate making up the output amplifier unit 1036 and the semiconductor substrate NSUB.

We can consider the equivalent capacitance CL between each of the vertical transfer electrodes 1032 and the CCD substrate to be generally equal to parallel components between the coupling capacitance C1 and the coupling capacitance C2. Note that as for capacitance relating to the vertical transfer electrodes 1032, in addition to the coupling capacitance C1 and C2, there is capacitance between electrodes formed with another vertical transfer electrode 1032.

Also, as grounding resistance existing within the CCD solid-state image-capturing device 1030, there are light shielding film resistance R1 occurring between the light shielding film and ground GND, and the substrate resistance R2 of the semiconductor substrate NSUB. We can consider that the total grounding resistance R serving as these compound components is generally equal to the parallel components between the light shielding resistance R1 and the substrate resistance R2.

In FIG. 27A, the CCD solid-state image-capturing device 1030 is represented as a CCD solid-state image-capturing device 1060 serving as an equivalent circuit, and is configured so as to be driven by a driving circuit 1004. Note that with the CCD solid-state image-capturing device 1060 illustrated with an equivalent circuit, the grounding resistance R61 denotes the equivalent resistance of the CCD substrate, and is equivalent to the grounding resistance R, and is generally equal to the parallel components between the light shielding resistance R1 and the substrate resistance R2. Also, the resistance elements R62 and R63 denote the electrode resistance of the vertical transfer electrodes 1032. Also, the capacitance elements C62 and C63 denote the equivalent capacitance between the vertical transfer electrodes 1032 and the CCD substrate. Also, a capacitance element C64 denotes the equivalent capacitance between electrodes.

Note that electrode equivalent capacitance in the CCD solid-state image-capturing device depends on the number of pixels, a process to be employed, or a layout shape to vary greatly. Generally, the equivalent capacitance CL (capacitance elements C62 and C63) is 100 through 1000 pF or so, and the grounding resistance R61 is several ten ohms or so. Also, the resistance elements R62 and R63 are several ten to several hundred ohms or so.

A vertical driver 1040 which supplies the vertical transfer pulse ΦV to the vertical transfer electrodes 1032 is provided in the driving circuit 1004. The vertical driver 1040 generates, for example, vertical transfer pulses ΦV_1 through ΦV_4, and the CCD solid-state image-capturing device 1060 includes, for example, vertical transfer electrodes 1032_1 through 1032_4 to which these vertical transfer pulses ΦV_1 through ΦV_4 are applied.

In FIG. 27A, the vertical driver 1040 generates only the one vertical transfer pulse ΦV (output voltage Vout) to facilitate modeling, but the CCD solid-state image-capturing device 1060 is basically driven individually by multiple drivers for each transfer electrode (e.g., a driver 1070 serving as another vertical driver or horizontal driver). For example, the number of vertical drivers 1040 which are provided is equal to the number of types of vertical transfer electrodes 1032 (the number of phases), and each of the vertical transfer electrodes 1032 is driven by phase.

As can be understood from the CCD solid-state image-capturing device 1060 illustrated with the equivalent circuit, the CCD solid-state image-capturing device 1060 (CCD solid-state image-capturing device 1030) is a capacitive reactance load as viewed from the vertical driver 1040.

The vertical driver 1040 includes an inverter 1041 for logically inverting the control signal Din input from a terminal 403, a level shift circuit (L/S) 1042 for outputting a control signal Vg1 corresponding to the level of the control signal Din input from the terminal 403, and a level shift circuit 1043 for outputting a control signal Vg2 corresponding to the level of the control signal NDin wherein the inverter 1041 logically inverted the control signal Din input from the terminal 403.

The vertical driver 1040 also includes switches 1048 and 1049 at the subsequent stage of the level shift circuits 1042 and 1043 for inputting constant voltage V1 (voltage value V) from a terminal 401 and constant voltage V2 (voltage value V) from a terminal 402, and outputting to the CCD solid-state image-capturing device 1060 from the output terminal 404 as output voltage Vout.

The vertical driver 1040 supplies either of the constant voltage V1 provided to the terminal 401 or the constant voltage provided to the terminal 402 from the output terminal 404 to the CCD solid-state image-capturing device 1060 as output voltage Vout. For example, the voltage V1 is set to a high level, and the voltage V2 is set to a low level.

With the vertical driver 1040, the control signal Din is input from the terminal 403, and depending on the level thereof, the control signal Vg1 for turning on the switch 1048 is output from the level shift circuit (L/S) 1042, or the control signal Vg2 for turning on the switch 1049 is output from the level shift circuit (L/S) 1043. When the switch 1048 is turned on, the output voltage Vout in a steady state becomes the voltage V1, and when the switch 1049 is turned on, the output voltage Vout in a steady state becomes the voltage V2.

The CCD solid-state image-capturing device 1060 illustrated with the equivalent circuit is driven with the output voltage Vout of the vertical driver 1040 via an electrode 1068. Therefore, the driving signal at that time is applied to the grounding resistance R61 via the capacitance element C62 serving as equivalent capacitance between the electrode 1068 and the CCD substrate, and thus, noise components corresponding to the output voltage Vout appears.

Additionally, the CCD solid-state image-capturing device 1060 illustrated with the equivalent circuit is also driven with another vertical driver or horizontal driver (hereafter, referred to as "driver 70") via an electrode 1069. Therefore, the transient variations of the driving voltage as to the other electrode 1069 interfere in the driving voltage as to the one electrode 1068, and consequently, deterioration in image quality such as crosstalk noise or the like occurs.

In other words, the driving signal as to the other electrode 1069 is applied to the grounding resistance R61 showing the equivalent resistance of the CCD substrate which is generally equal to the parallel components between the light shielding film resistance R1 and the substrate resistance R2 via the capacitance element C63 serving as the equivalent capacitance between the electrode 1069 and the CCD substrate. Also, the driving signal as to the other electrode 1069 appears at the electrode 1068 via the capacitance element C64 serving as the equivalent capacitance between the electrodes, and is applied to the grounding resistance R61 via the capacitance element C63 serving as the equivalent capacitance between the electrode 1068 and the CCD substrate.

Here, as illustrated in FIG. 27B, upon the CCD solid-state image-capturing device being driven with the vertical transfer pulses $\Phi V$ whose phases differ, the VSUB variation corresponding to the phase difference of the output voltage Vout thereof appears, and noise components appear on an image. Note that description will be made later regarding FIG. 27C.

Description will be made further in detail regarding the influence of the grounding resistance R61 applied to the vertical transfer electrode 1012 with reference to FIG. 28. In FIG. 28, (A2) is an equivalent circuit diagram for obtaining the step response of the output voltage Vout in the case of having no grounding resistance R61 (i.e., the resistance value of the grounding resistance R61 is zero), and (A1) is a diagram illustrating the response waveform thereof. Also, (B2) is an equivalent circuit diagram for obtaining the step response of the output voltage Vout in the case of having grounding resistance R61 (i.e., the resistance value of the grounding resistance R61 is not equal to zero), and (B1) is a diagram illustrating the response waveform thereof. Note that the respective response waveforms of (A1) and (B1) are results obtained by simulation.

With (A2) and (B2), a resistance element R44 is the compound component (Ro+R62) between the output resistance (output impedance Ro) of the vertical driver 1040 and the resistance element R62 showing the wiring resistance of the vertical transfer electrode 1012, and in the case of the present example, the output resistance of the vertical driver 1040 is principally the equivalent resistance (equivalent impedance) of the switches 1048 and 1049.

Now, with the equivalent circuit diagrams illustrated in FIG. 27A, and (A2) and (B2) in FIG. 28, when obtaining the step response of the output voltage Vout (e.g., when supplying the vertical transfer pulse $\Phi V$ of the voltage amplitude V), the following Expression (1) holds.

$$\text{Output Voltage Vout}(t)=V\cdot[1-(Ro/(Ro+R61))\cdot\exp(-t/(C62(Ro+R61)))] \quad (1)$$

Particularly, when point-in-time t is equal to zero, t=0 is substituted for Expression (1), and as represented with Expression (2), the value of the output voltage Vout at the time of t=0 is obtained.

$$\text{Output Voltage Vout}(0)=V\cdot(R61/(R61+Ro)) \quad (2)$$

Now, (A1) illustrates the response waveform of the output voltage Vout in the case of having no grounding resistance, i.e., in the case of R61=0, and (B1) illustrates the response waveform of the output voltage Vout in the case of having grounding resistance, i.e., in the case of R61≠0. With each of the drawings, the line segment L1 illustrates the response waveform of the rectangular vertical transfer pulse $\Phi V$ (=V1) supplied to the vertical transfer electrode 1012, the line segment L2 illustrates the response waveform in the case wherein the resistance value of the resistance element Ro is small, and the line segment L3 illustrates the response waveform in the case wherein the resistance value of the resistance element Ro is great.

As can be understood from (A1) and (B1), in the event that the equivalent resistance R61 of the CCD substrate is not zero (normally not zero), the output voltage Vout steeply rises at the leading edge portion of point-in-time t=0. Note that at the trailing edge portion of point-in-time t=1, the output voltage Vout steeply falls.

Also, with the CCD solid-state image-capturing device 1060, the voltage shown in Expression (1) is generated at the electrode 1068, and at the same time, driving voltage which responds differently from the above output voltage Vout is applied to the other electrode 1069. The capacitance element C64 serving as the coupling capacitance between the electrode 1068 and the electrode 1069, and the output impedance of the driver 1070 make up a differentiation circuit, and the output voltage Vout affects (interferes) the electrode 1069. This influence becomes marked particularly in the case of the output voltage Vout steeply rising at the time of t=0.

Additionally, in the event that the equivalent resistance R61 of the CCD substrate is not zero (normally not zero), the voltage V68(t) observed at the electrode 1068 is represented with Expression (3), and similarly at the time of t=0, affects (interferes) the electrode 1069 via the capacitance element C63.

$$V68(t)=V\cdot(R61/(Ro/(Ro+R61))\cdot\exp(-t/(C62(Ro+R61))) \quad (3)$$

Thus, the transient variations of the driving voltage as to one electrode interfere the driving voltage as to another electrode, and thus deterioration in image quality such as crosstalk noise and so forth occurs. Therefore, in order to prevent this deterioration in image quality, a conventional method makes it a rule to perform vertical driving (vertical transfer) not during a horizontal valid scan period but during a horizontal blanking period, which prevents improvement in transfer speed in a CCD solid-state image-capturing device.

As one example of a solution method as to such noise, the present applicant has proposed an arrangement (also referred to as a driving method for delaying transient speed) wherein the vertical transfer register 1013 of an image-capturing portion 10*a* is transferred and driven using a vertical transfer pulse $\Phi V$ having more moderate transient properties instead of a vertical transfer pulse $\Phi V$ having common steep transient properties in Japanese Unexamined Patent Application Publication No. 2005-269060 (Japanese Patent Application No. 2004-076598) and Japanese Patent Application No. 2005-162034.

Also, the present applicant has proposed a complementary driving arrangement in Japanese Patent Application No. 2005-028606 wherein in addition to a driving method for delaying transient speed, the respective driving signals are driven in reversed phase for each pair, i.e., for at least two types of driving signals at the time of driving in the line direction during a valid transfer period.

For example, as described above, in the event of having grounding resistance (R61≠0), with the response waveform of the output voltage Vout thereof, as illustrated in FIG. 28, in (B1), the output voltage Vout steeply rises due to influence of the grounding resistance R61 regarding a leading edge portion at the time of t=0, and the output voltage Vout steeply falls regarding a trailing edge portion at the time of t=1. This is also apparent in that in Expression (3), when assuming that t=0, V68(0)=V·(R61/(Ro+R61)) holds, also when assuming that t=1, V68(1)=V(1−(R61/(Ro+R61))) holds. Therefore, noise appears on an image due to such a steep leading edge portion or trailing edge portion.

On the other hand, in the event of employing complementary driving for driving two driving signals in reversed phase, a noise component due to each of the driving signals also are in a reversed phase, and consequently which works so as to cancel out the noise, whereby crosstalk noise which occurs at the time of electric-charge transfer to the row direction can be reduced.

<Driving Timing>

Figure 29:
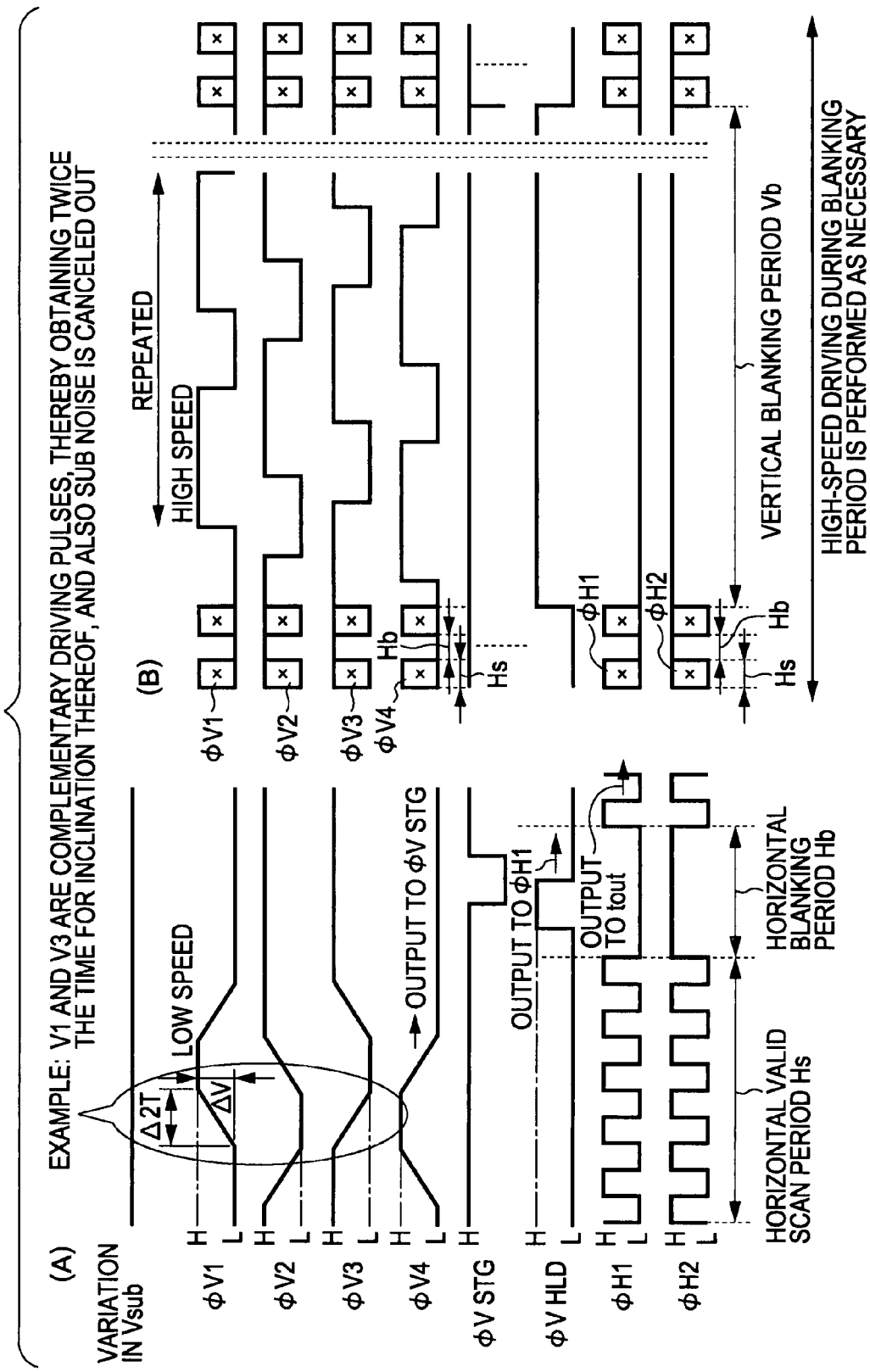
FIG. 29 is a timing chart illustrating driving timing to which complementary driving for driving the CCD solid-state image-capturing device illustrated in FIG. 25 is applied.
Figure 30:
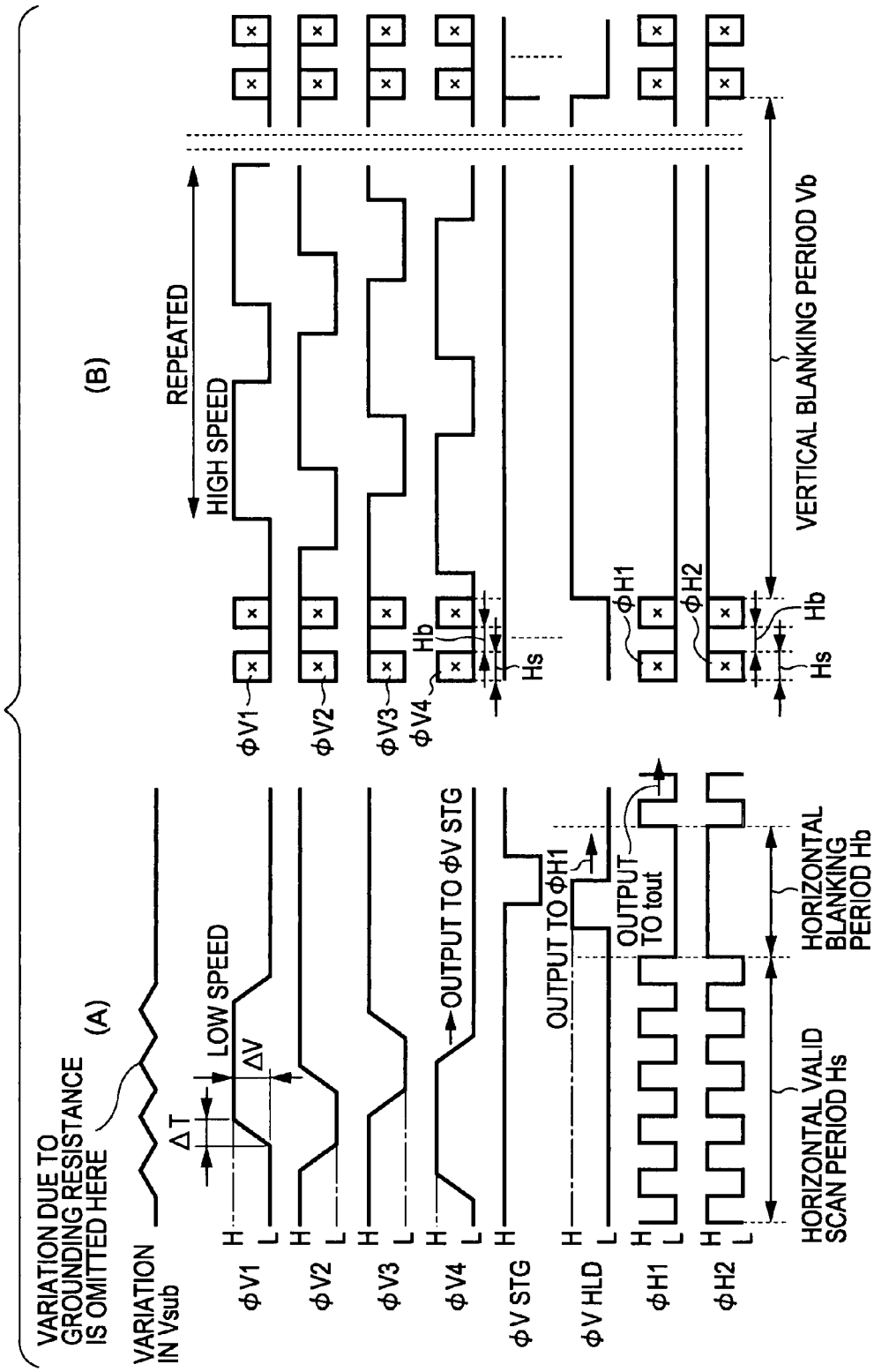
FIG. 30 is a timing chart illustrating driving timing to which complementary driving for driving the CCD solid-state image-capturing device illustrated in FIG. 25 is applied.

FIGS. 29 and 30 are diagrams illustrating a driving timing example for realizing a driving method for delaying transient speed. Here, FIG. 29 is an example in the case of employing complementary driving, and FIG. 30 is an example in the case of not employing complementary driving.

With the CCD solid-state image-capturing device 1010 according to the present embodiment, the signal charge corresponding to the light receiving amount received and photoelectric-converted at the light receiving sensor 1011 is stored. This signal charge at the light receiving sensor 1011 is read out from the light receiving sensor 1011 to the vertical transfer register 1013 during a vertical blanking period, and hereafter, the signal charge is vertically transferred to the electric-charge storage portion 1010b or horizontal transfer register 1014 side for each one horizontal line, i.e., so-called line shifting is performed, and transferred to the horizontal transfer register 1014. Subsequently, the signal charge transferred to the horizontal transfer register 1014 is transferred in the horizontal direction during a horizontal valid transfer period, and is output to the outside via the output amplifier unit 1016 and the correlated double sampling circuit 1017.

<Low-Speed Transient Driving>

The vertical line shift operations according to the driving method of the present embodiment have features in that vertical line shift is performed with a two-stage process of the first-stage vertical electric-charge transfer (vertical line shift) to the electric-charge storage portion 1010b from the image-capturing portion 1010a which applies the four types of the vertical transfer pulses ΦV_1 through ΦV_4 to the vertical transfer electrodes 1012_1 through 1012_4, and the second-stage vertical electric-charge transfer (vertical line shift) from the electric-charge 1010b to the horizontal transfer register 1014 due to application of the storage gate pulse ΦVSTG to the storage gate portion STG, and application of the hold gate pulse ΦVHLG to the hold gate portion HLG.

Particularly, as illustrated in (A) in FIG. 29, an arrangement is made wherein while employing low-speed transient driving for performing the first-stage vertical line shift at low speed during a horizontal valid scan period Hs using the vertical transfer pulse ΦV whose transient speed is delayed, high-speed transient driving is employed wherein the second-stage vertical line shift is performed at high speed during a horizontal blanking period Hb using transfer pulses (storage gate pulse ΦVSTG and hold gate pulse ΦVHLG) having steep transient properties. Thus, noise which appears within a valid image is reduced, and also the horizontal blanking period Hb is reduced, thereby realizing high-speed readout.

As an arrangement for realizing such two-stage vertical electric-charge transfer, as described above, the electric-charge storage portion 1010b including the storage gate portion STG and the hold gate portion HLG is provided between the transfer portion including the last-stage vertical transfer electrode 1012_4 of the vertical transfer register 1013 of the image-capturing portion 1010a.

In the event of performing vertical line shift driving during the horizontal valid scan period Hs, the influence of crosstalk noise due to the vertical driving pulses ΦV_1 through ΦV_4 within the CCD transfer portion, i.e., the leading edge Tr and trailing edge Tf of the clock waveform thereof, so-called transient causes a problem. Therefore, with this first embodiment, as illustrated in (A) in FIG. 29, an arrangement is made wherein the inclination ΔV/ΔT (ΔV denotes pulse voltage, and ΔT denotes time) of the leading edge Tr and trailing edge Tf in the vertical driving pulses ΦV_1 through ΦV_4 is reduced, i.e., transient speed is delayed. Now, let us say that the transient speed ΔV/ΔT is low speed so as to eliminate the crosstalk noise which occurs when applying the vertical transfer pulses ΦV_1 through ΦV_4 by the correlated double sampling circuit 1017.

Upon an experiment having been performed by delaying the transient speed of the vertical driving pulses V_1 through ΦV_4, confirmation has been made that in the event that the transient speed ΔV/ΔT is no more than 50 mV per 1 nanosecond (excluding zero), the crosstalk noise occurring at the time of vertical line shift is eliminated at the correlated double sampling circuit 1017, and even if vertical line shift is performed during the horizontal valid scan period Hs, the influence of image noise (vertical lines) as to the CCD output of the solid-state image-capturing device can be reduced. In other words, the crosstalk noise due to the vertical driving pulse whose transient speed ΔV/ΔT is no more than 50 mV per 1 nanosecond (excluding zero) has no high-frequency components, which can be eliminated sufficiently at the correlated double sampling circuit 1017.

Incidentally, the transient speed ΔV/ΔT of the vertical transfer pulse of existing vertical line shift is around 1 V per 1 nanosecond or so, and the crosstalk noise due to such a vertical transfer pulse includes high-frequency components, so it is difficult for a CDS circuit to eliminate such crosstalk noise.

In (A) in FIG. 29, the transient period of the clock waveforms of the vertical transfer pulses ΦV_1 through V_4 during the horizontal valid scan period Hs is represented with a lamp waveform, but it is desired that the transition properties of the leading edge Tr and trailing edge Tf of the vertical driving pulses ΦV_1 through ΦV_4, i.e., the comprehensive inclinations of the leading edge Tr and trailing edge Tf are smoother than the inclinations in the past, and regardless of a lamp waveform, the transition properties may be properties wherein a transition is made in an exponential manner, or may be properties wherein a transition is made in a staircase manner. In the event that a transition is made in a step manner, it is desired to reduce the variations of the steps as less as possible, i.e., it is desired to increase the number of steps.

Note that with the driving timing illustrated in (A), the transient speed of the vertical driving pulse which is applied to the transfer electrode at the vertical line shift during the horizontal valid scan period Hs is delayed, but as illustrated in (B), the transient speed of the vertical transfer pulse ΦV which is applied to the transfer electrode during the vertical blanking period Vb is increased, whereby high-speed transfer can be performed. For example, in the event of the electronic camera shake correction operations of a camcorder which needs high-speed operations, or the CCD solid-state image-capturing device employing the frame interline (FIT) method for broadcasting business, or the like, it is necessary to perform high-speed driving during the vertical blanking period Vb. The high-speed driving during the vertical blanking period in such a case is performed by the vertical driving pulses ΦV_1 through ΦV_4 whose transient speed is fast to the vertical transfer electrodes 1012_1 through 1012_4 using a common CMOS driver.

In order to simultaneously realize the high-speed operations during the vertical blanking period Vb and the low-speed operations during the horizontal blanking period Hb, a driver including a two-speed switchover function can be employed.

According to such an electric-charge transfer driving method using the low-speed transient driving for the image-capturing portion 1010a toward the electric-charge storage portion 1010b, the vertical transfer pulses ΦV_1 through ΦV_4 are subjected to vertical line shift by delaying the inclination and variation, i.e., the transient speed ΔV/ΔT during the horizontal valid scan period Hs, and accordingly, the crosstalk noise occurred by application of the vertical transfer pulses ΦV_1 through ΦV_4 can be eliminated at the subsequent-stage correlated double sampling circuit 1017. Thus, image noise (vertical lines) can be suppressed.

Also, simultaneously employing an electric-charge transfer driving method using the high-speed transient driving for the electric-charge storage portion 1010b by the storage gate pulse ΦVSTG and the hold gate pulse ΦVHLD toward the horizontal transfer register 1014 enables signal charge to be transferred at high speed from the electric-charge storage portion 1010b to the horizontal transfer register 1014, whereby the horizontal blanking period Hb can be reduced. As a result, a high-speed frame rate can be realized.

Also, the storage gate portion STG and the hold gate portion HLG can be designed regardless of a vertical pixel pitch, so the electrode widths of the storage gate electrode 1021 and the hold gate electrode 1022 can be expanded greatly. Therefore, decrease in resistance of the electrodes 1021 and 1022 can be realized, which facilitates increase in the speed of transfer of the signal charge from the storage gate portion STG to the horizontal transfer register 1014. Lining wiring and so forth are also facilitated, decrease in resistance of the electrodes 1021 and 1022 can be realized, and increase in transfer speed can be realized. Further, the signal charge can be transferred to the horizontal transfer register 1014 during the short horizontal blanking period Hb. As a result thereof, further high frame rate can be realized.

Thus, the driving method for delaying transient speed is employed, and the two driving means of high-speed driving and low-speed driving are provided as vertical line shift driving, and thus no image noise (vertical lines) appears since the vertical transfer ΦV is low transient even if the first-stage vertical line shift is performed during the horizontal valid period Hs, and the second-stage vertical line shift is performed using the high-speed transient vertical transfer pulse ΦV during the horizontal blanking period Hb, whereby the horizontal blanking period Hb can be reduced greatly, and a high frame rate can be realized. Therefore, even when required to handle electronic camera shake operations of a camcorder and the high-speed operations such as FIT for broadcasting, this driving method can be applied.

<Complementary Driving>

Additionally, as illustrated in FIG. 29 in (A), this complementary driving includes the great feature in that some of the multiple vertical transfer electrodes 1012 are paired, and the reversed-phase vertical transfer pulse ΦV is supplied to each thereof, i.e., the vertical transfer pulse ΦV is complementarily moved. This is greatly different from normal circumstances wherein four types of driving pulses whose phases differ are supplied as illustrated in (A) in FIG. 30.

For example, in the event that the layout configuration of the vertical transfer electrodes 1012 of the image-capturing portion 1010a of the CCD solid-state image-capturing device 1010 is a two-layer configuration, the vertical transfer electrodes 1012 alternately have the same configuration, the driving pulses of the electrodes having the same configuration are moved complementarily, whereby an advantage can be provided wherein the potential variation occurring depending on the coupling capacitance between the vertical transfer electrode 1012 and PWELL-#2b or the semiconductor substrate SUB is cancelled out.

Also, employing the complementary driving (reversed phase driving) enables the period for the vertical transfer pulse ΦV to be reduced by half, and as a result thereof the transient period can be doubled, whereby the transient speed can be decreased, and also the crosstalk noise can be reduced.

Also, crosstalk noise can be reduced, so even if a high-gain amplifier is employed for the output amplifier unit 1016 or the like, a noise problem is eliminated, whereby high sensitivity and high speed can be realized.

<Advantage of Complementary Driving>

Figure 31A:
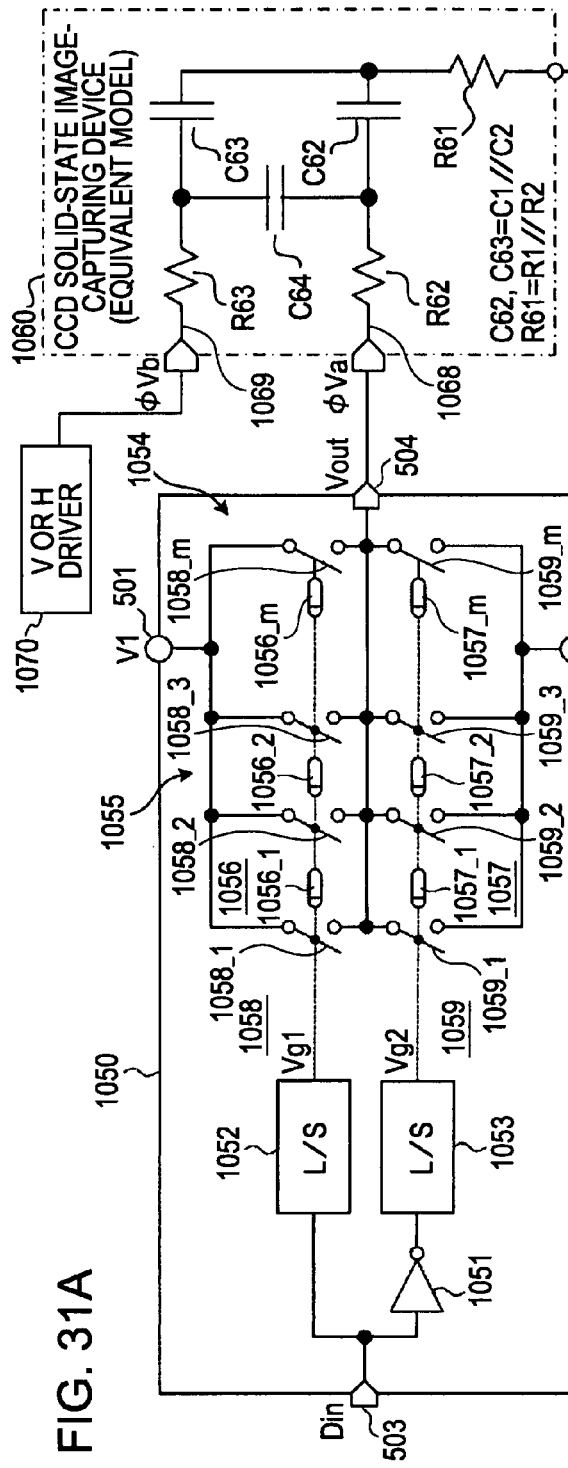
FIGS. 31A through 31C are diagrams describing the relation between an equivalent circuit of a vertical driver and a CCD solid-state image-capturing device.
Figure 31C:
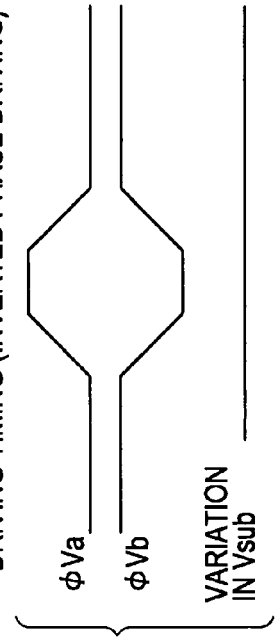
Figure 31B:
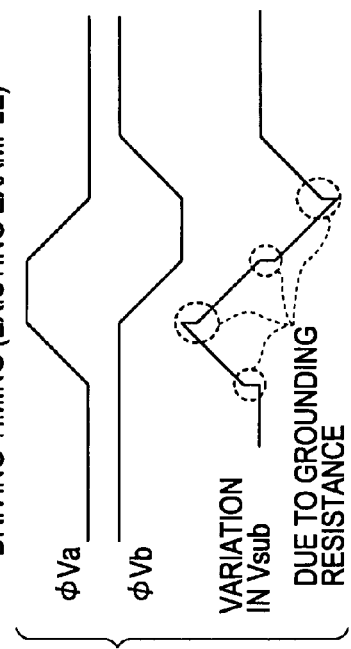
Figure 32A:
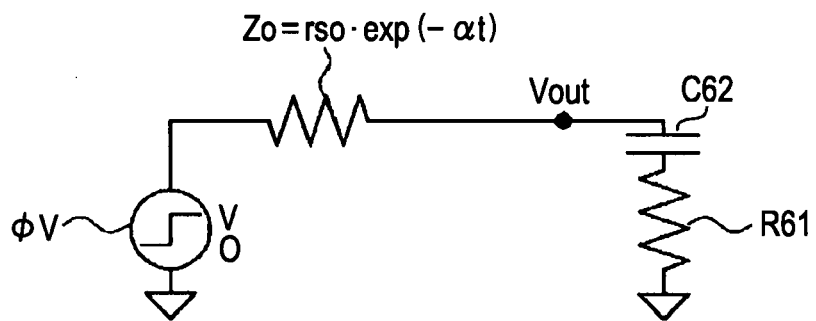
FIGS. 32A and 32B are diagrams describing a principle capable of reducing transient speed using a vertical driver.
Figure 32B:
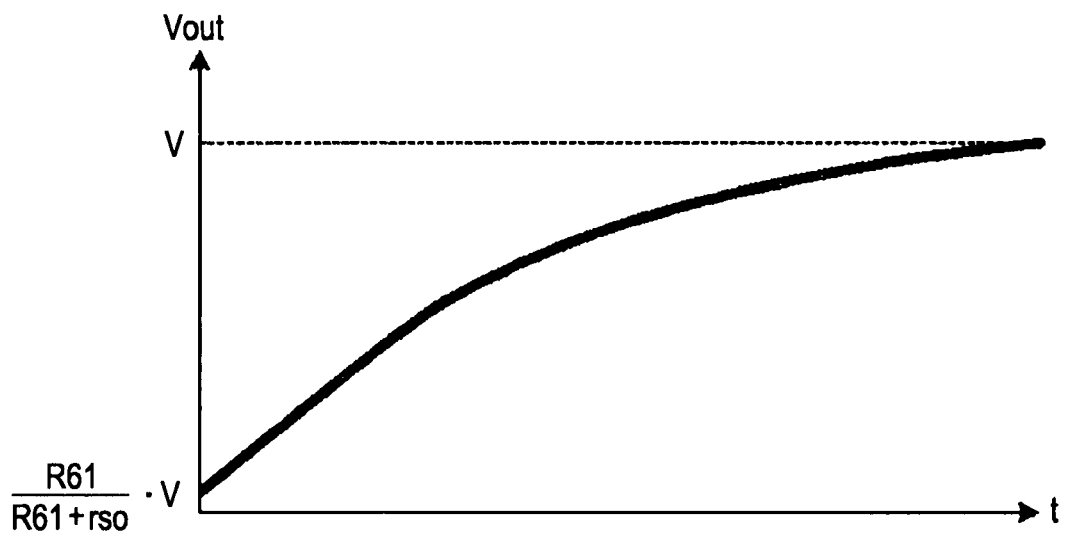

FIGS. 31A through 31C and FIGS. 32A and 32B are diagrams describing a principal advantage by performing the complementary driving. Here, FIGS. 31A through 31C are diagrams describing the relation between the equivalent circuit of the vertical driver and the CCD solid-state image-capturing device 1030. Also, FIGS. 32A and 32B are diagrams describing the principle wherein the vertical driver 1050 can decrease the transient speed.

Figure 1A:
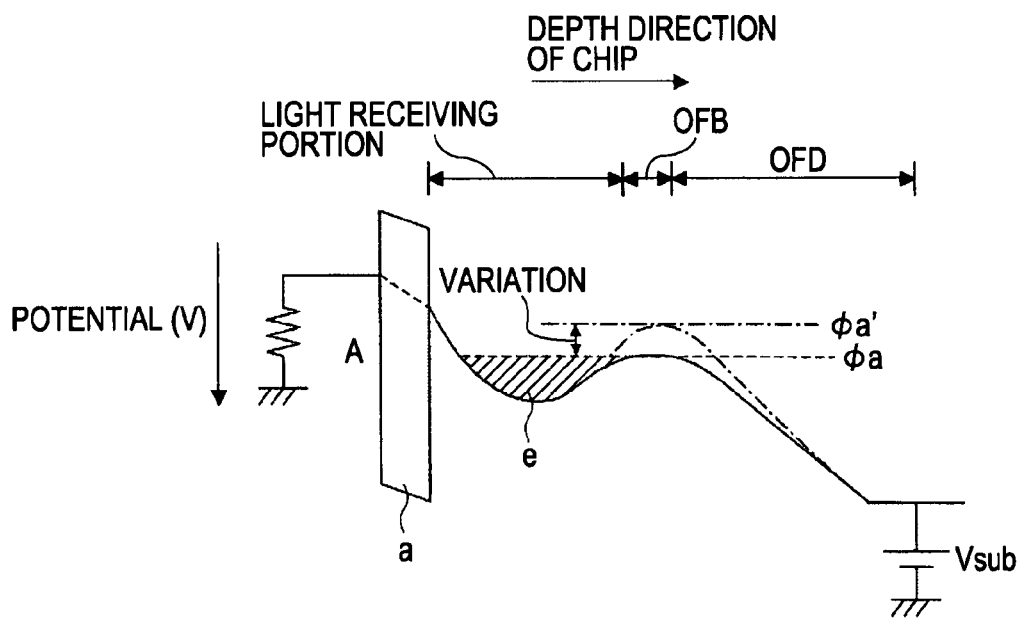
FIGS. 1A and 1B are diagrams illustrating the potential distribution of a light receiving portion for performing photoelectric conversion of a solid-state image-capturing device having a common vertical-type overflow drain configuration.
Figure 1B:
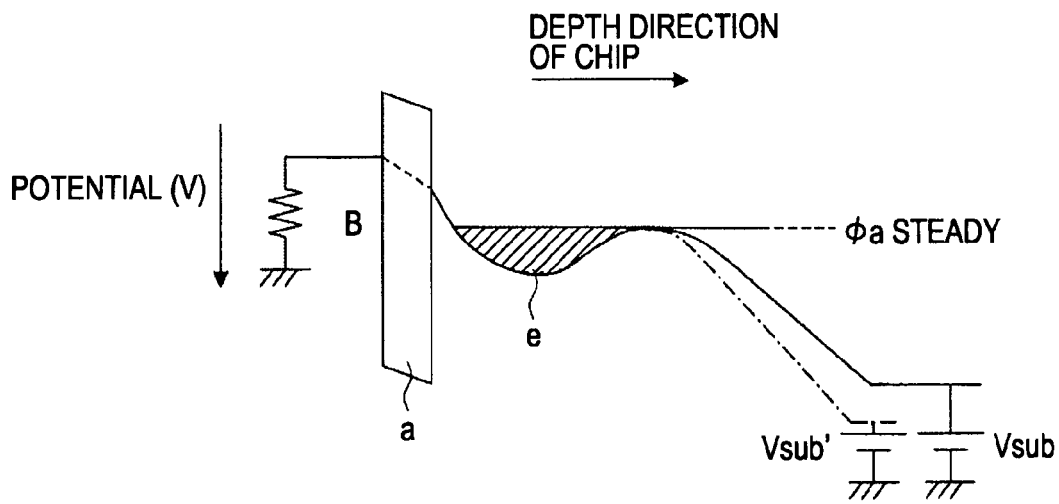
Figure 2:
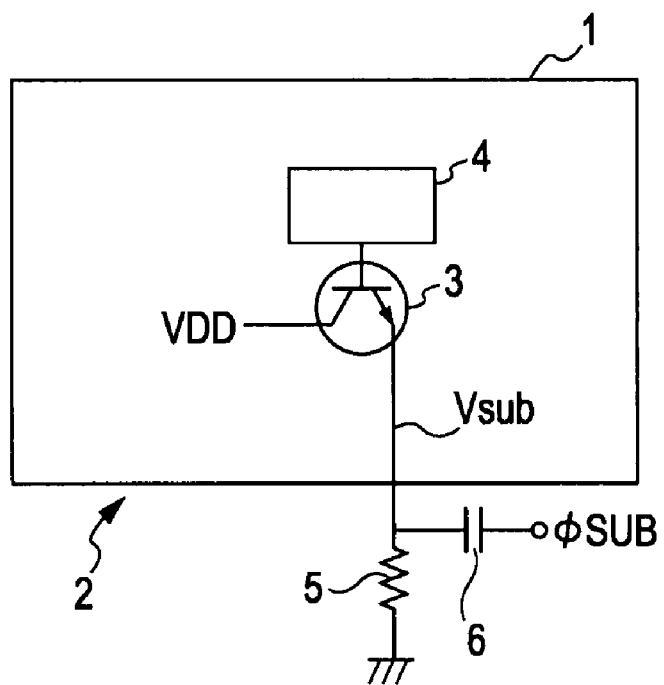
FIG. 2 is a diagram illustrating the schematic configuration of a solid-state image-capturing device on which is mounted a basic substrate bias voltage setting circuit.
Figure 3:
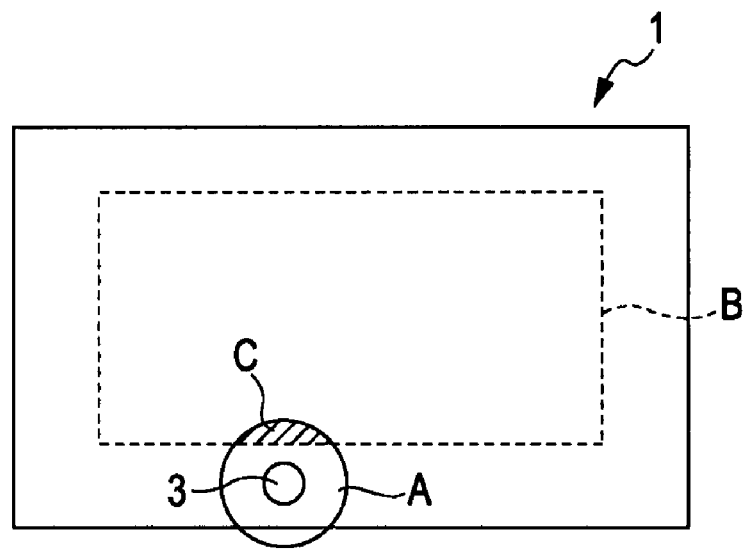
FIG. 3 is a diagram for describing a light emitting phenomenon due to a third electron.

In FIG. 31A, the CCD solid-state image-capturing device 1010 is represented with an equivalent circuit in the same way as in FIG. 3 as a CCD solid-state image-capturing device 1060, and is driven by a driving circuit 1005 including a vertical driver 1050 peculiar to the present embodiment for supplying the vertical transfer pulse ΦV, the storage gate pulse ΦVSTG, and the hold gate pulse ΦVHLG to the vertical transfer electrodes 1012.

The vertical driver 1050 generates, for example, vertical transfer pulses ΦV_1 through ΦV_4, and the CCD solid-state image-capturing device 1060 includes, for example, vertical transfer electrodes 1012_1 through 1012_4 to which the vertical transfer pulses ΦV_1 through ΦV_4 are applied. In FIG. 31A, in order to facilitate modeling, the vertical driver 1050 generates only one vertical transfer pulse ΦV (output voltage Vout), but the CCD solid-state image-capturing device 1060 is driven by multiple drivers (e.g., driver 70 which is another vertical driver or horizontal driver).

For example, as illustrated in FIGS. 31A and 31C, in the event of supplying the vertical transfer pulse ΦV_1 to the electrode 1068, the vertical transfer pulse ΦV_3 which is the reversed phase of the vertical transfer pulse ΦV_1 is supplied to the electrode 1069, and in the event of supplying the vertical transfer pulse ΦV_2 to the electrode 1068, the vertical transfer pulse ΦV_4 which is the reversed phase of the vertical transfer pulse ΦV_2 is supplied to the electrode 1069.

The vertical driver 1050 includes an inverter 1051 for logically inverting the control signal Din input from a terminal 501, a level shift circuit (L/S) 1052 for outputting the control signal Vg1 corresponding to the level of the control signal Din input from the terminal 503, and a level shift circuit 1053 for outputting the control signal Vg2 corresponding to the level of the control signal NDin wherein the control signal Din input from the terminal 503 is logically inverted at the inverter 1051.

Also, the vertical driver 1050 includes a voltage output portion 1054 and an impedance control portion 1055 at the subsequent stage of the level shift circuits 1052 and 1053. The voltage output portion 1054 input constant voltage V1 and V2 (voltage value V) from terminals 501 and 502, and output these from a terminal 504 to the CCD solid-state image-capturing device 1060 as output voltage Vout. For example, voltage V1 is set to a high level, and voltage V2 is set to a low level.

The impedance control portion 1055 controls output impedance as viewed from the output terminal 504 depending on the propagation properties of the CCD solid-state image-capturing device 1060 serving as a capacitive reactance load. In FIG. 31A, the impedance control portion 1055 includes multiple delay lines (delay elements) 1056 (represented with sub-numerals _1, _2, and so on through _m, respectively) which are multistage-connected, multiple delay lines (delay elements) 1057 (represented with sub-numerals _1, _2, and so on through _m, respectively) which are multistage-connected, switches 1058 (represented with sub-numerals _1, _2, and so on through _m, respectively) provided corresponding to the delay lines 1056, and switches 1059 (represented with sub-numerals _1, _2, and so on through _m, respectively) provided corresponding to the delay lines 1057. As described later, with the respective switches 1058 and 1059, impedance components are appropriately set to on/off depending on the propagation properties of the CCD solid-state image-capturing device 1060.

The vertical driver 1050 drives the electrode 1068 serving as one of the electrodes of the CCD solid-state image-capturing device 1060 using the output voltage Vout, but the driver 1069 serving as another vertical driver or horizontal driver drives the electrode 1069 serving as the other electrode of the CCD solid-state image-capturing device 1060.

The delay lines 1056 and the switches 1058 control the output impedance when the voltage V1 is output from the terminal 501 as the output voltage Vout, and the delay lines 1057 and the switches 1059 control the output impedance when the voltage V2 is output from the terminal 502 as the output voltage Vout.

For example, the configurations of the delay lines 1056 and the switches 1058 are as follows. That is to say, one end of each of the switches 1058 is commonly connected to the terminal 501 (voltage V1), and the other end thereof is commonly connected to the output terminal 504. Also, the respective switches 1058 are arrayed before and after the respective delay lines 1056, as the control signal Vg1 from the level shift circuit 1052 propagates on the delay lines 1056, from the switch 1058_1 toward the switch 1058_m are sequentially turned on accompanying delay.

The respective switches 1058 include impedance components. Therefore, as the control signal Vg1 propagates the delay lines 1056, and the respective switches 1058 are sequentially turned on, the value of parallel impedance to be formed by the switches 1058 gradually decreases. That is to say, the output impedance of the vertical driver 1050 as viewed from the terminal 504 gradually decreases.

Similarly, one end of each of the switches 1059 is commonly connected to the terminal 502 (voltage V2), and the other end thereof is commonly connected to the output terminal 504. Also, the respective switches 1059 are arrayed before and after the respective delay lines 1057, as the control signal Vg2 from the level shift circuit 1053 propagates on the delay lines 1057, from the switch 1059_1 toward the switch 1059_m are sequentially turned on accompanying delay.

The respective switches 1059 include impedance components. Therefore, as the control signal Vg2 propagates the delay lines 1057, and the respective switches 1059 are sequentially turned on, the value of parallel impedance to be formed by the switches 1059 gradually decreases. That is to say, the output impedance of the vertical driver 1050 as viewed from the terminal 504 gradually decreases.

Thus, with the vertical driver 1050, the control signal Din is input from the terminal 503, and depending on the level thereof, the control signal Vg1 or Vg2 for turning on the switches 1058 or 1059 are provided to the delay lines 1056 or 1057 from either of the level shift circuit 1052 or 1053. That is to say, one input of the level shift circuits 1052 and 1053 goes to a high level by the inverter 1051, and the output signal of the one of the level shift circuit propagates on the corresponding one of the delay lines to sequentially turn on the corresponding one of the switches.

Thus, if the output impedance of the vertical driver 1050 is controlled by the impedance control portion 1055, the transient speed $\Delta V/\Delta T$ of the output voltage Vout can be decreased.

For example, FIG. 32A corresponds to (A2) and (B2) in FIG. 28, and illustrates an equivalent circuit for obtaining the step response of the output voltage Vout, and FIG. 32B illustrates the response waveform thereof, and corresponds to (A1) and (B1) in FIG. 28. Note that FIG. 32B illustrates the response waveform assuming that the equivalent circuit includes no capacitance element C62.

In FIG. 32A, an impedance component Z58 is the compound component (Zo+R62) between output impedance Zo as viewed from the output terminal of the vertical driver 1050 and the resistance element R62 showing the wiring resistance of the vertical transfer electrodes 1012, and in the case of the present example, the output impedance Zo of the vertical driver 1050 is principally the equivalent impedance of the switches 1058 and 1059. Now, let us say that the value of the output impedance Zo of the vertical driver 1050 varies with time in accordance with $Zo(t)=rs0\cdot\exp(-\alpha t)$ (rs0: initial value=Zo(0), $\alpha$: constant).

Now, with the equivalent circuit diagram illustrated in FIG. 32A, if we obtain the step response of the output voltage Vout (e.g., when supplying a vertical transfer pulse $\Phi V$ having a voltage amplitude V), an expression such as Expression (4-1) can be obtained. Here, if the resistance element R62 showing the wiring resistance of the vertical transfer electrodes 1012 is ignored, an expression such as Expression (4-2) can be obtained, and further if the capacitance element C62 is not included, an expression such as Expression (4-3) can be obtained.

$$\text{Output Voltage Vout}(t)=V\cdot[1-(Z58(t)/(Z58(t)+R61))\cdot \exp(-t/(C62(Z58(t)+R61)))] \quad (4\text{-}1)$$

$$\text{Output Voltage Vout}(t)=V\cdot[1-(Zo(t)/(Zo(t)+R61))\cdot\exp(-t/(C62(Zo(t)+R61)))] \quad (4\text{-}2)$$

$$\text{Output Voltage Vout}(t)=V\cdot R61/(R61+Zo(t))=R61/(R61+rs0\cdot\exp(-\alpha t)) \quad (4\text{-}3)$$

Particularly, when point-in-time is t=0, t=0 is substituted for Expression (4-2) and Expression (4-3), whereby as shown in Expression (5), the value of the output voltage Vout at the time of t=0 is obtained.

$$\text{Output Voltage } Vout(0) = V \cdot (R61/(R61 + Zo(0))) \quad (5)$$
$$= V \cdot (R61/(R61 + rs0))$$

Now, if we compare Expression (5) with the existing output voltage Vout(0)=V·(R61/(R61+Ro)) at the time of t=0 (see Expression (2)), the initial value rs0 of the output impedance Zo of the vertical driver 50 is adjusted, whereby the value of the output voltage Vout at the time of t=0 can be reduced as compared with the existing value. For example, if we say that rs0=8·Ro, the value of the output voltage Vout at the time of t=0 can be reduced by around ⅛. Also, the value of the impedance component Z58 is great, so the transient properties of the output voltage Vout can be smoothed, i.e., the transient speed of the output voltage Vout can be decreased.

However, if nothing is done, there is concern that the transient speed might excessively decrease, and the output voltage Vout not reach steady level (=V) during the active period of the vertical transfer pulse (ΦV, so it would be difficult to drive the vertical transfer electrode 1012 sufficiently.

In order to avoid this situation, it is desired to decrease the output impedance of the vertical driver 1050 as time elapses, for example, if the output impedance is decreased exponentially, as illustrated in FIG. 32B, the transient response properties of the output voltage Vout (let us say that the capacitance element C62 is not included) can be smoothed, i.e., the transient speed of the output voltage Vout can be decreased.

Note that with the equivalent circuit illustrated in FIG. 32A, the output impedance Zo of the vertical driver 1050 has been represented with an exponential function, but if the point-in-time is restricted to t=0, the value of the initial value rs0 becomes important for decreasing the transient speed of the output voltage Vout, and accordingly, it is not always necessary to represent the output impedance of the vertical driver 1050 exponentially. However, the propagation properties represented with the temporal axis within the CCD solid-state image-capturing device 1060 serving as a capacitive reactance load generally include an exp factor, so in accordance therewith, if an exp factor as to the temporal axis is included in the output impedance of the vertical driver 1050, the transient properties of the output voltage Vout is smoothed, which is preferable.

Thus, in addition to the propagation properties represented with the temporal axis of the CCD solid-state image-capturing device 1060 including an exp factor, the impedance of the switches 1058 and 1059 is assigned so as to become small exponentially, such as the switches 1058_1, 1058_2, and so on through 1058_m, which is ideal.

Note that with the CCD solid-state image-capturing device, the electrode equivalent capacitance thereof varies greatly depending on the number of pixels, a process to be employed, or a layout shape (also referred to as device properties), and accordingly, the transient properties of the driving voltage by the existing vertical driver which were optimized as to a certain CCD solid-state image-capturing device are not always optimized as to another CCD solid-state image-capturing device. Therefore, a method is demanded wherein the transient properties of the driving voltage can be simply controlled depending on a CCD solid-state image-capturing device.

In order to realize such a method, it is desirable to set the impedance values of the respective switches 1058 and 1059 appropriately in accordance with the propagation properties of the CCD solid-state image-capturing device 1060 serving as a capacitive reactance load. Particularly, as illustrated in FIG. 32B, the lower the voltage in the output voltage Vout (t=0) is, i.e., the greater the initial value rso of impedance is, the more preferable the transient speed can be decreased, and accordingly, with the vertical driver 1050, the impedance of the switches 1058_1 and 1059_1 serving as the output impedance at the time of t=0 is set to the highest. Simply setting this impedance of the switches 1058_1 and 1059_1 appropriately enables the value of the output voltage Vout at the time of t=0 to be reduced sufficiently, whereby advantageous effects can be obtained as compared with the existing method.

However, even if an arrangement is thus made wherein the output impedance Zo of the vertical driver 1050 at the time of leading edge (t=0) and trailing edge (t=1) is increased, and also the output impedance Zo is decreased at time elapses, thereby driving the vertical transfer electrode 1012 using a low-speed driving pulse whose transient speed is slow, the output voltage Vout(0)=V·(R61/(R61+rs0)) or the output voltage Vout(1)=V(1−(R61/(R61+rs0)) still remains, so the vertical lines of crosstalk noise appear on an image due to the voltage variation thereof, and also the variation of the voltage during a transient period appears on an image.

For example, as described with reference to FIGS. 31A and 31B, with the CCD solid-state image-capturing device 1060 illustrated with an equivalent circuit, when driving the one electrode 1068 using the vertical driver 1050, the other driver 1070 is used for driving the other electrode 1069. Therefore, the transient variations of the driving voltage as to the other electrode 1069 interfere the driving voltage as to the one electrode 1068.

With the driving methods for delaying the transient speed which have been proposed in Japanese Unexamined Patent Application Publication No. 2005-269060 and Japanese Patent Application No. 2005-162034, as illustrated in FIG. 30(A) and FIG. 31B, an arrangement is made wherein the CCD solid-state image-capturing device is driven with four types of vertical transfer pulses ΦV whose phases differ, and accordingly, even if the CCD solid-state image-capturing device is driven with vertical transfer pulses ΦV whose transient speed is decreased, the noise components corresponding to the phase difference thereof appear, and consequently, crosstalk noise still remains.

On the other hand, as illustrated in FIG. 29(A) and FIG. 31C, any two of the vertical transfer electrodes 1012 are paired, vertical transfer pulses ΦVa and ΦVb having a reversed phase are supplied thereto respectively, thereby subjecting the vertical transfer pulses ΦV to complementary driving, and thus, the potential variations of the vertical transfer pulse ΦVa for driving the one electrode 1068, and the potential variations of the vertical transfer pulse ΦVb for driving the other electrode 1069 become reversed polarity mutually, which cancel out the potential variations each other, and consequently, the potential variations occurring due to the coupling capacitance between the vertical transfer electrodes 1012 and the PWELL-#2*b* or the semiconductor substrate SUB can be eliminated almost to zero.

In order to cancel out the potential variations each other by driving with reversed polarity, the symmetry of electrode configurations also presents a problem. In this point, as illustrated in FIG. 26, with the example of two-layer electrodes and the four-phase driving, the vertical transfer electrodes 1012 serving as an reversed-phase driving object are the vertical transfer electrodes 1012_1 and 1012_3 of the second layer to which the vertical transfer pulses ΦV_1 and ΦV_3 are supplied, or the vertical transfer electrodes 1012_2 and 1012_4 of the first layer to which the vertical transfer pulses ΦV_2 and ΦV_4 are supplied, and these are electrodes included in the first layer or second layer, and also the pattern shapes thereof are almost the same, and accordingly, the capacitance between both is balanced, and noise cancel effects due to complementary driving are readily obtained.

However, even in the case of a combination whose electric configurations are not well-balanced, matching the driving capabilities at the vertical driver 1050 side, i.e., substantially, adjusting the voltage amplitude enables a condition wherein crosstalk noise is minimal to be provided.

<Influence of Irregularities and Environmental Variations>

Thus, when driving the transfer electrode of the CCD solid-state image-capturing device 1010, a method for driving the transfer electrode using a low-speed transient speed is employed, in addition to this, complementary driving is applied thereto, whereby high-speed driving and noise suppression can be realized simultaneously.

However, as illustrated in FIG. 31A, with the driver circuit configuration wherein the output stage is divided, when attempting to generate a smooth low-speed pulse signal wherein the transient speed is decreased, with this circuit configuration, the properties such as the through rate of an output waveform and so forth are generated depending on the time constants which are unique for each element value, so in order to secure a design margin, no minimum output inclination being obtained, and steady driving force at the time of start of a transition though an arrangement is available wherein output driving force varies depending on load capacitance may present a problem.

Also, when driving capacitive reactance serving as a load using a low-speed pulse signal having a smooth moderate inclination, in order to maintain the inclination of the driving pulse as steady as possible, as described in Japanese Unexamined Patent Application Publication No. 2005-269060, an arrangement can be conceived to employ a method for simply driving load capacitance using a constant electric current, but simple driving using a constant electric current alone is not practical as an image-capturing system.

For example, the inclination of a driving pulse varies in proportional to the manufacturing irregularities of load capacitance and the manufacturing irregularities of driving elements. Further, like a CCD vertical driver, in the case of driving multiple channels, if there are the load capacitance between channels and the deviation of driving properties, resulting in a problem wherein the inclination of a pulse differs between channels in the same way.

Further, in order to reduce noise components such as a spike which readily occurs at the time of start of a transition, it is necessary to smooth a waveform to be input to the last driving circuit forward stage, and this increases an initial delay period until start of a transition of the last pulse output, and this delay period depends on the irregularities of load capacitance and the irregularities of driving elements.

As a result thereof, for example, in the event that the inclination of output varies greatly, there is concern that noise might remain on an image from the perspective of noise resistance of a CCD, and inversely, in the event that the inclination of output varies minutely, the transition is overlapped with the output to make the transition next, which may cause erroneous transfer.

In order to reduce such influence of the manufacturing irregularities of load capacitance and the manufacturing irregularities of driving elements, an effective arrangement can be conceived wherein a pulse signal in an actual working state is measured, and based on the measurement result thereof, feedback control is performed such that the transition properties of an actual working state such as the delay time of the output pulse waveform as to an input pulse, the through rate at the time of transition, and so forth are converged on the desired transition properties. In other words, an effective arrangement can be conceived to provide a shaping function by feedback control as to a pulse driving waveform. Description will be made below regarding a circuit configuration focusing attention on this point.

<<Feedback Control Shaping Function as to Pulse Driving Waveform>>

<Overall Basic Configuration>

Figure 33:
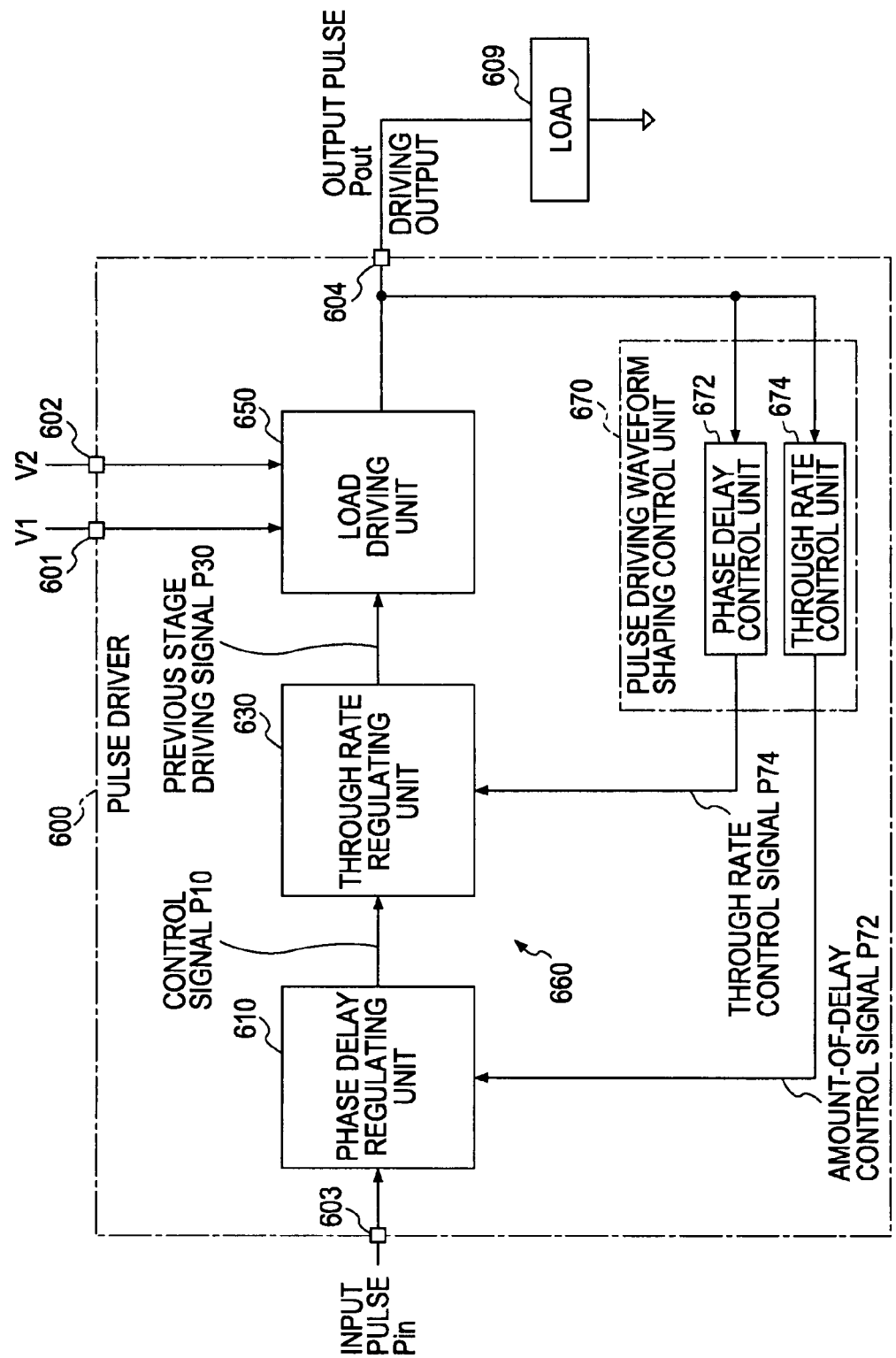
FIG. 33 is a diagram illustrating an overall schematic configuration example of a pulse driving device having a feedback control shaping function as to a pulse driving waveform.
Figure 34A:
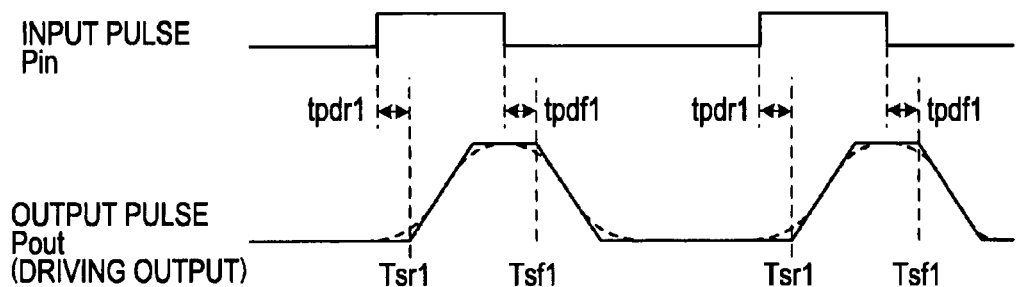
FIGS. 34A and 34B are timing charts (particularly focusing attention on a phase delay amount) describing the operations of the pulse driver illustrated in FIG. 33.
Figure 34B:
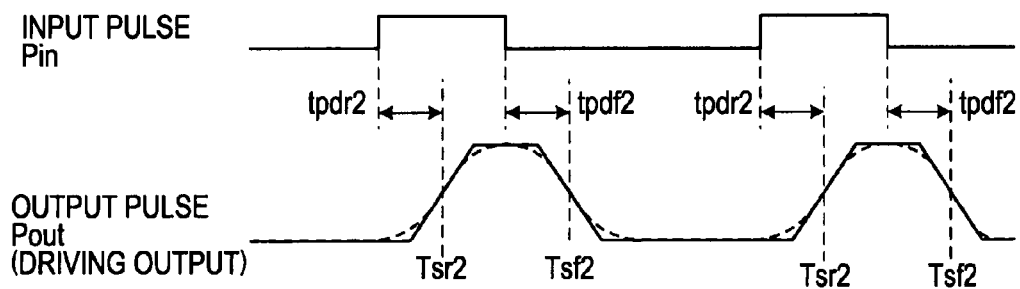
Figure 35A:
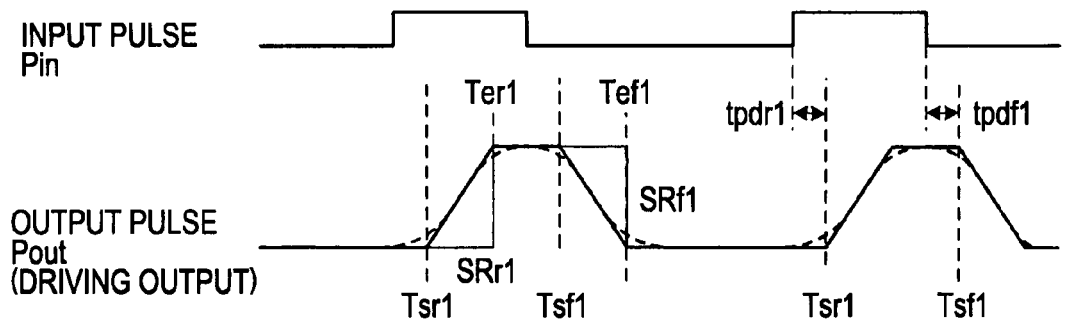
FIGS. 35A and 35B are timing charts (particularly focusing attention on inclination properties at the time of transition) describing the operations of the pulse driver illustrated in FIG. 33.
Figure 35B:
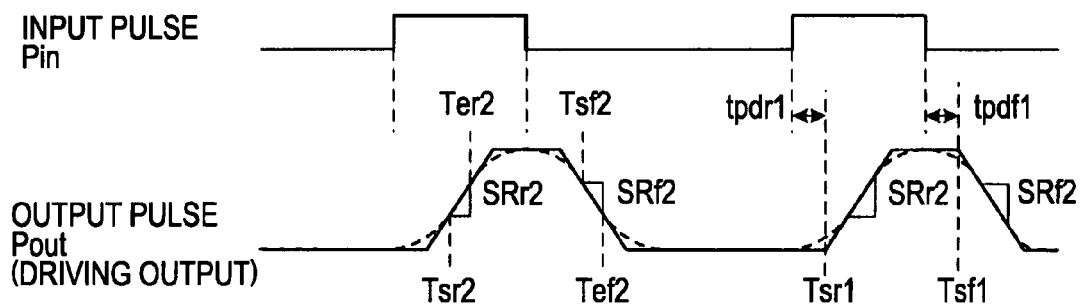

FIG. 33 is a diagram illustrating an overall schematic configuration example of a pulse driver serving as one example of a pulse driving device having a feedback control shaping function as to a pulse driving waveform. Also, FIGS. 34A and 34B, and FIGS. 35A and 35B are timing charts describing the operations of the pulse driver illustrated in FIG. 33. Here, FIGS. 34A and 34B are timing charts particularly describing the amount of phase delay in detail, and FIGS. 35A and 35B are timing charts particularly describing the inclination properties at the time of transition in detail.

As illustrated in FIG. 33, with a pulse driver 600, an arrangement is made wherein voltage V1 for regulating the potential at the high-level side of a driving pulse is input to a terminal 601, and also voltage V2 for regulating the potential at the low-level side of a driving pulse is input to a terminal 602. Also, with the pulse driver 600, an arrangement is made wherein an input pulse Pin having a logic level (e.g., 0 V/5 V or 0 V/3 V) supplied from a pulse signal generator whose drawing is omitted is input to a terminal 603, and also a load 609 having capacitive reactance or inductive reactance is connected to a terminal 604, and an output pulse Pout is generated at the terminal 604.

The pulse driver 600 includes a phase delay regulating unit 610 for regulating the transition timing of the input pulse Pin at a logic level input from the terminal 603, i.e., the amount of phase delay (one of the transition properties of an output pulse waveform at the terminal 604 serving as the connection portion with the load 609), a through rate regulating unit (variation properties regulating unit) 630 for generating a previous stage driving signal P30 in response to a control signal P10 from the phase delay regulating unit 610, and also regulating a through rate exhibiting the variation properties of the transition properties of an output pulse waveform at the terminal 604 serving as the connection portion with the load 609, and a load driving unit 650 for driving the load 609 based on the previous stage driving signal P30 output from the through rate regulating unit 630. The load driving unit 650 applies an output pulse Pout to the load 609 using the driving force based on the previous stage driving signal P30 supplied from the through rate regulating unit 630.

The phase delay regulating unit 610, through rate regulating unit 630, and load driving unit 650 make up a waveform shaping processing unit 660 for subjecting an input pulse signal to predetermined waveform shaping processing.

Also, the pulse driver 600 includes a pulse driving waveform shaping control unit 670 for performing feedback control such that the transition properties of an actual working state such as the delay time of the output pulse Pout at the terminal 604 as to the input pulse Pin, the through rate at the time of transition, and so forth are converged on the desired transition properties by monitoring the output pulse waveform at the terminal 604, and controlling the regulation functions of the phase delay regulating unit 610 and the through rate regulating unit 630 based on the monitoring results.

The pulse driving waveform shaping control unit 670 includes a phase delay control unit 672 serving as a functional element for controlling the phase delay regulating unit 610, and also a through rate control unit 674 serving as a functional element for controlling the through rate regulating unit 630.

The phase delay control unit 672 monitors the output pulse Pout at the terminal 604, and supplies an amount-of-delay control signal P72 to the phase delay regulating unit 610 such that the amount of delay of the output pulse Pout as to the input pulse Pin converges on a desired value (typically, such that erroneous difference as to specifications become zero), thereby performing feedback control.

The through rate control unit 674 monitors the output pulse Pout at the terminal 604, and supplies a through rate control signal P74 to the through rate regulating unit 630 such that the through rate exhibiting the variation properties of the output pulse Pout converges on a desired value (typically, such that erroneous difference as to specifications become zero), thereby performing feedback control.

The phase delay regulating unit 610 delays the input pulse Pin input from the terminal 603 by the period set externally or internally to supply the delayed control signal P10 to the through rate regulating unit 630.

Now, the phase delay regulating unit 610 can fixedly handle the amount of delay set once as well, and also can dynamically (depending on an actual working state) regulate the amount of delay based on the amount-of-delay control signal P72 from the phase delay control unit 672 of the pulse driving waveform shaping control unit 670. Note that description will be made later regarding a specific arrangement for enabling the amount of delay to be regulated.

As for a handling method at the time of setting the amount of delay of the control signal P10 as to the input pulse Pin, various concepts can be employed. For example, as illustrated in FIG. 34A, a technique can be conceived wherein the amount of delay tpdr1 from the leading edge point of the input pulse Pin to the transition starting point Tsr1 of the leading edge of the output pulse Pout (actual working pulse waveform in a state of driving the load 609; in the following is similar thereto) at the terminal 604, and the amount of delay tpdf1 from the trailing edge point of the input pulse Pin to the transition starting point Tsf1 of the trailing edge of the output pulse Pout are controlled.

In order to employ this technique at the time of the feedback control by the phase delay control unit 672, the phase delay control unit 672 detects the time when the output pulse Pout actually starts transition, compares the detection result with the reference value externally or internally set, supplies the amount-of-delay control signal P72 to the phase delay regulating unit 610 to sequentially update the setting value such that the erroneous difference converges on zero.

Alternatively, as illustrated in FIG. 34B, a technique can be conceived wherein the amount of delay tpdr2 from the leading edge point of the input pulse Pin to a predetermined potential point Tsr2 (e.g., around the middle point between the V1 and V2) during the leading edge transition period of the output pulse Pout, and the amount of delay tpdf2 from the trailing edge point of the input pulse Pin to a predetermined potential point Tsf2 during the trailing edge transition period of the output pulse Pout are controlled.

In order to employ this technique at the time of the feedback control by the phase delay control unit 672, the phase delay control unit 672 detects the time until the output pulse Pout reaches predetermined potential points Tsr2 and Tsf2 following start of a transition, compares the detection result with the reference value externally or internally set, supplies the amount-of-delay control signal P72 to the phase delay regulating unit 610 to sequentially update the setting value such that the erroneous difference converges on zero.

Now, with the former technique, it is necessary to determine the transition starting points Tsr1 and Tsf1 of the pulse waveform in an actual working state at the terminal 604, but in reality, as illustrated with a dotted line in FIG. 34A, a variation starts moderately, so it is difficult to determine the transition starting points Tsr1 and Tsf1 using actual measurement with high accuracy, and in reality, realization will most likely be difficult. On the other hand, with the latter technique, all that is required is to determine the time until the relatively stable predetermined potential points Tsr2 and Tsf2 following start of a transition, and realization thereof should be easy.

Note that even in the event of employing either technique, the amount of delay tpdr1 and tpdr2 at the leading edge side, and the amount of delay tpdf1 and tpdf2 at the trailing edge side may be settable commonly, or may be settable independently.

The through rate regulating unit 630 regulates the amplitude of the previous stage driving signal P30 supplied to the load driving unit 650, thereby regulating the through rate at a point (terminal 604) where the load driving unit 650 drives the load 609.

Specifically, when detecting the output transition (each start of the leading edge and trailing edge) of the control signal P10, whose amount of delay was regulated, output from the phase delay regulating unit 610, the through rate regulating unit 630 supplies the previous stage driving signal P30 having the properties corresponding to the load driving force of the load driving unit 650 to the load driving unit 650. The previous stage driving signal P30 is a signal for causing the output pulse Pout at the terminal 604 to become the desired through rate properties in light of the relation between the load driving unit 650 and the load 609, when the load driving unit 650 drives the load 609. In the event of handling the load 609 having no resistance element but capacitive reactance or inductive reactance, the integration effects with the load 609 are considered, so as illustrated in FIGS. 34A and 34B, and FIGS. 35A and 35B, the previous stage driving signal P30 becomes a signal having different properties from the output pulse Pout itself.

Now, the through rate regulating unit 630 can fixedly handle the through rate set once, but can regulate the through rate dynamically (depending on an actual working state) based on the through rate control signal P74 from the through rate control unit 674 of the pulse driving waveform shaping control unit 670. Note that description will be made later regarding a specific arrangement for enabling the through rate to be regulated.

As for a handling method at the time of setting the trough rate as to the control signal P10, various concepts can be employed. For example, as illustrated in FIG. 35A, a technique can be conceived wherein the variation properties (through rate) SRr1 from the potential of the leading edge starting point Tsr1 of the output pulse Pout to the potential of the leading edge ending point Ter1, and the variation properties (through rate) SRf1 from the potential of the trailing edge starting point Tsf1 of the output pulse Pout to the potential of the trailing edge ending point Tef1 are controlled.

Alternatively, as illustrated in FIG. 35B, a technique can be conceived wherein the variation properties (through rate) SRr2 between two of predetermined potential points Tsr2 (e.g., around ⅓ at the lower side of the V1 through V2) and Ter2 (e.g., around ⅓ at the upper side of the V1 through V2) during the leading edge transition period of the output pulse Pout, and the variation properties (through rate) SRf2 between two of predetermined potential points Tsf2 (e.g., around ⅓ at the upper side of the V1 through V2) and Tef2 (e.g., around ⅓ at the lower side of the V1 through V2) during the trailing edge transition period of the output pulse Pout are controlled.

In order to employ these techniques at the time of the feedback control by the through rate control unit 674, the through rate control unit 674 detects the amount equivalent to the variation rate between the two potentials of the output pulse Pout, compares the detection result with the reference value externally or internally set, supplies the through rate control signal P74 to the through rate regulating unit 630 to sequentially update the setting value such that the erroneous difference converges on zero.

Now, with the former technique, as can be estimated from the problems in the amount of delay tpdr1 at the leading edge side and the amount of delay tpdf1 at the trailing edge side, it is necessary to determine the transition starting points Tsr1 and Tsf1, and the transition ending points Ter1 and Tef1 of the pulse waveform in an actual working state at the terminal 604, but in reality, as illustrated with a dotted line in FIG. 35A, a variation starts moderately and ends moderately in some cases, though not shown in the drawing, high-frequency noise is sometimes superimposed around the transition starting point, so it is difficult to determine the starting points and ending points thereof using actual measurement with high accuracy, and in reality, realization thereof will most likely be difficult. On the other hand, the latter technique corresponds to the amount of delay tpdr2 at the leading edge side and the amount of delay tpdf2 at the trailing edge side, and all that is required is to determine the variation properties between the two relatively stable potentials following start of a transition, realization thereof should be easy.

Note that even in the event of employing either technique, the through rates SRr1 and SRr2 at the leading edge side, and the through rates SRf1 and SRf2 at the trailing edge side may be settable commonly, or may be settable independently.

Note that the phase delay control unit 672 can also estimate the leading edge transition starting point Tsr1 and the trailing edge transition starting point Tsf1 of the output pulse Pout based on the through rate SRr2 between two predetermined potentials at the leading edge transition process of the output pulse Pout, and the through rate SRf2 between two predetermined potentials at the trailing edge transition process of the output pulse Pout, which are obtained at the through rate control unit 674. This is because as illustrated at the right side of the output pulse Pout in FIG. 35B, the leading edge transition starting point Tsr1 and the trailing edge transition starting point Tsf1 can be found on the extension between the two points wherein the through rates SRr2 and SRf2 are obtained.

Note that with the present configuration example, an arrangement has been made wherein feedback control is performed regarding both of the delay amount and variation properties (through rate at the time of a transition) as to the input pulse Pin of the output pulse Pout at the terminal 604, but when it is not necessary to severely control both of the delay amount and variation properties, an arrangement may be made wherein feedback control is performed regarding either of these, which is required.

Note that in the event that the delay amount at the time of a leading edge and the delay amount at the time of a trailing edge vary unevenly, these variations affects a through rate, and moreover, the properties of the leading edge starting point and the trailing edge starting point vary depending on a through rate, and consequently, the delay amount is affected, or the like, so actually, the delay amount and variation properties sometimes affect each other, and accordingly, it is desirable to employ an arrangement wherein feedback control is performed regarding both.

The pulse driver 600 having such a configuration monitors the output pulse Pout in an actual working state at the terminal 604 when the load driving unit 650 is driving the load 609 using the pulse driving waveform shaping control unit 670, and performs feedback control such that the transition properties of the output pulse Pout, such as the delay amount, variation properties, and so forth as to the input pulse Pin become the desired properties.

Therefore, the transition properties of the output pulse Pout can be prevented from receiving the influence of the manufacturing irregularities of the load 609, and the manufacturing irregularities of the driving elements provided on the output stage of the load driving unit 650, whereby the load 609 can be pulse-driven in a state of having appropriate transition properties. Also, the transition properties of the output pulse Pout can be prevented from receiving the influence of the variations of environmental conditions such as temperature, humidity, and so forth.

When the driving force of the load driving unit 650, or the properties (equivalent input capacitance or equivalent input inductance) of the load 609 varies due to the parasitic components (parasitic capacitance and parasitic inductance) which is difficult to consider these at a design stage, the irregularities at manufacturing processes, or environmental variations such as temperature variations, humidity variations, and so forth, the delay amount of the output pulse Pout as to the input pulse Pin can be regulated, or the inclination of the output pulse Pout can be regulated such that the transition properties (delay amount and through rate) of the driving output can satisfy the specifications.

Employing the configuration example of the present embodiment enables the circuit for driving the reactance load to change a driving signal with steady delay amount and inclination regardless of the irregularities of load properties and driving properties, and environmental variations. Even in the event that the output timing is stipulated for the convenience of system specifications and the load 609, a driving waveform having the minimum erroneous difference as to the specifications regarding the delay amount and through rate and reproducibility is obtained.

<Load Driving Unit; Capacitive Reactance Load>

Figure 36:
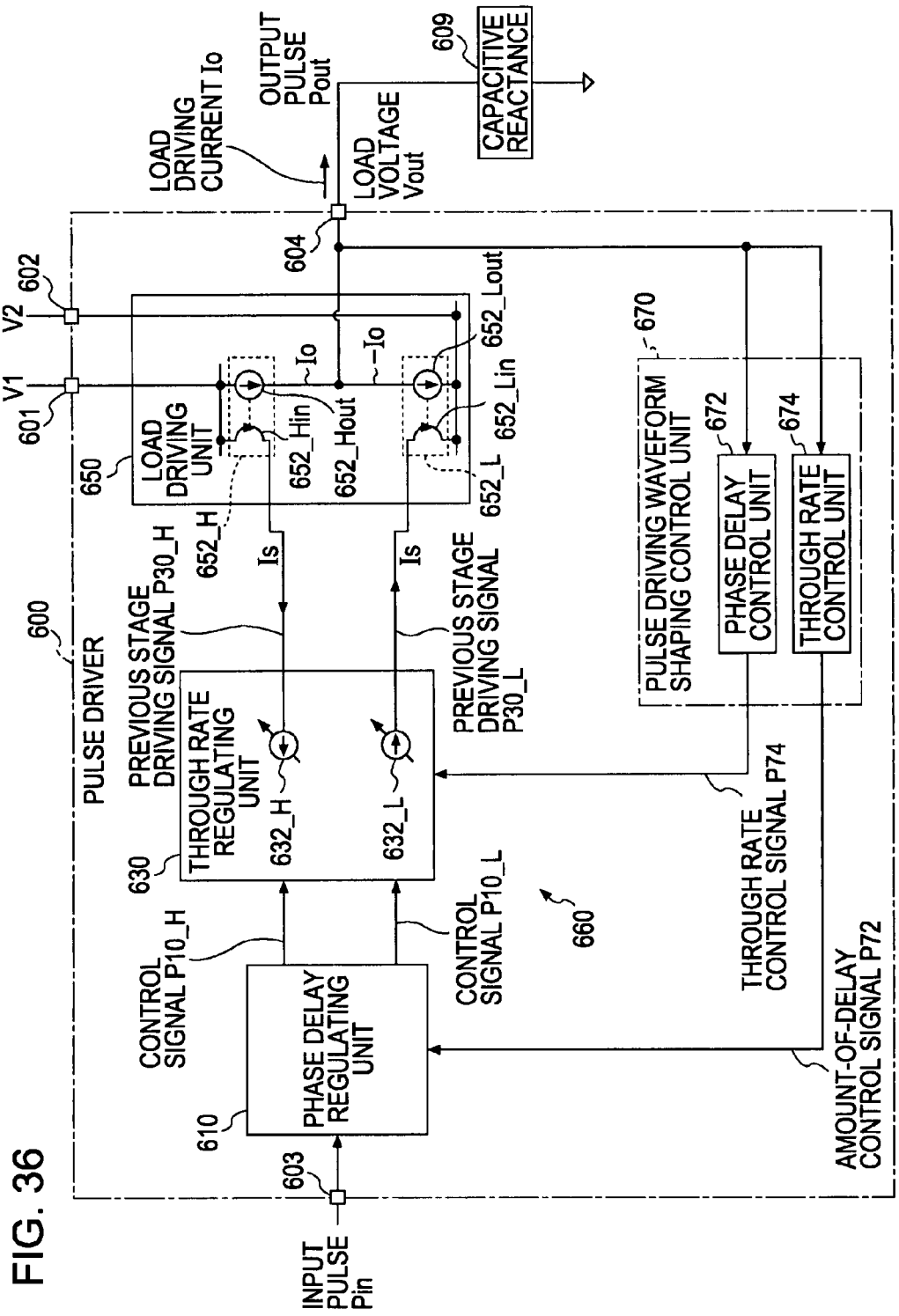
FIG. 36 is a diagram describing a detailed configuration example applied to the capacitive reactance load driving of the pulse driver illustrated in FIG. 33.
Figure 37:
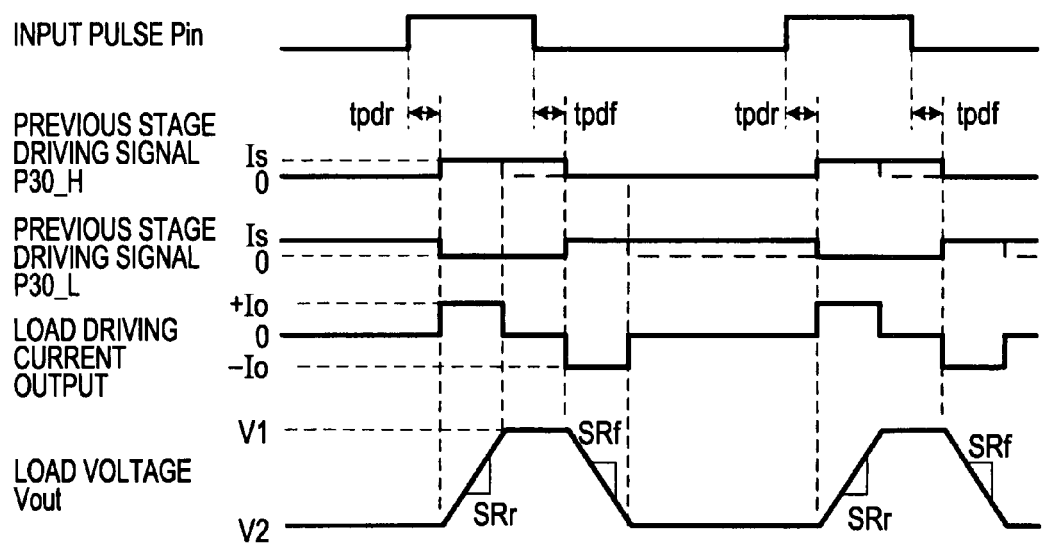
FIG. 37 is a timing chart describing the operations of the pulse driver in FIG. 36.

FIG. 36 is a diagram describing a configuration example principally focusing attention on the detailed configuration of the load driving unit 650 which is applied to the case of driving the load 609 having capacitive reactance of the pulse driver 600 illustrated in FIG. 33. Also, FIG. 37 is a timing chart describing the operations of the pulse driver 600 illustrated in FIG. 36.

In the case of driving the load 609 having capacitive reactance, the load driving unit 650 is realized by including electric-current output circuits so as to subject the load 609 to electric-current driving. Also, correspondingly, the through rate regulating unit 630 is configured so as to supply the previous stage driving signal P30 suitable for electric-current driving at the load driving unit 650 to the load driving unit 650.

Specifically, first, the through rate regulating unit 630 includes electric-current output units 632_H and 632_L for outputting previous stage driving signals P30_H and P30_L, which represent a reference electric current Is determining the inclination of the leading edge or trailing edge of the output pulse Pout, and have a mutually complementary relation, to the load driving unit 650.

Also, the load driving unit 650 includes a current mirror circuit 652_H for receiving the supply of the voltage V1 stipulating the potential at the high level side to be supplied to the terminal 601, and feeding a constant electric current Io to the terminal 604, and a current mirror circuit 652_L for receiving the supply of the voltage V2 stipulating the potential at the low level side to be supplied to the terminal 602, and absorbing the constant electric current Io from the terminal 604. That is to say, the load driving unit 650 is made up of the vertical pair of the current mirror circuits 652_H and 652_L.

The output stage 652_Hout of the current mirror circuit 652_H, and the output stage 652_Lout of the current mirror circuit 652_L are connected at a connection point 656 (equivalent to an electric-current addition unit), and connected to the load 609 via the terminal 604. The input stage 652_Hin of the current mirror circuit 652_H is connected to the electric-current output unit 632_H of the through rate regulating unit 630, and also the input stage 652_Lin of the current mirror circuit 652_L is connected to the electric-current output unit 632_L of the through rate regulating unit 630.

A control signal P10_H corresponding to the delay amount at the time of rising, and a control signal P10_L corresponding to the delay amount at the time of falling are separately supplied to the through rate regulating unit 630 from the phase delay regulating unit 610.

The through rate regulating unit 630 supplies a previous stage driving signal P30_H in accordance with the control signal P10_H to the input stage 652_Hin of the current mirror circuit 652_H via the electric-current output unit 632_H, and also supplies a previous stage driving signal P30_L in accordance with the control signal P10_L to the input stage 652_Lin of the current mirror circuit 652_L via the electric-current output unit 632_L.

According to employing such a configuration, first, the through rate regulating unit 630 outputs the previous stage driving signals P30_H and P30_L representing the reference current Is determining the inclination of the leading edge or trailing edge of the output pulse Pout to the load driving unit 650. The load driving unit 650 is made up of the vertical pair of the current mirror circuits 652_H and 652_L, and thus the rising and falling reference currents Is occurring at the through rate regulating unit 630 are multiplied by a constant (×NH, ×NL), and also are looped back to supply the output electric current Iout to the load 609 having capacitive reactance.

Note that actually, the output electric current Iout_H (=+Io) is fed in the load 609 from the upper-side current mirror circuit 652_H (source operation), and the lower-side current mirror circuit 652_L absorbs the output electric current Iout_L (=−Io) from the load 609 (sink operation).

The load voltage Vout occurring at the terminal 604 becomes a value obtained by integrating the output electric current Iout supplied to the load 609, and dividing this by the capacitance value of the load 609, so as illustrated in FIG. 37, if a constant electric current is continuously applied to the load 609 (capacitance load) having capacitive reactance during a transition period, the load voltage Vout varies linearly until the load voltage Vout reaches the power source potential V1 of the current mirror circuit 652_H or the power source potential V2 of the current mirror circuit 652_L.

Note that when the load voltage Vout reaches the power source potential V1, the output stage 652_Hout of the upper-side current mirror circuit 652_H loses constant current properties, and is connected to the power source potential V1 via an equivalent resistance, so the load voltage Vout is fixed to the power source potential V1. Inversely, when the load voltage Vout reaches the power source potential V2, the output stage 652_Lout of the lower-side current mirror circuit 652_L loses constant current properties, and is connected to the power source potential V2 via an equivalent resistance, so the load voltage Vout is fixed to the power source potential V2.

Therefore, as for the previous stage driving signal P30_H supplied from the electric-current output unit 632_H of the through rate regulating unit 630 to the current mirror circuit 652_H, all that is required is to supply the reference electric current Is to the input stage 652_Hin during a period from the rising starting point of the output pulse Pout until the load voltage Vout reaches the power source potential V1 in a sure manner (actually sink operation), and also stop the supply of the reference electric current Is to the input stage 652_Hin before the lower-side current mirror circuit 652_L starts to operate.

Also, as for the previous stage driving signal P30_L supplied from the electric-current output unit 632_L of the through rate regulating unit 630 to the current mirror circuit 652_L, all that is required is to supply the reference electric current Is to the input stage 652_Lin during a period from the falling starting point of the output pulse Pout until the load voltage Vout reaches the power source potential V2 in a sure manner (actually source operation), and also stop the supply of the reference electric current Is to the input stage 652_Lin before the upper-side current mirror circuit 652_H starts to operate.

The output pulse Pout, i.e., the variation properties of the load voltage Vout are stipulated with the driving electric-current Io (source electric-current Io and sink electric-current Io) supplied to the load 609, the driving electric current Io is stipulated with the reference electric current Is (sink electric current Is and source electric current Is) output from the electric-current output units 632_H and 632_L of the through rate regulating unit 630, and the reference electric current Is is stipulated with the through rate control signal P74. Accordingly, the variation properties (through rate) of the load voltage Vout can be varied by regulating the through rate control signal P74 at the time of feedback control.

Feedback control can be done wherein a load having capacitive reactance is employed as the load 609, and while this capacitive reactance load is driven with the constant electric current Io using the current mirror circuits 652_H and 652_L at the time of an output transition, the output pulse Pout is monitored with the pulse driving waveform shaping control unit 670. For example, according to the control function of the phase delay control unit 672, the load voltage Vout of the output pulse Pout can be controlled so as to become a steady delay amount as to the input pulse Pin. Also, according to the control function of the through rate control unit 674, the load voltage Vout of the output pulse Pout can be controlled so as to make the transition with a certain through rate.

According to employing the configuration example illustrated in FIG. 36, with a circuit for driving a capacitive reactance load, a driving signal (load voltage signal) can vary with steady delay amount and inclination regardless of the irregularities of load capacitance and driving properties, and environmental variations. Even in the event that the output timing is stipulated for the convenience of system specifications and a driven element serving as the load 609 (specifically, transfer electrode or the like), a driving waveform having the minimum erroneous difference as to the specifications regarding the delay amount and through rate and reproducibility is obtained.

<Load Driving Unit; Inductive Reactance Load>

Figure 38:
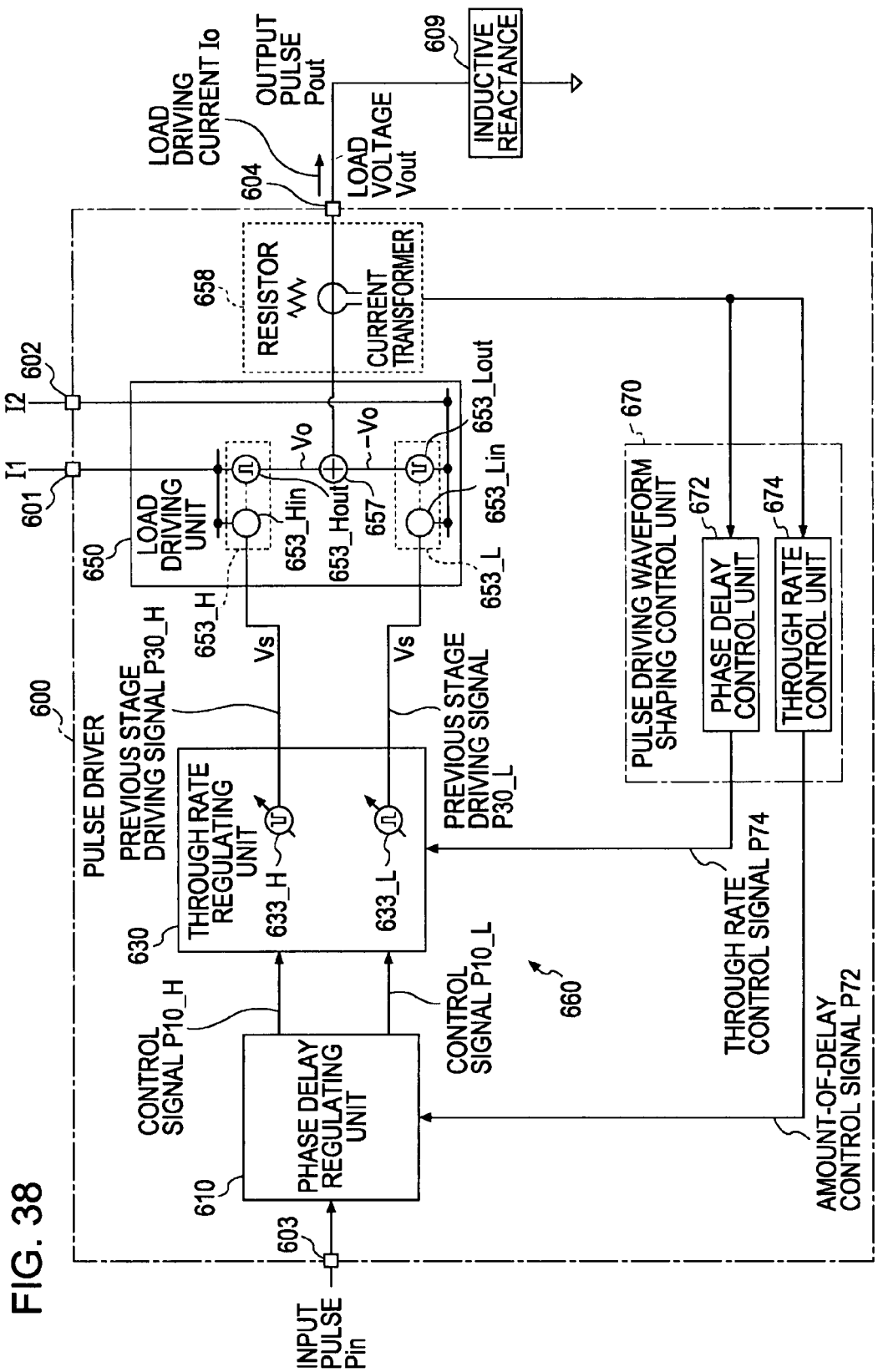
FIG. 38 is a diagram describing a detailed configuration example applied to the inductive reactance load driving of the pulse driver illustrated in FIG. 33.
Figure 39:
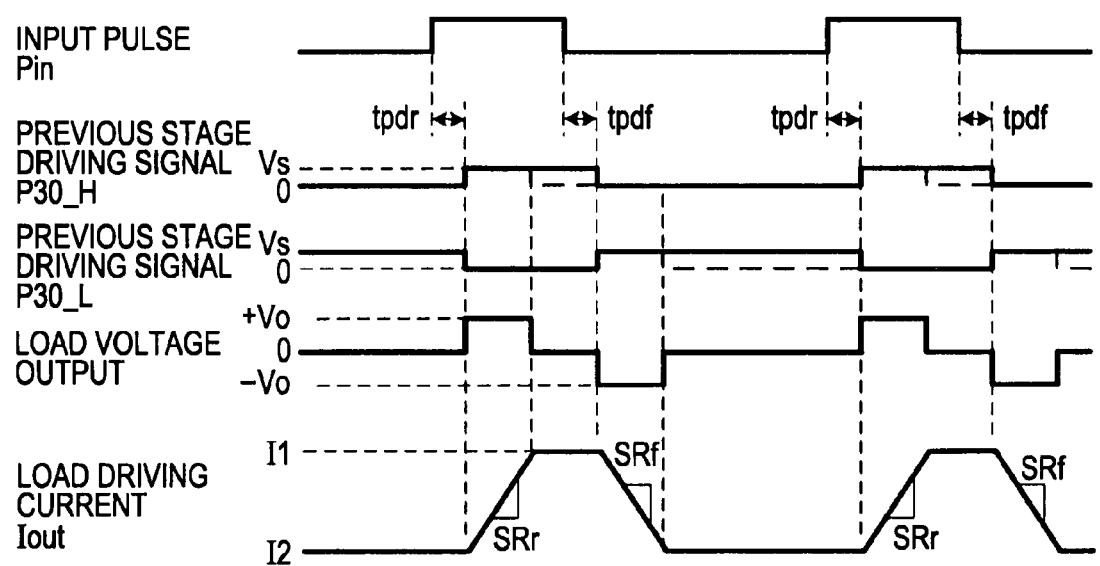
FIG. 39 is a timing chart describing the operations of the pulse driver in FIG. 38.

FIG. 38 is a diagram describing a configuration example principally focusing attention on the detailed configuration of the load driving unit 650 which is applied to the case of driving the load 609 having inductive reactance of the pulse driver 600 illustrated in FIG. 33. Also, FIG. 39 is a timing chart describing the operations of the pulse driver 600 illustrated in FIG. 38.

In the case of driving the load 609 having inductive reactance, it is necessary to employ a circuit having the duality configuration as to the configuration for driving the load 609 having capacitive reactance. Specifically, the load driving unit 650 is realized by including voltage output circuits so as to subject the load 609 to voltage driving. Also, correspondingly, the through rate regulating unit 630 is configured so as to supply the previous stage driving signal P30 suitable for voltage driving at the load driving unit 650 to the load driving unit 650.

Specifically, first, the through rate regulating unit 630 includes voltage output units 633_H and 633_L for outputting previous stage driving signals P30_H and P30_L, which represent reference voltage Vs determining the inclination of the leading edge or trailing edge of the output pulse Pout, and have a mutually complementary relation, to the load driving unit 650.

Also, the load driving unit 650 includes a constant-voltage output circuit 653_H for receiving the supply of electric current I1 stipulating the electric current at the high level side to be supplied to the terminal 601, and providing constant voltage Vo to the terminal 604, and a constant-voltage output circuit 653_L for receiving the supply of electric current I2 stipulating the electric current at the low level side to be supplied to the terminal 602, and providing constant voltage Vo to the terminal 604. That is to say, the load driving unit 650 is made up of the vertical pair of the constant-voltage output circuits 653_H and 653_L.

Note that an arrangement may be made wherein a circuit for providing the voltage V1 to the terminal 601, and supplying the constant electric current I1 to the constant-voltage output circuit 653_H is inserted in the terminal 601, and also a circuit for providing the voltage V2 to the terminal 602, and supplying the constant electric current I2 to the constant-voltage output circuit 653_L is inserted in the terminal 602.

A voltage addition unit 657 is provided between the output stage 653_Hout of the constant-voltage output circuit 653_H and the output stage 653_Lout of the constant-voltage output circuit 653_L. The voltage addition unit 657 which adds upper voltage and lower voltage is configured so as to be connected to the terminal 604. The input stage 653_Hin of the constant-voltage output circuit 653_H is connected to the voltage output unit 633_H of the through rate regulating unit 630, and also the input stage 653_Lin of the constant-voltage output circuit 653_L is connected to the voltage output unit 633_L of the through rate regulating unit 630.

Also, a load electric-current detection unit 658 is provided between the load driving unit 650 and the load 609. This detection unit is for enabling feedback control to be performed wherein the pulse driving waveform shaping control unit 670 monitors the load driving electric current between the load driving unit 650 and the terminal 604 such that the transition properties in an actual working state such as the delay time of the output pulse Pout at the terminal 604 as to the input pulse Pin, the through rate at the time of a transition, and so forth are converged on the desired transition properties.

As for the configuration of the load electric-current detection unit 658, all that is required is to propagate the detection signal corresponding to load driving electric current to the pulse driving waveform shaping control unit 670, for example, as illustrated functionally in the drawing, various types of method can be employed, such as detecting electric current itself using a current transformer, or using an electric-current voltage conversion function for inserting an electric-current detection resistance, and detecting both end voltage thereof, or the like. In the case of detecting electric current itself, it is necessary for the pulse driving waveform shaping control unit 670 to convert the detection electric current into a voltage signal, and process this voltage signal.

Note that in the case of providing a vertical driver by means of an IC, it is difficult to provide a current transformer within the IC, and also it is difficult to complete all related wirings within the IC, so actually, a current transformer is provided between the terminal 604 and the load 609, and the detection signal thereof is taken into the pulse driving waveform shaping control unit 670 within the IC. On the other hand, in the event of inserting an electric-current detection resistance, the electric-current detection resistance can be inserted between the voltage addition unit 657 and the terminal 604, and accordingly, all related wirings can be completed within the IC.

The constant-voltage output circuits 653_H and 653_L need to have a circuit configuration to serve as dual circuits as the current mirror circuits 652_H and 652_L, such as a configuration wherein the input voltage input to the input stages 653_Hin and 653L_in is multiplied by a constant to output this to the output stages 653_Hout and 653_Lout. Any circuit configuration may be employed as long as the above requirement is satisfied.

According to employing such a configuration, first, the through rate regulating unit 630 outputs the previous stage driving signals P30_H and P30_L representing the reference voltage Vs determining the inclination of the leading edge or trailing edge of the output pulse Pout to the load driving unit 650. The load driving unit 650 is made up of the vertical pair of the constant-voltage output circuits 653_H and 653_L, and thus the rising and falling reference voltage Vs occurring at the through rate regulating unit 630 are multiplied by a constant (×NH, ×NL), and also are looped back to supply the output voltage Vout to the load 609 having inductive reactance.

Note that in reality, the output voltage Vout_H (=+Vo) is applied to the load 609 from the upper-side constant-voltage output circuit 653_H (source operation), and the output voltage Vout_L (=−Vo) to the load 609 from the lower-side constant-voltage output circuit 653_L (sink operation).

The load electric current Iout occurring at the terminal 604 is a value obtained by integrating the output voltage Vout supplied to the load 609, and dividing this by the inductance value of the load 609, so as illustrated in FIG. 39, if a constant voltage is continuously applied to the load 609 (inductive load) having inductive reactance during a transition period, the load electric current Iout varies linearly until the load electric current Iout reaches the power source electric current I1 of the constant-voltage output circuit 653_H or the power source electric current I2 of the constant-voltage output circuit 653_L.

Note that when the load electric current Iout reaches the power source electric current I1, the output stage 653_Hout of the upper-side constant-voltage output circuit 653_H loses constant voltage properties, and is connected to the power source electric current I1 via an equivalent resistance, so the load electric current Iout is fixed to the power source electric current I1. Inversely, when the load electric current Iout reaches the power source electric current I2, the output stage 653_Lout of the lower-side constant-voltage output circuit 653_L loses constant voltage properties, and is connected to the power source electric current I2 via an equivalent resistance, so the load electric current Iout is fixed to the power source electric current I2.

Therefore, as for the previous stage driving signal P30_H supplied from the voltage output unit 633_H of the through rate regulating unit 630 to the constant-voltage output circuit 653_H, all that is required is to supply the reference voltage Vs to the input stage 653_Hin during a period from the rising starting point of the output pulse Pout until the load electric current Iout reaches the power source electric current I1 in a sure manner (actually sink operation), and also stop the supply of the reference voltage Vs to the input stage 653_Hin before the lower-side constant-voltage output circuit 653_L starts to operate.

Also, as for the previous stage driving signal P30_L supplied from the voltage output unit 633_L of the through rate regulating unit 630 to the constant-voltage output circuit 653_L, all that is required is to supply the reference voltage Vs to the input stage 653_Lin during a period from the falling starting point of the output pulse Pout until the load electric current Iout reaches the power source electric current I2 in a sure manner (actually source operation), and also stop the supply of the reference voltage Vs to the input stage 653_Lin before the upper-side constant-voltage output circuit 653_H starts to operate.

Feedback control can be done wherein a load having inductive reactance is employed as the load 609, and while this inductive reactance load is driven with the constant voltage Vo using the constant-voltage output circuits 653_H and 653_L at the time of an output transition, the output pulse Pout is monitored with the pulse driving waveform shaping control unit 670. For example, according to the control function of the phase delay control unit 672, the load electric current Iout of the output pulse Pout can be controlled so as to become a steady delay amount as to the input pulse Pin. Also, according to the control function of the through rate control unit 674, the load electric current Iout of the output pulse Pout can be controlled so as to make the transition with a certain through rate.

According to employing the configuration example illustrated in FIG. 38, with a circuit for driving a inductive reactance load, a driving signal (load electric current signal) can vary with steady delay amount and inclination regardless of the irregularities of load inductance and driving properties, and environmental variations. Even in the event that the output timing is stipulated for the convenience of system specifications and a driven element serving as the load 609 (specifically, motor coil or the like), a driving waveform having the minimum erroneous difference and reproducibility as to the specifications regarding the delay amount and through rate is obtained.

<Configuration Examples of Phase Delay Regulating Unit and Through Rate Regulating Unit>

Figure 40:
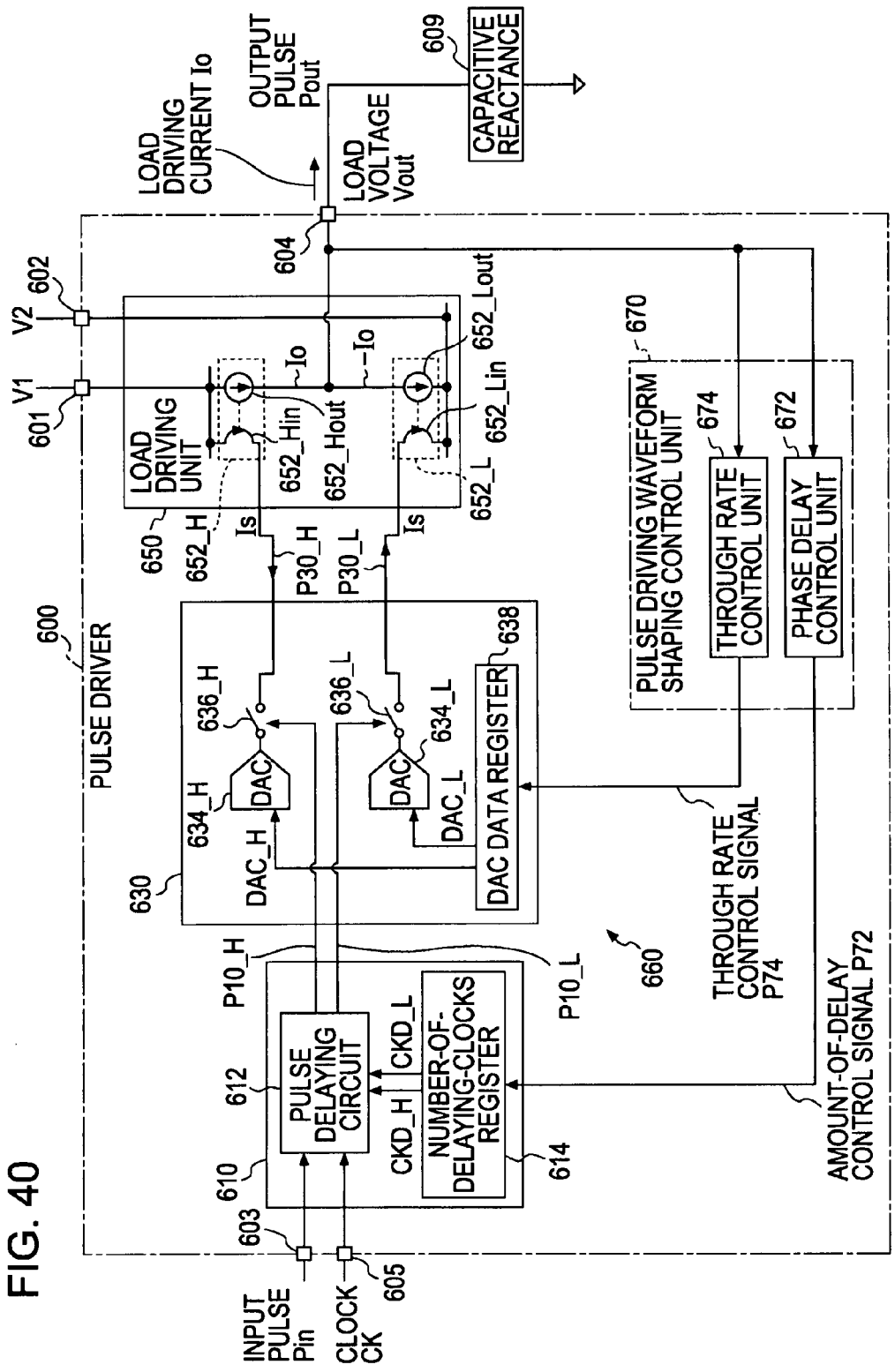
FIG. 40 is a diagram describing a configuration example principally focusing attention on the detailed configurations of a phase delay regulating unit and a through rate regulating unit, of the pulse driver illustrated in FIG. 33.

FIG. 40 is a diagram describing a configuration example principally focusing attention on the detailed configurations of the phase delay regulating unit 610 and the through rate regulating unit 630, of the pulse driver 600 illustrated in FIG. 33. Also, FIG. 41 a timing chart describing the operations of the pulse driver 600 illustrated in FIG. 40.

Note here that the load driving unit 650 is illustrated by employing the configuration illustrated in FIG. 36 adapted to the case of driving the load 609 having capacitive reactance, but the respective detailed configuration examples of the phase delay regulating unit 610 and the through rate regulating unit 630 can be applied to the configuration illustrated in FIG. 38 adapted to the case of driving the load 609 having inductive reactance as well.

First, the pulse driver 600 is provided with a terminal 605 to which a clock signal CK is input. The phase delay regulating unit 610 includes a pulse delaying unit 612 having a function wherein the input pulse Pin (logic input) which is input to the terminal 601 is delayed by the number of clocks externally set to output the delayed input pulse with reference to the clock signal CK input via the terminal 605, and a number-of-delaying-clocks register 614 for storing each number of clocks (number of delaying clocks) stipulated separately by the delay amount at the time of rising, and the delay amount at the time of falling regarding the amount of delay at the pulse delaying unit 612. The number-of-delaying-clocks register 614 sets the stored number of delaying clocks CKD_H and CKD_L to the pulse delaying unit 612.

Figure 41:
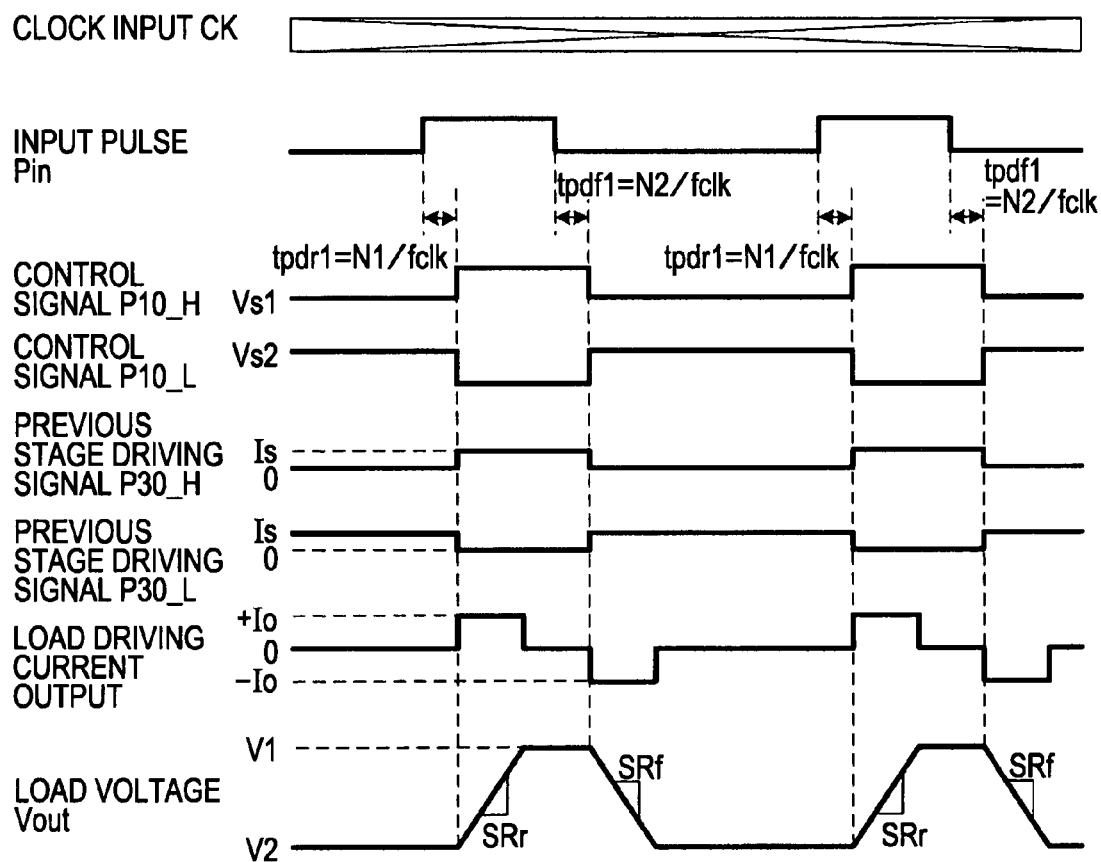
FIG. 41 is a timing chart describing the operations of the pulse driver in FIG. 40.

As illustrated in FIG. 41, the delay amount at the time of rising tpdr (tpdr1 in the drawing) is the value obtained by dividing the number of delaying clocks CKD_H (=N1) by the frequency fCLK of the clock signal CK, and the delay amount at the time of falling tpdf (tpdf1 in the drawing) is the value obtained by dividing the number of delaying clocks CKD_L (=N2) by the frequency fCLK of the clock signal CK. Thus, the amount of delay can be regulated with a digital value such as the number of clocks, thereby facilitating handling.

The pulse delaying unit 612 outputs an active-high control signal P10_H (=Vs1) which rises at the point delayed by the delay amount tpdr from the rising point of the input pulse Pin, and falls at the point delayed by the delay amount tpdf from the falling point of the input pulse Pin, and a logically inverted active-high control signal P10_L (=Vs2) as to the control signal P10_H (=Vs1).

Now, the number-of-delaying-clocks register 614 can supply the number of delaying clocks CKD_H and CKD_L set once such as register initial setting values CKD_Hini and CKD_Lini set internally or externally, or the like to the pulse delaying unit 612 fixedly, but can also dynamically regulate the number of delaying clocks CKD_H and CKD_L based on the amount-of-delay control signal P72 from the phase delay control unit 672 of the pulse driving waveform shaping control unit 670. The register initial setting values CKD_Hini and CKD_Lini may be held internally in the number-of-delaying-clocks register 614 beforehand, or may be settable externally.

Note that "dynamically" means that the contents of regulation is based on the detection result of the amount of delay as to the input pulse Pin (may be an actual measurement value or estimated value) of the actual output pulse Pout at the terminal 604. The phase delay control unit 672 increases or decreases the number of delaying clocks CKD_H and CKD_L using the amount-of-delay control signal P72 such that the amount of delay in an actual working state is always the desired amount of delay.

At the time of feedback control, the amount of delay can be regulated with a digital value such as the number of clocks, and the control information for controlling the phase delay regulating unit 610 can be handled with digital data, thereby facilitating handling of regulation.

The through rate regulating unit 630 includes a DA converter (DAC) 634_H and a switchover unit (switch means) 636_H for rising control, and also includes a DA converter (DAC) 634_L and a switchover unit (switch means) 636_L for falling control.

Also, the through rate regulating unit 630 includes a DAC data register 638 for storing reference data DAC_H and DAC_L for stipulating the reference electric current Is as to the DA converters 634_H and 634_L. The DAC register 638 sets the stored reference data DAC_H and DAC_L to the corresponding DA converters 634_H and 634_L. The DA converters 634_H and 634_L generate the reference electric current (Is at the source side and Is at the sink side) corresponding to the reference data DAC_H and DAC_L which were set. Note that the reference electric current at the source side and the reference electric current at the sink side may be the same or differ regarding the absolute values thereof.

Though not illustrated in the drawing, the output stage of the DA converter 634_H is provided with the electric-current output unit 632_H illustrated in FIG. 36, and also the output stage of the DA converter 634_L is provided with the electric-current output unit 632_L illustrated in FIG. 36.

Now, the DAC data register 638 can also supply the reference data DAC_H and DAC_L set once such as the register initial setting values DAC_Hini and DAC_Lini or the like to the DA converters 634_H and 634_L fixedly, but can also dynamically regulate the reference data DAC_H and DAC_L based on the through rate control signal P74 from the through rate control unit 674 of the pulse driving waveform shaping control unit 670. The register initial setting values DAC_Hini and DAC_Lini may be held internally in the DAC data register 638 beforehand, or may be settable externally.

Note that "dynamically" means that the contents of the regulation is based on the detection result of the through rate of the actual output pulse Pout at the terminal 604. The through rate control unit 674 increases or decreases the reference data DAC_H and DAC_L using the through rate control signal P74 such that the through rate in an actual working state constantly exhibits a desired value.

The output pulse Pout, i.e., the variation properties of the load voltage Vout are stipulated with the driving electric-current Io (source electric-current Io and sink electric-current Io) supplied to the load 609, the driving electric current Io is stipulated with the reference electric current Is (sink electric current Is and source electric current Is) output from the DA converters 634_H and 634_L, and the reference electric current Is is stipulated with the reference data DAC_H and DAC_L. Accordingly, the variation properties (through rate) of the load voltage Vout are varied with the driving electric current Io.

At the time of feedback control, the through rate of the load voltage Vout can be regulated by regulating the driving electric current Io at the time of the transition of load voltage supplied to the load 609 using a digital value such as the DAC data, and the control information for controlling the through rate regulating unit 630 can be handled with digital data, thereby facilitating handling of regulation.

Only when the switchover units 636_H or 636_L is on, the through rate regulating unit 630 is configured so as to supply the corresponding previous stage driving signal P30_H or P30_L generated at the corresponding DA converter 634_H or 634_L (the reference electric current Is represented in the present example) to the corresponding current mirror circuits 652_H or 652_L of the load driving unit 650.

The pulse delaying unit 612 is adapted to input a switchover control signal Vs1 serving as the control signal P10_H corresponding to the delay amount at the time of rising to a control input terminal to the control input terminal of the switchover unit 636_H, and also to input a switchover control signal Vs2 serving as the control signal P10_L corresponding to the delay amount at the time of falling to the control input terminal of the switchover unit 636_L.

Let us say that the DA converters 634_H and 634_L have resolution sufficient for covering the variations regarding the driving force of the load driving unit 650 and the properties of the load 609 due to the manufacturing irregularities of the load 609, the manufacturing irregularities for driving elements employed for the output stage of the load driving unit 650, environmental variations such as temperature variations, humidity variations, and so forth. Further preferably, it is desirable to have resolution that can correspond to various types of the load 609.

The pulse delaying unit 612 makes the control signal P10_H (=Vs1) active high after delay by the delay amount tpdr1 from the rising of the input pulse Pin. In response to this, the load voltage Vout at the terminal 604 rises at the high level of the control signal P10_H.

That is to say, with the through rate regulating unit 630, when the input pulse Pin_H (=Vs1) from the pulse delaying unit 612 makes the transition from low to high, the switchover unit 636_H becomes electro-conductive, and the previous stage driving signal P30_H stipulating the reference electric current Is generated at the DA converter 634_H is supplied to the current mirror circuit 652_H of the load driving unit 650 (sink operation).

The current mirror circuit 652_H supplies the driving electric current Io wherein the reference electric current Is is represented with the previous stage driving signal P30_H is multiplied by a constant (NH times) to the load 609 having capacitive reactance. Thus, the load voltage Vout makes the transition from a low level to a high level with a steady through rate. Subsequently, when the load voltage Vout reaches the power source voltage V1, the output stage 652_Hout of the current mirror circuit 652_H loses constant-current properties though the reference electric current Is is continuously supplied to the input stage 652_Hin of the current mirror circuit 652_H, the load 609 is connected to the power source voltage V1 via an equivalent resistance, and the load voltage Vout is fixed to the power source voltage V1.

Subsequently, when the input pulse Pin falls, the operation in the direction opposed to the above is performed. Specifically, the pulse delaying unit 612 makes the control signal P10_H (=Vs1) low after delay by the delay amount tpdf1 from the falling of the input pulse Pin, and also makes the control signal P10_L (=Vs2) active high. In response to this, the load voltage Vout at the terminal 604 falls at the high level of the control signal P10_L.

With the through rate regulating unit 630, when the input pulse Pin_L (=Vs2) from the pulse delaying unit 612 makes the transition from low to high, the switchover unit 636_L becomes electro-conductive, and the previous stage driving signal P30_L stipulating the reference electric current Is generated at the DA converter 634_L is supplied to the current mirror circuit 652_L of the load driving unit 650 (source operation).

The current mirror circuit 652_L supplies the driving electric current Io wherein the reference electric current Is represented with the previous stage driving signal P30_L is multiplied by a constant (NH times) to the load 609 having capacitive reactance. Thus, the load voltage Vout makes the transition from a high level to a low level with a steady through rate. Subsequently, when the load voltage Vout reaches the power source voltage V2, the output stage 652_Lout of the current mirror circuit 652_L loses constant electric current properties though the reference electric current Is is continuously supplied to the input stage 652_Lin of the current mirror circuit 652_L, the load 609 is connected to the power source voltage V2 via an equivalent resistance, and the load voltage Vout is fixed to the power source voltage V2.

<Modification of Through Rate Regulating Unit>

Figure 42:
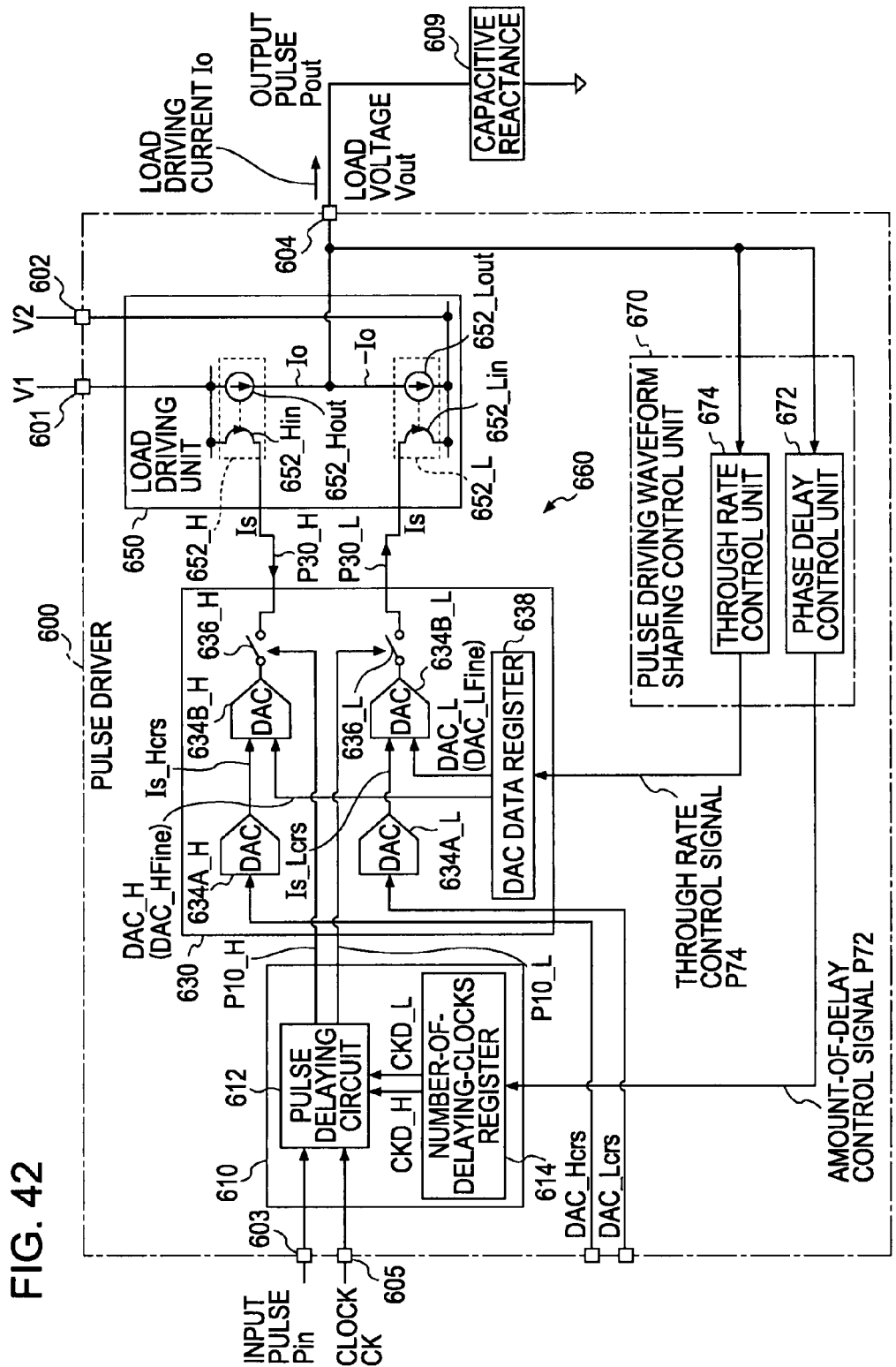
FIG. 42 is a diagram describing another configuration example (a modification as to the configuration illustrated in FIG. 41) principally focusing attention on the detailed configurations of a phase delay regulating unit and a through rate regulating unit of the pulse driver illustrated in FIG. 33.

FIG. 42 is a diagram describing another configuration example (a modification as to the configuration illustrated in FIG. 41) principally focusing attention on the detailed configurations of the phase delay regulating unit 610 and the through rate regulating unit 630 of the pulse driver 600 illustrated in FIG. 33.

Note here that the load driving unit 650 is illustrated by employing the configuration illustrated in FIG. 36 adapted to the case of driving the load 609 having capacitive reactance, but the respective detailed configuration examples of the phase delay regulating unit 610 and the through rate regulating unit 630 can be applied to the configuration illustrated in FIG. 38 adapted to the case of driving the load 609 having inductive reactance as well.

The difference between the configuration illustrated in FIG. 38 and the configuration illustrated in FIG. 41 is in that the DA converter within the through rate regulating unit 630 has a two-stage configuration (referred to as DA converters 634A and 634B) for coarse tuning and for fine tuning.

The DA converters 634A_H and 634A_L for coarse tuning generate the coarse reference electric current Is_Coarse (Is_Hcrs and Is_Lcrs) corresponding to the driving force coarse tuning setting values DAC_Coarse (coarse DAC data DAC_Hcrs and DAC_Lcrs) set externally, and transmits this to the DA converters 634B_H and 634B_L for fine tuning. The coarse DAC data is data not affected (controlled) with the through rate control signal P74 from the through rate control unit 674, and the DA converters 634A_H and 634A_L generate the coarse reference electric current Is_Coarse corresponding to the driving force coarse tuning setting values regardless of the through rate control signal P74 output from the through rate control unit 674.

The DA converters 634B_H and 634B_L for fine tuning generate the reference electric current (source side Is and sink side Is) corresponding to the values set by the DAC data register 638 based on the through rate control signal P74 with reference to the coarse reference electric current Is_Coarse generated at the DA converters 634A_H and 634A_L for coarse tuning. In this case, the reference data DAC_H and DAC_L is equivalent to the driving force fine tuning setting values DAC_Fine corresponding to the driving force coarse tuning setting values DAC_Coarse.

In order to generate the reference electric current Is with reference to the coarse reference electric current Is_Coarse, we can employ any of a multiplication method for generating the reference electric current Is by tuning the degree of amplification in accordance with the reference data DAC_H and DACL_with the coarse reference electric current Is_Coarse generated at the DA converters 634A_H and 634A_L as the reference electric current, and an addition method for generating the fine reference electric current Is_Fine (Is_Hfine and IS_Lfine) corresponding to the reference data DAC_H and DAC_L at the DA converters 634B_H and 634B_L, and also adding this and the coarse reference electric current Is_Coarse generated at the DA converters 634A_H and 634A_L.

It is necessary to determine whether to employ any one of the methods or both depending on driving force, the tendency of the irregularities of the load, or the like. Though there are not a few exceptions, generally the multiplication method can expand a dynamic range as compared with the addition method, so as for the DA converters 634B_H and 634B_L, it is desirable to employ a circuit configuration for realizing the multiplication method.

Even in the event of employing any of the multiplication method and the addition method, the coarse reference electric current Is_Coarse receives no influence of the through rate control signal P74 at the time of feedback control, and consequently, the through rate of the load voltage Vout is tuned by the DA converters 634B_H and 634B_L for fine tuning.

Even if the DA converter 634 has a one-stage configuration, in principle, this can have resolution sufficient for covering the variations regarding the driving force of the load driving unit 650 and the properties of the load 609 due to the manufacturing irregularities of the load 609, the manufacturing irregularities for driving elements employed for the output stage of the load driving unit 650, environmental variations such as temperature variations, humidity variations, and further various types of the load 609, and so forth.

However, as actually compared with the variations due to the manufacturing irregularities of the load 609, the manufacturing irregularities for driving elements employed for the output stage of the load driving unit 650, environmental variations such as temperature variations, humidity variations, the variations necessary for corresponding to many types of the load 609 increase, so in order to realize this using a one-stage configuration, the resolution of the DA converter 634 becomes an unrealistic resolution, and accordingly, this configuration is impractical.

On the other hand, with a system design, the specifications of the properties (input equivalent capacitance, input equivalent inductance, driving frequency, etc.) of the load 609 to be employed generally become clear, and accordingly, if the DA converters 634A are arranged so as to handle the variations equivalent thereto, generally desired driving force can be obtained.

With the DA converters 634B for fine tuning, if an arrangement is made wherein feedback control is done so as to handle the irregularities at the time of actual working, the through rate can be tuned dynamically using realistic resolution. That is to say, in a state in which generally desired driving force is set at the DA converters 634A for coarse tuning, when the driving force or the properties (such as input equivalent capacitance) of the load 609 are varied due to the parasitic capacitance which is difficult to consider at a design stage, the irregularities of manufacturing processes, temperature variations, or the like, though the through rate of driving output fails to satisfy the specifications in some cases, controlled by the through rate control unit 674 controls the DA converters 634B fro fine tuning to perform an operation for tuning the inclination of output, whereby the specifications of the output through rate can be satisfied.

<Configuration Example of Pulse Driving Waveform Shaping Control Unit>

Figure 43:
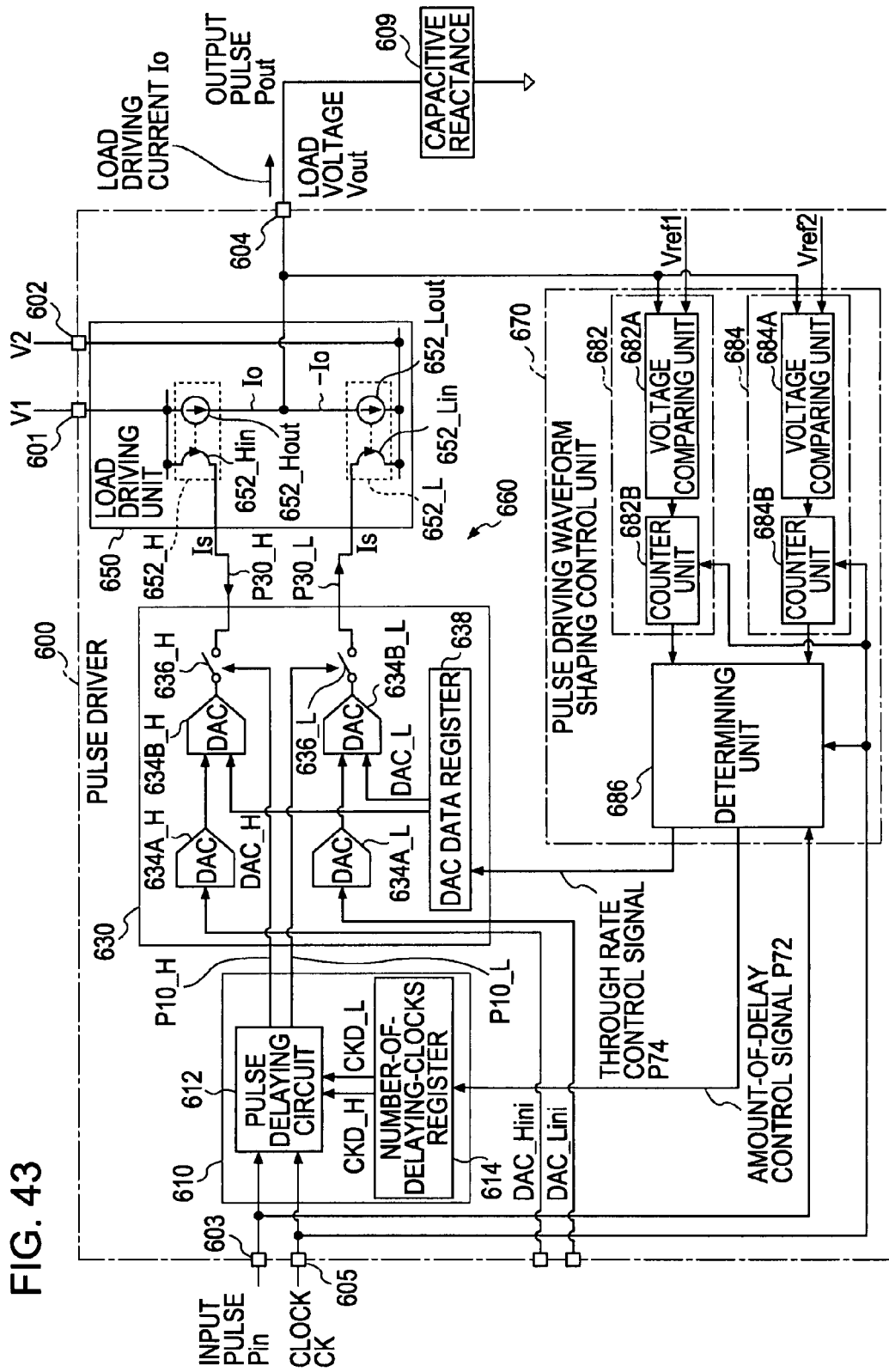
FIG. 43 is a diagram describing a configuration example principally focusing attention on the detailed configuration of a pulse driving waveform shaping control unit of the pulse driver illustrated in FIG. 33.

FIG. 43 is a diagram describing a configuration example principally focusing attention on the detailed configuration of the pulse driving waveform shaping control unit 670 of the pulse driver 600 illustrated in FIG. 33. Also, FIGS. 44A through 44C are timing charts describing the operations of the pulse driver 600 illustrated in FIG. 43.

Note here that as for the phase delay regulating unit 610 and the through rate regulating unit 630, the configurations illustrated in FIG. 42 are employed. Also, though the load driving unit 650 is illustrated by employing the configuration illustrated in FIG. 36 adapted to the case of driving the load 609 having capacitive reactance, the respective detailed configuration examples of the phase delay regulating unit 610 and the through rate regulating unit 630 can be applied to the configurations illustrated in FIG. 38 adapted to the case of driving the load 609 having inductive reactance in the same way.

The pulse driving waveform shaping control unit 670 includes two comparing units 682 and 684, and a determining unit 686 which are shared by the phase delay control unit 672 and the through rate control unit 674. The two comparing units 682 and 684, and the amount-of-delay control functional portion of the determining unit 686 make up the phase delay control unit 672, and the two comparing units 682 and 684, and the through rate control functional portion of the determining unit 686 make up the through rate control unit 674. Note that the two comparing units 682 and 684, and the determining unit 686 may be provided for each of the phase delay control unit 672, and the through rate control unit 674.

The comparing units 682 and 684 are configured as voltage comparators for comparing the load voltage Vout and the reference voltage Vref. That is to say, an arrangement is made wherein the output pulse Pout at the terminal 604 is first input to one input terminal of each of the comparing units 682 and 684.

Also, an arrangement is made wherein the first reference voltage Vref1 corresponding to a predetermined potential between the high level potential and the low level potential of the output pulse Pout at the terminal 604 is input to the other input terminal of the comparing unit 682, and the second reference voltage Vref2 (let us say that Vref2 >Vref1) corresponding to a predetermined potential between the high level potential and the low level potential of the output pulse Pout at the terminal 604 is input to the other input terminal of the comparing unit 684.

That is to say, the two reference voltages Vref1 and Vref2 are set to appropriate values between values that the load voltage Vout can assume, as illustrated in FIG. 44A. For example, the first reference voltage Vref1 is set around at the lower side ⅓ of the V1 through V2, and also the second reference voltage Vref2 is set around at the upper side ⅓ of the V1 through V2.

The comparing units 682 and 684 compare two input voltages with reference to the clock signal CK input externally via the terminal 605, and transmits the voltage comparison result to the determining unit 686. Specifically, as for the comparing units 682 and 684, an AD conversion method is employed, which is referred to as a so-called single slope integration type or lamp signal comparison type, wherein the analog voltage signal of the output pulse Pout and the reference voltages Vref1 and Vref2 for converting the analog signal into digital data are compared, and also count processing is performed using the clock signal CK in parallel to the above comparison processing, and the digital data representing two time points in the transition process of the output pulse Pout is obtained based on the count value at the time of completion of the comparison processing.

Therefore, the respective comparing units 682 and 684 are made up of voltage comparators 682A and 684A for comparing the output pulse Pout and the reference voltages Vref1 and Vref2, and counter units (CNT) 682B and 684B for counting the time until the voltage comparators 682A and 684A complete the comparison processing using the clock signal CK, and holding the results thereof, respectively.

With the comparing units 682 and 684 having such a configuration, first the voltage comparison units 682A and 684A compare the reference voltages Vref1 and Vref2, and (the slope portion of) the output pulse Pout, and in the event that both voltages are the same, the comparator outputs of the voltage comparing units 682 and 684 are inverted.

The counter units 682B and 684B are configured so as to start a count operation in sync with the clock signal CK with the rising or falling of the input pulse Pin input to the terminal 603 as the origin, and in the event that the information wherein the comparator output is inverted is informed from the voltage comparators 682A and 684A, the count operation is stopped, and the count value at that time is latched (held or stored), thereby completing the AD conversion. That is to say, the time of the slope portions of the output pulse Pout is measured using the two voltage comparators 682A and 684A.

As for the count values, a count value Nsr2 for determining a potential point Tsr2 (corresponding to the reference voltage Vref1) in the rising transition process of the output pulse Pout, a count value Ner2 for determining a potential point Ter2 (corresponding to the reference voltage Vref2), a count value Nsf2 for determining a potential point Tsf2 (corresponding to the reference voltage Vref2) in the falling transition process of the output pulse Pout, and a count value Nef2 for determining a potential point Tef2 (corresponding to the reference voltage Vref1), are obtained.

Thus, the number of clocks (count values Nsr2, Ner2, Nsf2, and Nef2) can be measured until the two outputs of the voltage comparators 682A and 684A are inverted from the rising or falling of the input pulse Pin, i.e., until the load voltage Vout generated at the load 609 reaches the reference voltages Vref1 and Vref2, corresponding to the input pulse Pin. The comparing units 682 and 684 transmit the measured number of clocks to the determining unit 686.

The determining unit 686 determines the delay amount and through rate of the output pulse Pout in an actual working state as to the input pulse Pin by computing the delay amount until a predetermined potential point of the slope of the output pulse Pout (load voltage Vout), and the time required for the transition between the reference voltages Vref1 and Vref2 in increments of clock cycle based on the relation between the count values Nsr2, Ner2, Nsf2, and Nef2 measured at the comparing units 682 and 684, and the input pulse Pin, controls the phase delay regulating unit 610 using the amount-of-delay control signal P72 such that those are converged on the desired values, and also controls the through rate regulating unit 630 using the through rate control signal P74.

For example, as illustrated in FIG. 44B, the mean values of the count values Nsr2 and Ner2 are the number of delaying clocks CKD_H (=NH) representing the time until reaching the intermediate potentials of the reference voltages Vref1 and Vref2 in the output pulse Pout from the rising point of the input pulse Pin, and the value obtained by dividing the number of delaying clocks CKD_H by the frequency fCLK of the clock signal CK (NH/fCLK) is the delay amount tpdr2 at the time of rising.

Similarly, the mean values of the count values Nsf2 and Nef2 are the number of delaying clocks CKD_L (=NL) representing the time until reaching the intermediate potentials of the reference voltages Vref1 and Vref2 in the output pulse Pout from the falling point of the input pulse Pin, and the value obtained by dividing the number of delaying clocks CKDL_by the frequency fCLK of the clock signal CK (NL/fCLK) is the delay amount tpdf2 at the time of falling.

Also, the difference between the count values Nsr2 and Ner2 represents the through rate SRr2 at the time of rising, and the difference between the count values Nsf2 and Nef2 represents the through rate SRf2 at the time of falling.

Also, as illustrated in FIG. 44C, employing the count values Nsr2 and Ner2 enable the count values for providing the upper-side power source voltage V1 and the lower-side power source voltage V2 on the extensions of the two points corresponding to the two reference voltages Vref1 and Vref2 stipulating the through rate SRr2, i.e., the count value Nsr1 for determining the transition starting point Tsr1 at the time of rising and the count value Ner1 for determining the transition ending point Ter1 to be obtained by estimation. The count value Nsr1 is the number of delaying clocks CKD_H (=N1) representing the time from the rising point of the input pulse Pin until reaching the transition starting point Tsr1 of the rising of the output pulse Pout, and the value obtained by dividing the number of delaying clocks CKD_H (=N1) by the frequency fCLK of the clock signal CK (N1/fCLK) is the delay amount tpdr1 at the time of rising.

Similarly, as illustrated in FIG. 44C, employing the count values Nsf2 and Nef2 enable the count values for providing the upper-side power source voltage V1 and the lower-side power source voltage V2 on the extensions of the two points corresponding to the two reference voltages Vref1 and Vref2 stipulating the through rate SRf2, i.e., the count value Nsf1 for determining the transition starting point Tsf1 at the time of falling and the count value Nef1 for determining the transition ending point Tef1 to be obtained by estimation. The count value Nsf1 is the number of delaying clocks CKD_L (=N2) representing the time from the falling point of the input pulse Pin until reaching the transition starting point Tsf1 of the falling of the output pulse Pout, and the value obtained by dividing the number of delaying clocks CKD_L by the frequency fCLK of the clock signal CK (N2/fCLK) is the delay amount tpdf1 at the time of falling.

The determining unit 686 performs the increase/decrease control of the setting values (the number of delaying clocks CKD_H and CKD_L) of the number-of-delaying-clocks register 614 using the amount-of-delay control signal P72 such that the transition properties (the delay amount or through rate as to the input pulse Pin) of the output pulse Pout in an actual working state thus determined are converged on the values according to the specifications, and also performs the increase/decrease control of the setting values (reference data DAC_H and DAC_L) of the DAC data register 638 using the through rate control signal P74.

Thus, the control information for controlling the phase delay regulating unit 610 and the through rate regulating unit 630 can be handled with digital data, and also the transition properties of the output pulse Pout in an actual working state can be actually measured or estimated in a digital manner, and consequently, the entirety of the feedback control system can be handled with digital data, whereby facilitating handling of measurement and regulation.

<Application Example as to Vertical Driver; First Example>

Figure 45:
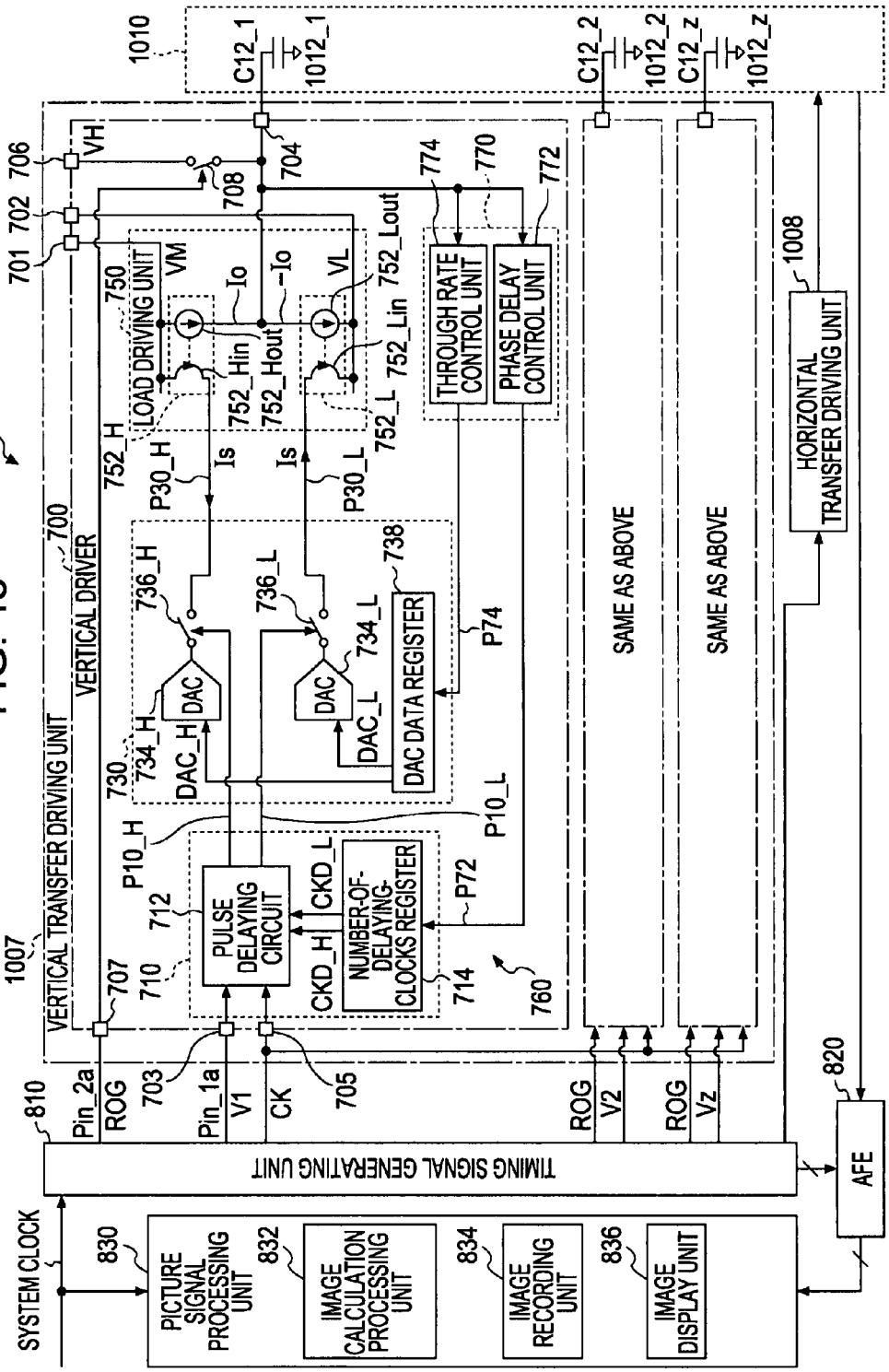
FIG. 45 is a diagram illustrating a first configuration example wherein a pulse driver is applied to a vertical driver.

FIG. 45 is a diagram illustrating a first configuration example wherein the above pulse driver 600 is applied to the vertical driver 1050 for driving vertical transfer electrode 1012 of the CCD solid-state image-capturing device 1010. In this case, the load driving unit 650 drives a vertical transfer electrode 1012 serving as capacitive reactance, thereby employing the configuration illustrated in FIG. 36. Also, as for the phase delay regulating unit 610 and the through rate regulating unit 630, the configurations illustrated in FIG. 40 are employed.

As illustrated in the drawing, an image-capturing device 1001 includes a CCD solid-state image-capturing device 1010, a vertical transfer driving unit 1007 for driving multiple vertical transfer electrodes 1012 serving as capacitive reactance provided in this CCD solid-state image-capturing device 1010, and a horizontal transfer driving unit 1008 for driving multiple horizontal transfer registers 1014 serving as capacitive reactance.

The vertical transfer driving unit 1007 includes vertical drivers 700 for driving each of the multiple vertical transfer electrodes 1012_1 though 1012_z (1 through z; z is the number of phases, z=4 in the case of four phases) independently, and the number of the vertical drivers 700 is equivalent to the number of vertical transfer electrodes 1012. In other words, with the vertical transfer driving unit 1007, the vertical drivers 700 equivalent to the number of the vertical transfer electrodes 1012 are provided, and each of the vertical drivers 700 drives the vertical transfer electrode 1012 of each phase by phase. Each of the vertical drivers 700 may be provided by one package of semiconductor ICs.

With the example illustrated in the drawing, one of the vertical transfer electrodes 1012_1 through 1012_z provided in the CCD solid-state image-capturing device 1010 is represented with one of equivalent input capacitance C12_1 through C12_z (e.g., 100 through 1000 pF or so) respectively, and the CCD solid-state image-capturing device 1010 is a capacitive reactance load from the perspective of the vertical drivers 700.

Note that the equivalent input capacitance C12 are equivalent to the one electrode 1068 alone illustrated in FIG. 27. In detail, this circuit can be illustrated with a series circuit made up of the wiring resistance (e.g., several ten through several hundred ohms or so) and grounding resistance (e.g., several tens of ohms or so) of the vertical transfer electrodes 1012 as well as the equivalent input capacitance C12.

Also, the image-capturing device 1001 includes a timing signal generating unit 810 for generating a pulse signal for controlling each of the vertical drivers 700 of the vertical transfer driving unit 1007, and the horizontal transfer driving unit 1008, an analog front end (AFE) unit 820 for performing analog signal processing, an image calculation processing unit 832 made up of a DSP (Digital Signal Processor) for subjecting the image data from the analog front end unit 820 to predetermined image calculation processing, an image recording unit 834 for storing the image image-captured at the CCD solid-state image-capturing device 1010 in predetermined memory, and a picture signal processing unit 830 including an image display unit 836 for displaying the image image-captured at the CCD solid-state image-capturing device 1010.

Note that with the example illustrated in the drawing, one example the most appropriate for representing the image-capturing device 1001 (CCD image-capturing system) is described, but the configuration thereof can vary in the convenience of semiconductor process, and the convenience of the entire camera design, so is not restricted to this example. Even with any of design configurations, it can be conceived that generally all of the same functional elements illustrated in the drawing are included, but in some cases, a system in which a part of the functional elements (e.g., the image display unit 836 for a monitor function) is eliminated may be employed. Also, the integration and division of the respective functional portions can be performed, for example, the horizontal transfer driving unit 1008 and the timing signal generating unit 810 may be configured in an integrate manner.

Also, though not illustrated in the drawing, in addition to the above functional elements, the image-capturing device 1001 includes, for example, an optical system made up of a mechanical shutter having a function for stopping storage of signal charge at the sensor units (electric-charge generating units) of the CCD solid-state image-capturing device 1010, a lens for condensing an optical image of a subject, and an image-capturing lens including an iris for adjusting the amount of light of an optical image, and a control unit for controlling the entire image-capturing device 1001. It can be conceived that the control unit includes the timing signal generating unit 810.

The control unit includes a central control unit made up of a CPU (Central Processing Unit) for controlling an unshown drive (driving device) to read out a control program stored in a magnetic disk, optical disc, magneto-optical disc, or semiconductor memory, and controlling the entirety of the image-processing apparatus 1001 based on the readout control program, or a command from a user, or the like.

Also, the control unit includes an exposure controller (exposure control unit) for controlling a shutter or iris so as to keep the appropriate brightness of an image transmitted to the picture signal processing unit 830, and an operating unit to which a user input shutter timing, the other commands.

The central control unit controls the timing signal generating unit 810, picture signal processing unit 830, and exposure controller (exposure control unit), which are connected to the bus of the image-capturing device 1001. Accordingly, as illustrated in the drawing, the system clock and the other control signals are supplied from the central control unit not shown in the drawing to the timing signal generating unit 810 and the picture signal processing unit 830.

The timing signal generating unit 810 supplies various types of pulse signals necessary for transferring and driving the CCD solid-state image capturing device 1010 to the vertical transfer driving unit 1007 and the horizontal transfer driving unit 1008, and also supplies a pulse signal for correlated double sampling or AD conversion to the analog front end unit 820.

The analog front end unit 820 subjects an image-captured signal output from the output amplifier unit 1016 of the CCD solid-state image-capturing device 1010 to predetermined analog signal processing such as correlated double sampling or the like based on the pulse signal supplied from the timing signal generating unit 810, and also converts (AD-converts) the image-captured signal subjected to analog signal processing to supply the AD converted image-captured data to the picture signal processing unit 830.

The image calculation processing unit 832 is made up of a DSP (Digital Signal Processor) so as to subject the image-captured data input from the analog front end unit 820 to predetermined digital image calculation processing.

The image recording unit 834 is made up of, though not shown in the drawing, memory (recording medium) such as flash memory or the like storing image data, and a CODEC (abbreviation of Code/Decode or Compression/Decompression) for encoding the image data processed by the image calculation processing unit 832 to record this in the memory, or reading out and decoding the image data to supply this to the image calculation processing unit 832.

The image display unit 836 is made up of a D/A (Digital/Analog) conversion unit for converting the image data processed by the image calculation processing unit 832 into analog data, a video monitor made up of a liquid crystal (LCD) serving as a finder by displaying the image corresponding to an input video signal, and a video encoder for encoding the image signal converted into analog into a video signal adapted to the video monitor at the subsequent stage.

The vertical drivers 700 corresponding to the respective vertical transfer electrodes have the same configuration as the pulse driver 600 having the configuration illustrated in FIG. 43, include a phase delay regulating unit 710 equivalent to the phase delay regulating unit 610, a through rate regulating unit 730 equivalent to the through rate regulating unit 630, a load driving unit 750 equivalent to the load driving unit 650, and a pulse driving waveform shaping control unit 770 including a phase delay control unit 772 equivalent to the phase delay control unit 672, and a through rate control unit 774 equivalent to the through rate control unit 674.

The phase delay regulating unit 710, through rate regulating unit 730, and load driving unit 750 make up a waveform shaping processing unit 760 for subjecting an input pulse signal to predetermined waveform shaping processing.

The vertical drivers 700 include terminals 701, 702, 703, 704, and 705 equivalent to the terminals 601, 602, 603, 604, and 605 of the pulse driver 600. Any one of the z-phase vertical transfer clocks V1 through Vz is input to the terminal 703, and any one of the corresponding vertical transfer electrodes 1012_1 through 1012_z is connected to the terminal 704.

The vertical drivers 700 include terminals 706 and 707, and a switchover unit (switch means) 708 as unique configurations for driving a vertical transfer electrode 1012. Voltage VH stipulating the potential at the high level side of the vertical transfer pulses ΦV1 though ΦVz is input to the terminal 706, voltage VM stipulating the potential of the middle level of the vertical transfer pulses ΦV1 though ΦVz is input to the terminal 701, and also voltage VL stipulating the potential at the low level side of the vertical transfer pulses ΦV1 though ΦVz is input to the terminal 702. Also, from the timing signal generating unit 810, the vertical transfer clocks V1 through Vz serving as the input pulse Pin are supplied to the respective terminals 703, and a readout clock ROG is supplied to the respective terminals 707.

With the present configuration example, the vertical transfer clocks V1 through Vz are related to the transition between the VM and VL of the vertical transfer pulses ΦV1 though ΦVz output from the vertical drivers 700, and the clock ROG is related to the transition between the VM and VH of the vertical transfer pulses ΦV1 though ΦVz.

The switchover unit 708 is provided between the terminal 704 and terminal 706, and connects the terminal 704 to the terminal 706 at the time of field shift based on the readout clock ROG serving as one example of the control pulses input via the terminal 707 such that the load voltage Vout at the terminal 704 becomes the voltage VH at a high level. That is to say, the switchover unit 708 serves as a switch for supplying the high-voltage potential VH to the terminal 704 to supply the pulse voltage necessary for transferring signal charge to the vertical transfer register 1013 to a vertical transfer electrode 1012 from the light receiving sensor (photoelectric conversion sensor) 1011 of the CCD solid-state image-capturing device 1010 at the time of image capturing.

According to such a configuration, when driving the vertical transfer electrode 1012 of each phase using a vertical transfer clock having a different phase, feedback control is performed such that the transition properties of each pulse output signal becomes predetermined properties by monitoring the pulse output signal of each of the vertical transfer electrodes 1012 in an actual working state, and accordingly, even if there are the individual irregularities of the load properties (particularly equivalent input capacitance C12) of each of the vertical transfer electrodes 1012, the individual irregularities of the driving properties of the load driving unit 750, or environmental variations, steady transition properties regarding each of those can be obtained constantly.

Thus, appropriate driving can be realized constantly without receiving the influence of the manufacturing irregularities of the load capacitance, the manufacturing irregularities of the driving device, and environmental variations. Additionally, the irregularities of the transition properties of a driving output pulse can be eliminated to almost zero, whereby further high-speed driving can be handled. If there are irregularities regarding transition properties, it is necessary to perform driving so as to include a margin equivalent to the irregularities, but driving can be performed eliminating the margin to almost zero, whereby high-speed driving can be performed.

Note that the correspondence logic between the vertical transfer clocks V1 through Vz and the readout clock ROG and the voltage levels VH, VM, and VL of the vertical transfer pulses ΦV1 though ΦVz illustrated here is one example and no more, which can be set arbitrarily depending on the convenience of the system, and is not restricted to the present example.

Also, with the configuration example of the vertical drivers 700 illustrated here, the above pulse driver 600 is employed for generating a low-speed pulse signal having variation properties at predetermined slow speed between the low level potential VL and the middle level potential VM of the vertical transfer pulses ΦV1 though ΦVz based on the vertical transfer clocks V1 through Vz supplied to the respective terminals 703, and an arrangement is made wherein the transition between the middle level potential VM and the high level potential VH based on the readout clock ROG is directly driven by the switchover unit 708 for outputting the high level potential VH based on the readout clock ROG, and accordingly, it is not necessarily to generate a low-speed pulse having slow variation properties.

However, an arrangement may be made wherein the arrangement of the pulse driver 600 is also applied to the transition between the middle level potential VM and the high level potential VH, or the transition between the low level potential VL and the high level potential VH depending on the properties and driving method of the CCD solid-state image-capturing device 1010, whereby each of the transitions between the potentials is varied with smooth inclination.

Also, in the drawing, the same vertical driver 700 presented by a semiconductor IC is individually employed for driving the vertical transfer electrode 1012 of each phase, and the readout clock ROG is supplied to each of the terminals 707, but in reality, the vertical transfer electrodes which need the readout clock ROG are not all of the vertical transfer electrodes 1012, and it does not mean that the readout clock ROG is supplied to the terminals 707 of all of the vertical drivers 700.

For example, with the CCD solid-state image-capturing device 1010 employing the interline method, of the four-phase vertical transfer clocks V1 through V4, the V1 and V3 and the readout clock ROG are paired to provide vertical transfer pulses ΦV1 and ΦV3 which assume the three value levels of the VL, VM, and VH, whereby the vertical transfer pulses ΦV1 and ΦV3 can be served for not only the original vertical transfer operation but also readout of signal charge. Also, with an all pixels readout method, of the three-phase vertical transfer clocks V1 through V3, the V1 and the readout clock ROG are paired to provide a vertical transfer pulse ΦV1 which assumes the three value levels of VL, VM, and VH, whereby the vertical transfer pulse ΦV1 can be served for not only the original vertical transfer operation but also readout of signal charge.

<Application Example as to Vertical Driver; Second Examples>

Figure 46:
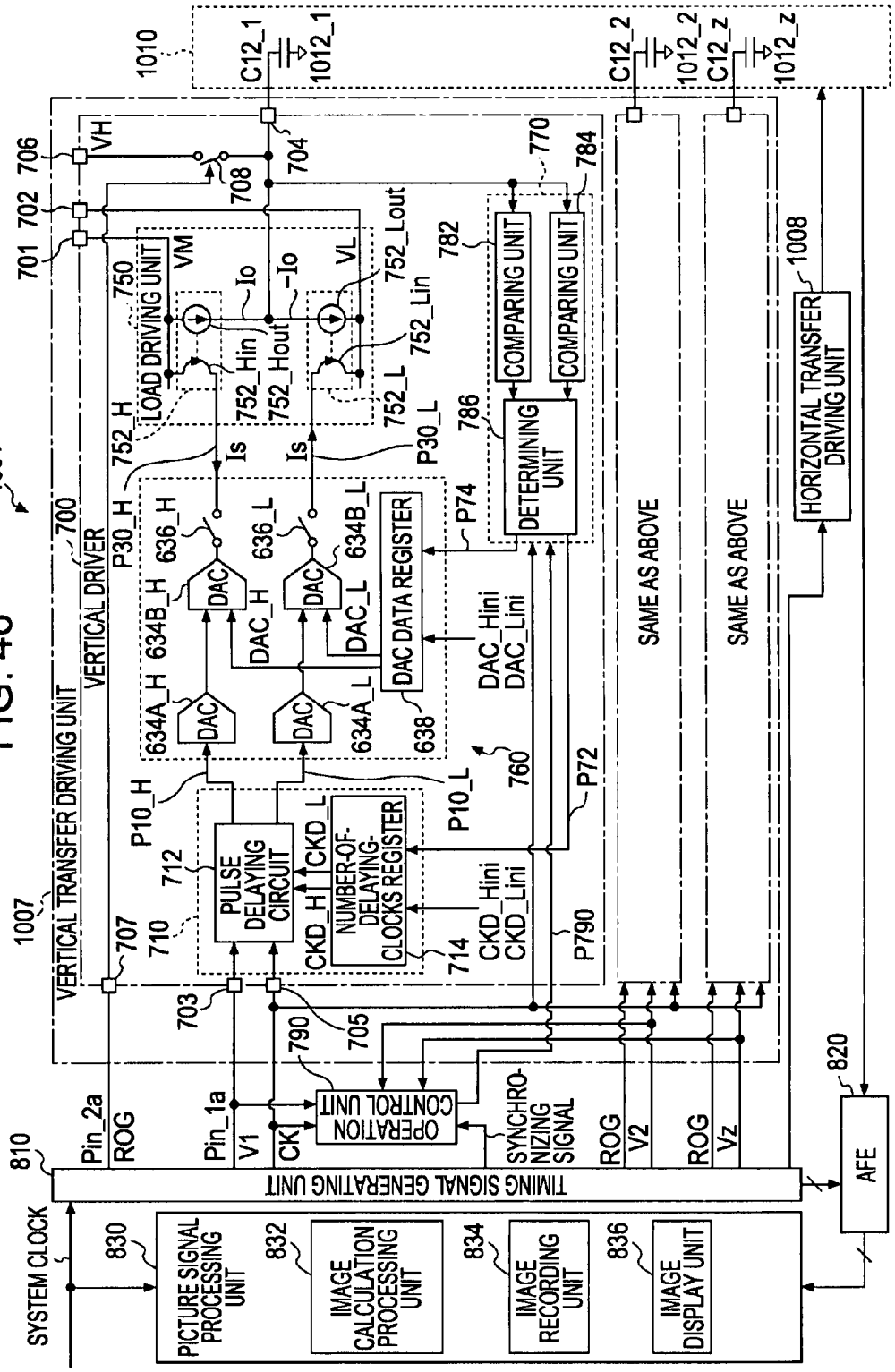
FIG. 46 is a diagram illustrating a second configuration example wherein a pulse driver is applied to a vertical driver.

FIG. 46 is a diagram illustrating a second configuration example wherein the above pulse driver 600 is applied to the vertical driver 1050 for driving vertical transfer electrode 1012 of the CCD solid-state image-capturing device 1010. The configuration not illustrated in FIG. 40 but illustrated in FIG. 43 is employed for the portion of the vertical drivers 700 according to the first configuration example illustrated in FIG. 45 equivalent to the pulse driver 600. Note that of a pulse driving waveform shaping control unit 770 including comparing units 782 and 784, and a determining unit 786 which corresponds to the pulse driving waveform shaping control unit 670, the comparing 782 and 784 are illustrated in a simplified manner.

Also, an arrangement is made wherein from the timing signal generating unit 810, register initial setting values CKD Hini and CKD Lini are externally set to a number-of-delaying-clocks register 714, and also a driving force coarse tuning setting value (coarse DAC data) is set to a DA converter 734A for coarse tuning, and register initial setting values DAC_Hini and DAC_Lini are externally set to a DAC data register 738.

Also, the present example includes features in that a operation control unit 790 is added for controlling the control operation as to the waveform shaping processing unit 760 by the pulse driving waveform shaping control unit 770 in the vertical drivers 700 (equivalent to the pulse driver 600) depending on the operation state of the image-capturing device 1001.

Note that the place where the operation control unit 790 is mounted may be the outside of the vertical transfer driving unit 1007 as illustrated in the drawing, or may be the inside thereof. In this case, in the event of presenting the respective vertical drivers 700 as one package of ICs including the respective vertical drivers 700, the one operation control unit 790 is mounted, but in the event of presenting the vertical drivers 700 for driving the respective vertical transfer electrodes 1012 as individual ICs, it is desirable to mount the operation control unit 790 within each of the vertical drivers 700, and use any one of those.

An arrangement is made wherein the vertical transfer clocks V1 through Vz serving as the input pulse Pin, the clock signal CK, and an image synchronizing signal are supplied from the timing signal generating unit 810 to the operation control unit 790, and also an output waveform shaping permission signal P690 for controlling the operations of the pulse driving waveform shaping control unit 770 is supplied to the pulse driving waveform shaping control unit 770. The image synchronizing signal includes a horizontal synchronizing signal, a vertical synchronizing signal, or some kind of a control signal for controlling the other various image-capturing modes.

The operation control unit 790 permits or stops the operations of the pulse driving waveform shaping control unit 770 based on the image synchronizing signal. At this time, logic input or the like for specifying the polarity of the original output pulse is employed as one contribution of the image synchronizing signal.

For example, with the image-capturing device 1001, in the normal image-capturing mode, feedback control employing the pulse driving waveform shaping control unit 770 is stopped during the valid pixel period of the CCD solid-state image-capturing device 1010 to minimize noise components which appear on an image, and the feedback control employing the pulse driving waveform shaping control unit 770 is activated only during a vertical blanking period wherein noise components do not appear, whereby delay time and through rate are regulated such that the transition properties in an actual working state of the vertical transfer pulse for driving the vertical transfer electrodes 1012 are identical to the specifications.

On the other hand, in the event that the image-capturing mode was switched, or the like, in the event of securing time equivalent to one screen or more for stabling the system, the feedback control employing the pulse driving waveform shaping control unit 770 is activated even during the valid pixel period equivalent to the one screen, and delay time and through rate are regulated such that the transition properties in an actual working state of the vertical transfer pulse for driving the vertical transfer electrodes 1012 are identical to the specifications, whereby proper usage such as rapidly reaching a steady state can be realized.

In addition to the image synchronizing signal, a signal for controlling the system is provided to the operation control unit 790 for computation and determination, whereby a more flexible system can be easily configured.

<Application Example as to Vertical Drivers; Third Example; First Example of Circuit Sharing Method as to Multiple Loads>

Figure 47:
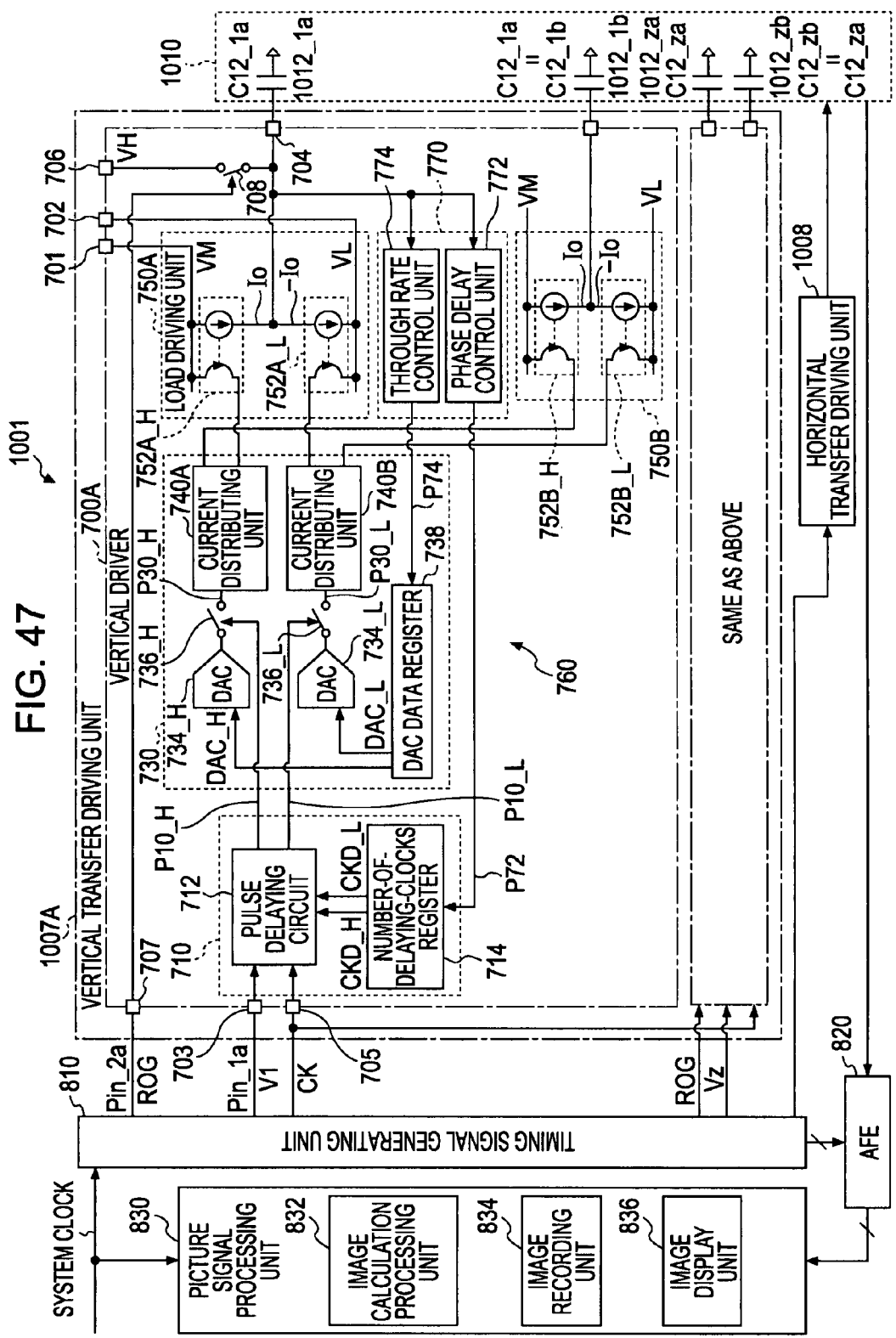
FIG. 47 is a diagram illustrating a third configuration example wherein a pulse driver is applied to a vertical driver.

FIG. 47 is a diagram illustrating a third configuration example wherein the above pulse driver 600 is applied to the vertical driver 1050 for driving vertical transfer electrode 1012 of the CCD solid-state image-capturing device 1010. This third configuration example illustrates a first method for reducing hardware by applying the configuration illustrated in FIG. 40 to the portion equivalent to the pulse driver 600 as with the first configuration example illustrated in FIG. 45, and also sharing a part of the functional portions as to the multiple vertical transfer electrodes 1012.

Now, the first sharing method is a method which has been conceived based on the concept wherein with the logic input for transferring and driving the one vertical transfer electrode 1012 and the logic input for transferring and driving the other vertical transfer electrode 1012, in the event that the respective vertical transfer electrodes 1012 have the same equivalent input capacitance C12, the delay amount and through rate regulating amount as to each of the logic inputs can be set to the same. The first sharing method has features in that the pulse driving waveform control unit 770 for monitoring the delay amount of the output pulse Pout as to the input pulse Pin, and the transition properties (through rate) of the through rate regulating unit 730 to control the phase delay regulating unit 710 and the through rate regulating unit 730, is shared for the multiple vertical transfer electrodes 1012 having the same equivalent input capacitance C12.

Specifically, the first sharing method has features in that a vertical transfer driving unit 1007A for realizing the first sharing method is configured so as to share portions excluding the load driving unit 650 equivalent to the pulse driver 600 regarding the vertical transfer electrodes having mutually the same equivalent input capacitance C12 of the multiple vertical transfer electrodes 1012 employed by the CCD solid-state image-capturing device 1010.

More particularly, the vertical driver 700A of the vertical transfer driving unit 1007A for realizing the first sharing method is configured such that the pulse driving waveform shaping control unit 770 monitors the pulse output signal generated at any one of the multiple vertical transfer electrodes 1012 having the same properties, and controls the waveform shaping processing unit 760 corresponding to each of the multiple vertical transfer electrodes 1012 such that the transition properties of the pulse output signals of the multiple vertical transfer electrodes 1012 having the same properties become predetermined properties.

For example, load driving units 750A and 750B individually corresponding to the two load driving units 750 connected to the two vertical transfer electrodes 1012 having mutually the same equivalent input capacitance C12 are provided, and the other phase delay regulating unit 710, through rate regulating unit 730, and pulse driving waveform shaping control unit 770 are configured so as to be shared by the respective vertical transfer electrodes 1012. Also, the through rate regulating unit 730 is configured so as to provide electric-current distributing units 740A and 740B at the connection stages as to the respective load driving units 750A and 750B for distributing the reference electric current Is represented with the previous stage driving signal P30 output from the DA converter 734 to the respective load driving units 750A and 750B.

A function can be provided wherein an electric current distributing unit 740 is employed for distributing the reference electric current Is stipulated by the DA converter 734 for setting output driving force into previous-stage driving signals P30_Ha and P30_La for the one vertical transfer electrode 1012_a, and previous-stage driving signals P30_Hb and P30_Lb for the other vertical transfer electrode 1012_b.

Note here that the example for distribution to the two system is shown assuming that the two vertical transfer electrodes 1012 have the same capacitance, but not restricted to this, in the event that arbitrary multiple vertical transfer electrodes 1012 have the same capacitance, an arrangement may be employed wherein distribution to the number of systems equivalent to the number of the vertical transfer electrodes 1012 thereof is performed.

For example, in FIG. 25, the four types of vertical transfer electrodes 1012_1 though 1012_4 corresponding to four-phase driving are provided. In the event of transferring and driving these four types of vertical transfer electrodes 1012_1 through 1012_4, it can be conceived that each of these is driven by one vertical driver, and also an arrangement can be conceived wherein these are divided into multiple systems, and each system is driven by an individual vertical driver, thereby reducing loading per one.

For example, functionally, an arrangement can be conceived wherein one vertical transfer electrode is physically divided into the two systems of the upper half and the lower half of the image-capturing portion 1010a, the two output stages of the vertical driver (equivalent to the load driving unit 750 in the present example) are mounted on the upper side and lower side portions of the image-capturing portion 1010a, the vertical transfer electrode of the upper side system is driven by the output stage mounted on the upper side portion, and the vertical transfer electrode of the lower side system is driven by the output stage mounted on the lower side portion.

In this case, the respective systems (system indicated by _a, and system indicated by _b) of the four types of vertical transfer electrodes 1012_1 through 1012_4 are originally one, the target driving timing may be the same, an arrangement can be conceived wherein a signal made up of one input pulse is distributed to the output stages of two systems. At this time, in the event that the load capacities of the distribution destinations differ, if the distributed signals supplied to the output stages of the two systems (equivalent to the previous-stage driving signal P30 supplied to the load driving unit 750 in the present example) are set to the same timing, it becomes difficult to control the driving timing following distribution in the same way.

However, with the present example, the respective systems have originally the same pattern shape, so the equivalent input capacitance C12_a and C12_b of the respective systems are generally the same. Accordingly, when distributing a signal made up of one input pulse to the output stages of two systems, the signals supplied to the output stages (equivalent to the previous-stage driving signal P30 supplied to the load driving unit 750 in the present example) can be set to completely the same.

In such a case, when applying the sharing method of the first example, first, with the vertical driver 700A of the vertical transfer driving unit 1007A, a vertical transfer clock V1 serving as logic input 1a is supplied to a pulse delaying unit 712 to driving the vertical transfer electrodes 1012_1a and 1012_1b of the two systems of the vertical transfer electrode

1012_1, and also a readout clock ROG serving as logic input 2a is supplied to the switchover unit 708.

Also, though the detailed configuration is omitted in the drawing, with the vertical transfer driving unit 1007A, the same configuration as that in the vertical driver 700A is provided to drive the respective systems of the other vertical transfer electrodes 1012_2, 1012_3, and 1012_4.

Next, the pulse driving waveform shaping control unit 770 of each of the vertical drivers 700A monitors the actual working state of any one of the load voltage Vout having the same equivalent input capacitance C12 (e.g., the load voltage Vout1a at the vertical transfer electrode 1012_1a), and regulates the delay amount and through rate as to each logic input based on the result thereof.

The load voltage Vout1a at the vertical transfer electrode 1012_1a corresponding to the vertical transfer clock V1 supplied from the timing signal generating unit 810 as logic input 1a can be regulated so as to become predetermined delay amount and through rate, and also the load voltage Vout1b at the vertical transfer electrode 1012_1b corresponding to the same vertical transfer clock V1 can be regulated so as to become predetermined delay amount and through rate by simply monitoring the output of one system of the two systems, i.e., the load voltage Vout1a at the vertical transfer electrode 1012_1a (or the load voltage Vout1b at the vertical transfer electrode 1012_1b) using the one waveform shaping processing unit 760.

The logic input 1a (vertical transfer clock V1) is shared to transfer and drive the vertical transfer electrodes 1012_1a and 1012_1b of the two systems physically separated, but the vertical transfer electrodes 1012_1a and 1012_1b are the same equivalent input capacitance C12, whereby the delay amount by the amount-of-delay control signal P72 as to the phase delay regulating unit 710 (particularly, number-of-delaying-clocks register 714), and the regulating amount of a through rate by the through rate control signal P74 as to the through rate regulating unit 730 (particularly, DAC data register 738) can be set to the same.

Thus, with the configuration example employed for the vertical transfer driving unit 1007A for realizing the first sharing method, in the event that the one equivalent input capacitance C12 is designed equal to the other equivalent input capacitance C12 based on the symmetry of the electrode configuration of the CCD solid-state image-capturing device 1010, it is effective to eliminate redundant circuits at the pulse driving waveform shaping control side.

Note that with the vertical transfer driving unit 1007A for realizing the first sharing method, in the event that the vertical transfer electrodes 1012 having the same equivalent input capacitance C12 exist, the configuration sharing the phase delay regulating unit 710 and the through rate regulating unit 730 as well as the pulse driving waveform shaping control unit 770 has been shown, but circuits which can be shared are not restricted to this example, so various types of arrangement can be employed depending on the system configuration of the image-capturing device 1001, the configuration and properties of the CCD solid-state image-capturing device 1010, and so forth. Next, description will be made regarding these modification arrangements.

<Application Example as to Vertical Driver; Modification of Third Example>

In the event of applying complementary driving such as illustrated in FIG. 29 as well, an arrangement may be made wherein the first sharing method is applied thereto, the pulse driving waveform shaping control unit 770 monitors the pulse output signal generated at any one of the multiple vertical transfer electrodes 1012 having the same properties, and controls the waveform shaping processing unit 760 corresponding to each of the multiple vertical transfer electrodes 1012 such that the transition properties of the pulse output signals of the multiple vertical transfer electrodes 1012 having the same properties become predetermined properties.

For example, as described above with reference to FIG. 26, in the event of corresponding to four-phase driving regarding the CCD solid-state image-capturing device 1010 employing the interline method, the CCD solid-state image-capturing device 1010 is provided with four types of vertical transfer electrodes 1012_1 through 1012_4 corresponding to the respective phases are provided. At this time, the vertical transfer electrode (second electrode) 1012_2 and the vertical transfer electrode (fourth electrode) 1012_4 of the first phase have almost the same pattern shape configuration, the vertical transfer electrode (first electrode) 1012_1 and the vertical transfer electrode (third electrode) 1012_3 of the second phase have almost the same pattern shape configuration, and also the first and third phases differ, and accordingly, the equivalent input capacitance C12_1 and C12_3 of the vertical transfer electrodes 1012_1 and 1012_3 are generally the same, the equivalent input capacitance C12_2 and C12_4 of the vertical transfer electrodes 1012_2 and 1012_4 are generally the same, and the equivalent input capacitance C12_1 and C12_3 differs from the equivalent input capacitance C12_2 and C12_4.

Thus, in the event of applying the complementary driving such as illustrated in FIG. 29 to the vertical transfer electrodes 1012 having the same equivalent input capacitance C12, though drawing thereof will be omitted, all that is necessary is to apply the vertical transfer pulse which varies in a reversed phase as to the vertical transfer electrodes 1012 having the same equivalent input capacitance C12 to the respective vertical transfer electrodes 1012, so for example, with the vertical transfer driving unit 1007A, when only one of the logic input 1a (vertical transfer clock V1) and 1b (vertical transfer clock V3) is supplied to the pulse delaying unit 612, and the outputs of the DA converters 734_H and 734_L are distributed at electric-current distribution units 740A and 740B to load driving units 750A and 750B, distribution with a reversed phase may be employed.

Specifically, the output of the DA converter 734_H is supplied to the current mirror circuit 752_H of the load driving unit 750A, and the current mirror circuit 752_L of the load driving unit 750B, and also the output of the DA converter 734_L is supplied to the current mirror circuit 752_L of the load driving unit 750A, and the current mirror circuit 752_H of the load driving unit 750B.

Employing such an arrangement enables an advantage wherein the regulated reference electric current Is generated using the same phase delay regulating unit 710 and through rate regulating 730 can be distributed with the same amount to load driving units 750A and 750B for the multiple vertical transfer electrodes 1012 based on the one input pulse Pin, if there are no irregularities of the equivalent input capacitance C12 of the both vertical transfer electrodes 1012 at the time of complementary driving, the rising properties and falling properties of the other end can be set to the same with high precision.

Also, through drawing is omitted, an arrangement may be made wherein first, load driving units 750A and 750B individually corresponding to the two load driving units 750 are provided so as to correspond to each of the two vertical transfer electrodes 1012 having mutually the same equivalent input capacitance C12, pulse delaying units 712A and 712B individually corresponding to the pulse delaying unit 712 of the phase delay regulating unit 710 are provided, and DA converters 734A and 734B and switchover units 736A and 736B individually corresponding to the DA converter 734 and switchover unit 736 of the through rate regulating unit 730 are provided.

The number of delaying clocks CKD_H and CKD_L which are set at a number-of-delaying-clocks register 714 based on the amount-of-delay control signal P72 from the phase delay control unit 772 are commonly set to the individually corresponding pulse delaying unit 712A and 712B. Also, reference data DAC_H and DAC_L which are set at a DAC data register 738 based on the through rate control signal P74 from the through rate control unit 774 are commonly set to the individually corresponding DA converters 734A and 734B.

With such a modification, the pulse driving waveform shaping control unit 770 of each of vertical drivers 700B monitors the actual working state of any one of the load voltage Vout (e.g., load voltage Vout1 at the vertical transfer electrode 1012_1) having the same equivalent input capacitance C12, and regulates the delay amount and through rate as to each logic input (e.g., a pair of vertical transfer clocks V1 and V3) based on the result thereof.

The load voltage Vout1 at the vertical transfer electrode 1012_1 corresponding to the vertical transfer clock V1 supplied from the timing signal generating unit 810 as logic input 1a is regulated so as to become predetermined delay amount and through rate, and also the load voltage Vout3 at the vertical transfer electrode 1012_3 corresponding to the vertical transfer clock V3 supplied from the timing signal generating unit 810 as logic input 1b is regulated so as to become predetermined delay amount and through rate.

The logic input 1a (vertical transfer clock V1) fro transferring and driving the vertical transfer electrode 1012_1, and the logic input 1b (vertical transfer clock V3) fro transferring and driving the vertical transfer electrode 1012_3 are independently input, and differ in phase, but the vertical transfer electrodes 1012_1 and 1012_3 have the same equivalent input capacitance C12, so even if the same phase regulating amount is set to both of the vertical transfer electrodes 1012_1 and 1012_3, the same phase delay amount can be obtained, and also even if the same load electric current regulating amount (regulating amount of Io) is set to both, the same through rate can be obtained.

Therefore, even if the phase delay amount at each of the pulse delaying units 712A and 712B is controlled with the same amount by the amount-of-delay control signal P72 as to the phase delay regulating unit 710 (particularly, number-of-delaying-clocks register 714), and also the through rate of each of the DA converters 734A and 734B is controlled with the same amount by the through rate control signal P74 as to the through rate regulating unit 730 (particularly, DAC data register 738), the output pulse whose phase delay amount and through rate satisfy the specifications can be obtained regarding both of the vertical transfer electrodes 1012_1 and 1012_3.

<Application Example as to Vertical Driver; Fourth Example; Second Example of Circuit Sharing Method as to Multiple Loads>

Figure 48:
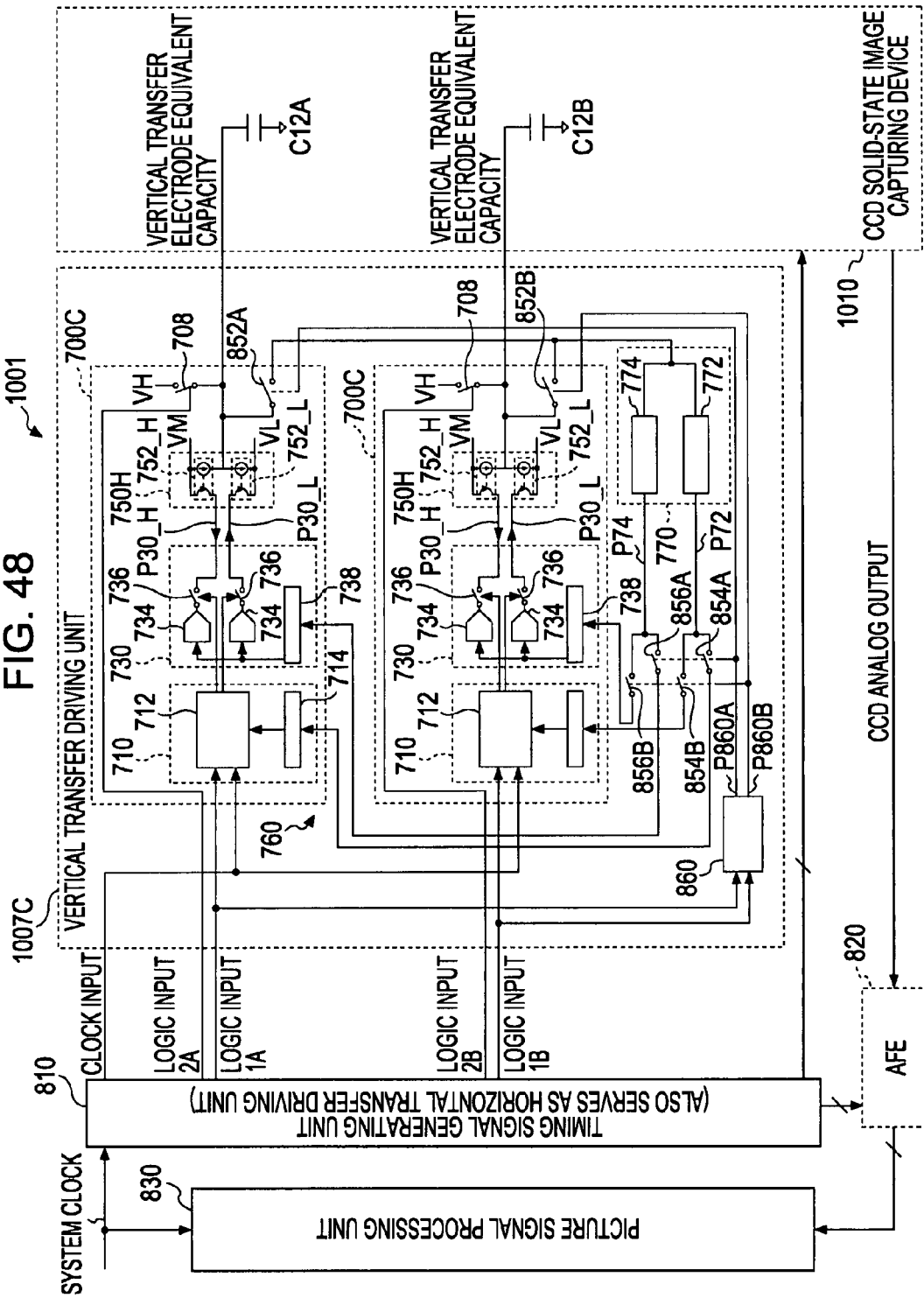
FIG. 48 is a diagram illustrating a fourth configuration example wherein a pulse driver is applied to a vertical driver.

FIG. 48 is a diagram illustrating a fourth configuration example wherein the above pulse driver 600 is applied to the vertical driver 1050 for driving vertical transfer electrode 1012 of the CCD solid-state image-capturing device 1010. This fourth configuration example illustrates a second method for applying the configuration illustrated in FIG. 40 to the portion equivalent to the pulse driver 600 as with the first configuration example illustrated in FIG. 45, and also sharing a part of the functional portions as to the multiple vertical transfer electrodes 1012.

Now, with the second sharing method, as with the first shoring method, the pulse driving waveform shaping control unit 770 for monitoring the delay amount of the output pulse Pout as to the input pulse Pin, and the variation properties (through rate) of the output pulse Pout to control the phase delay regulating unit 710 and the through rate regulating unit 730 is shared regarding the multiple vertical transfer electrodes 1012, whereby hardware can be reduced, but the second sharing method differs from the first sharing method in that the pulse driving waveform shaping control unit 770 is shared and also used in a time-sharing manner regardless of whether or not the equivalent input capacitance C12 is the same.

With the vertical driver 700C of a vertical transfer driving unit 1007C for realizing the second sharing method, an arrangement is made wherein the pulse driving waveform shaping control unit 770 monitors a pulse output signal generated at each of the multiple vertical transfer electrodes 1012 in a time-sharing manner, and controls the waveform shaping processing unit 760 corresponding to each of the multiple vertical transfer electrodes 1012 in a time-sharing manner such that the transition properties of the pulse output signal of the multiple vertical transfer electrodes 1012 become predetermined properties.

For example, in order that the pulse driving waveform shaping control unit 770 is used by the multiple vertical transfer electrodes 1012 in a time-sharing manner, first, a switchover unit 852 is provided for selectively inputting the output of each of the load driving units 750 to the pulse driving waveform shaping control unit 770. The input side of the switchover unit 852 is connected to the output line between the load driving unit 750 and the terminal 704, and the output side thereof is connected to the phase delay control unit 772 and the through rate control unit 774 of the pulse driving waveform shaping control unit 770.

Also, the pulse driving waveform shaping control unit 770 includes a switchover unit 854 for selectively supplying the amount-of-delay control signal P72 from the phase delay control unit 772 to the number-of-delaying-clocks register 714 of each of the phase delay regulating units 710, and a switchover unit 856 for selectively supplying the through rate control signal P74 from the through rate control unit 774 to the DAC data register 738 of each of the through rate regulating units 730.

Also, the vertical transfer driving unit 1007C includes a selection signal generating unit 860 for generating selection signals P860A and P860B for controlling the selection operation at each of the switchover units 852, 854, and 856. Logic input 1a (vertical transfer clock VA) for transferring and driving one vertical transfer electrode 1012A, and logic input 1b (vertical transfer clock VB) for transferring and driving the other vertical transfer electrode 1012B are supplied to the selection signal generating unit 860 from the timing signal generating unit 810.

The selection of a control target channel (whether waveform shaping regulation is as to the vertical transfer electrode 1012A or 1012B) by the pulse driving waveform shaping control unit 770 is realized by the selection signal generating unit 860 making either of the selection signals P860A and P860B active based on the logic input 1a and 1b.

Specifically, the selection signal generating unit 860 controls the selection operation of each of the switchover units 852, 854, and 856 to be done so as to correspond to the vertical transfer electrodes 1012 by the selection signals P860A and P860B. For example, the selection signal P860A is commonly input to the control input terminals of the switchover units 852A, 854A, and 856A relating to the one vertical transfer electrode 1012A, and the selection signal P860B is commonly input to the control input terminals of the switchover units 852B, 854B, and 856B relating to the other vertical transfer electrode 1012B.

When performing the delay amount regulation and through rate regulation using feedback control regarding the vertical transfer electrode 1012A at the pulse driving waveform shaping control unit 770 with reference to the logic input 1a (vertical transfer clock VA) and logic input 1b (vertical transfer clock VB) supplied from the timing signal generating unit 810, the selections signal generating unit 860 makes the selection signal P860A alone active, thereby turning on the switchover units 852A, 854A, and 856A, and when performing the delay amount regulation and through rate regulation using feedback control regarding the vertical transfer electrode 1012B at the pulse driving waveform shaping control unit 770, the selections signal generating unit 860 makes the selection signal P860B alone active, thereby turning on the switchover units 852B, 854B, and 856B.

Thus, with the configuration example employed by the vertical transfer driving unit 1007C for realizing the second sharing method, the switchover units 852, 854, and 856 serving as switch means are provided, the control target channel is switched in a time-sharing manner by the pulse driving waveform shaping control unit 770, and thus the pulse driving waveform shaping control unit 770 for controlling the phase delay regulating unit 710 and the through rate regulating unit 730 can be shared regarding the multiple vertical transfer electrodes 1012 by monitoring the delay amount of the output pulse Pout as to the input pulse Pin, and the variation properties (through rate) of the output pulse Pout, thereby reducing hardware.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image-capturing device having built in an image-capturing area including a light receiving element provided on a semiconductor substrate, a substrate bias circuit, and a clamp circuit for receiving output of said substrate bias circuit, and applying the output of said substrate bias circuit to said semiconductor substrate in accordance with a substrate pulse, said solid-state image-capturing device comprising:
   a substrate bias control circuit for controlling so as to reduce an electric current of said clamp circuit during a predetermined period,
   wherein said substrate bias control circuit effects control so as to reduce the difference between the intermediate output of the input voltage terminal of said clamp circuit and the output of substrate voltage during said predetermined period
   wherein said substrate bias control circuit comprises an electric-current reducing portion including a pre-driver for increasing voltage, and an external clamp circuit
   between the intermediate output of the input voltage terminal of said clamp circuit and the output of substrate voltage during said predetermined period.

2. The solid-state image-capturing device according to claim 1, wherein said electric-current reducing portion includes
   a load circuit for reducing the increase in voltage of said pre-driver, and performing correction such that said output of substrate voltage returns to the original setting value.

3. The solid-state image-capturing device according to claim 1, wherein said substrate bias control circuit includes
   a switch for turning ON/OFF the operations of said electric-current reducing portion;
   and effects control so as to not allow an electric current to flow into said built-in clamp circuit by turning ON said switch during a period when a substrate pulse is not applied thereto, including a long exposure period.

4. The solid-state image-capturing device according to claim 2, wherein said substrate bias control circuit includes
   a switch for turning ON/OFF the operations of said electric-current reducing portion;
   and effects control so as to not allow an electric current to flow into said built-in clamp circuit by turning ON said switch during a period when a substrate pulse is not applied thereto, including a long exposure period.

5. The solid-state image-capturing device according to claim 1, wherein said substrate bias control circuit includes
   a switch element which is connected between the intermediate output of the input voltage terminal of said built-in clamp circuit and the output of substrate voltage;
   and effects control so as to not allow an electric current to flow into said clamp circuit by turning ON said switch element during a period when a substrate pulse is not applied thereto, including a long exposure period.

6. The solid-state image-capturing device according to claim 3, wherein said substrate bias control circuit has a function for decreasing the intermediate output voltage of the input voltage terminal of said built-in clamp circuit under control during a long exposure period.

7. The solid-state image-capturing device according to claim 4, wherein said substrate bias control circuit has a function for decreasing the intermediate output voltage of the input voltage terminal of said built-in clamp circuit under control during a long exposure period.

8. The solid-state image-capturing device according to claim 5, wherein said substrate bias control circuit has a function for decreasing the intermediate output voltage of the input voltage terminal of said built-in clamp circuit under control during a long exposure period.

* * * * *